(12) United States Patent
Ando et al.

(10) Patent No.: US 9,142,582 B2
(45) Date of Patent: Sep. 22, 2015

(54) IMAGING DEVICE AND IMAGING SYSTEM

(71) Applicant: Panasonic Corporation, Osaka (JP)

(72) Inventors: Takamasa Ando, Osaka (JP); Norihiro Imamura, Osaka (JP); Tsuguhiro Korenaga, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 235 days.

(21) Appl. No.: 14/015,142

(22) Filed: Aug. 30, 2013

(65) Prior Publication Data

US 2013/0341493 A1    Dec. 26, 2013

Related U.S. Application Data

(63) Continuation of application No. PCT/JP2012/007668, filed on Nov. 29, 2012.

(30) Foreign Application Priority Data

Nov. 30, 2011 (JP) ................................. 2011-261594
Dec. 15, 2011 (JP) ................................. 2011-274680

(51) Int. Cl.
*H01L 27/146* (2006.01)
*G01C 3/32* (2006.01)
(Continued)

(52) U.S. Cl.
CPC ............ *H01L 27/14627* (2013.01); *G01C 3/32* (2013.01); *G02B 7/34* (2013.01); *H04N 5/23212* (2013.01); *H04N 2101/00* (2013.01)

(58) Field of Classification Search
CPC ............ H04N 9/045; H04N 2209/045; H04N 5/23212; H04N 2101/00; H01L 27/14627; G01C 3/32; G02B 7/34
USPC ......................... 250/208.1; 348/241, 267, 336
See application file for complete search history.

(56) References Cited

U.S. PATENT DOCUMENTS

| 5,576,975 A | 11/1996 | Sasaki et al. |
| 6,396,873 B1 | 5/2002 | Goldstein et al. |

(Continued)

FOREIGN PATENT DOCUMENTS

| JP | 3110095 B | 9/2000 |
| JP | 2001-227914 A | 8/2001 |

(Continued)

OTHER PUBLICATIONS

International Search Report for corresponding International Application No. PCT/JP2012/007668 mailed Mar. 5, 2013.

(Continued)

*Primary Examiner* — Seung C Sohn
(74) *Attorney, Agent, or Firm* — Renner, Otto, Boisselle & Sklar, LLP

(57) ABSTRACT

An imaging apparatus according to one embodiment of the present invention includes: a lens optical system having first to third regions, the first region transmitting light of a first wavelength band, the second region transmitting light of the first wavelength band and having optical characteristics for providing a different focusing characteristic from a focusing characteristic associated with rays transmitted through the first region, and the third region transmitting light of a second wavelength band; an imaging device on which light having passed through the lens optical system is incident, the imaging device having a plurality of first to third pixels; and a microlens array causing light having passed through the first region to enter the plurality of first pixels, light having passed through the second region to enter the plurality of second pixels, and light having passed through the third region to enter the plurality of third pixels.

35 Claims, 36 Drawing Sheets

(51) Int. Cl.
　　　*G02B 7/34* (2006.01)
　　　*H04N 5/232* (2006.01)
　　　*H04N 101/00* (2006.01)

(56) References Cited

U.S. PATENT DOCUMENTS

| | | | |
|---|---|---|---|
| 6,791,933 B1 * | 9/2004 | Yoo et al. | 369/112.1 |
| 7,227,704 B2 * | 6/2007 | Koike | 359/719 |
| 2001/0015763 A1 | 8/2001 | Miwa et al. | |
| 2004/0125230 A1 | 7/2004 | Suda | |
| 2006/0146422 A1 * | 7/2006 | Koike | 359/742 |
| 2008/0019232 A1 * | 1/2008 | Yoo et al. | 369/44.23 |
| 2009/0016198 A1 * | 1/2009 | Katayama | 369/112.23 |
| 2013/0120564 A1 | 5/2013 | Imamura | |
| 2013/0222676 A1 | 8/2013 | Ono | |

FOREIGN PATENT DOCUMENTS

| | | |
|---|---|---|
| JP | 2003-523646 A | 8/2003 |
| JP | 2004-191893 A | 7/2004 |
| JP | 2006-184065 A | 7/2006 |
| JP | 2006-184844 A | 7/2006 |
| JP | 2009-198376 A | 9/2009 |
| JP | 2011-007599 A | 1/2011 |
| WO | WO 2012/017577 A1 | 2/2012 |

OTHER PUBLICATIONS

Tu et al., "Two- and Three-Dimensional Methods for Inspection and Metrology V", Edited by Huang, Peisen S. Proceedings of the SPIE, vol. 6762, pp. 676203 (2007), entitled "Depth and Focused Image Recovery from Defocused Images for Cameras Operating in Macro Mode"(cited in [0005] of the specification).

Co-pending U.S. Appl. No. 13/936,232, filed Jul. 8, 2013.

* cited by examiner

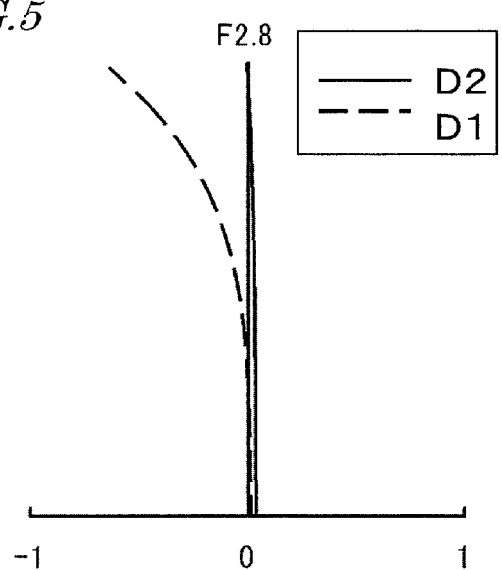
FIG.5
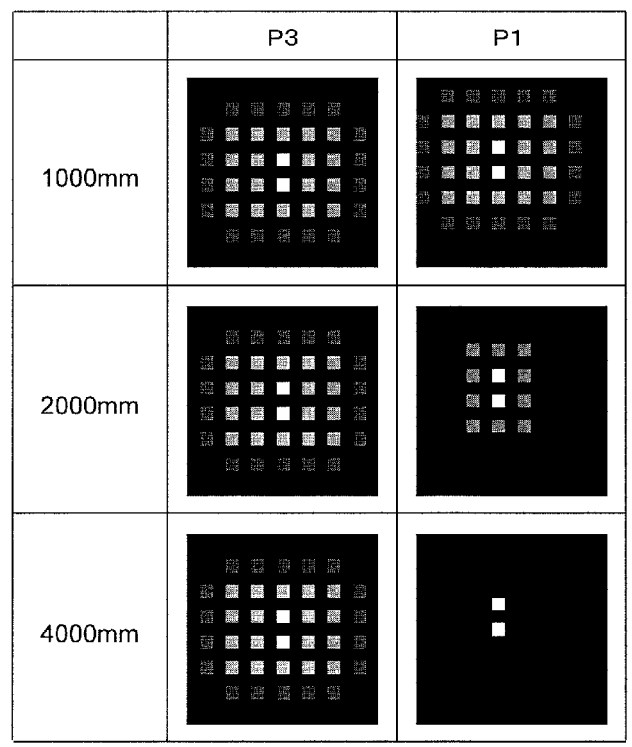
FIG.6
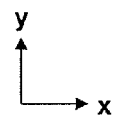

FIG. 7
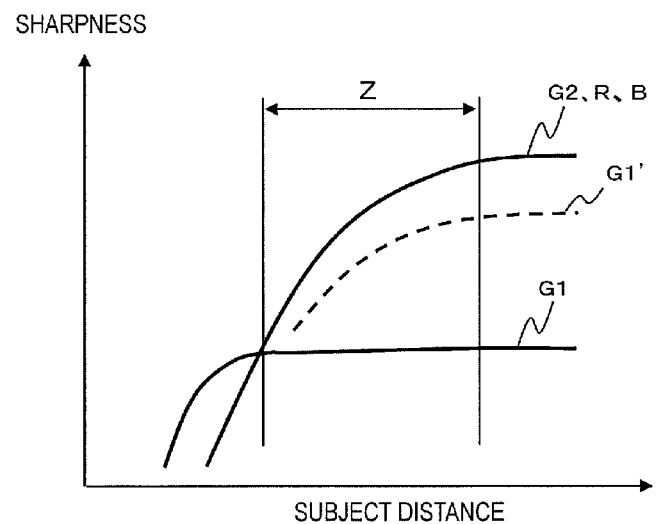
FIG. 8
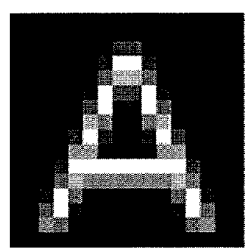
(a)
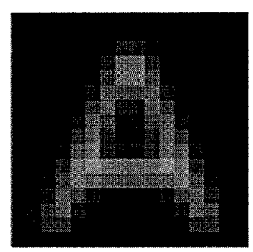
(b)
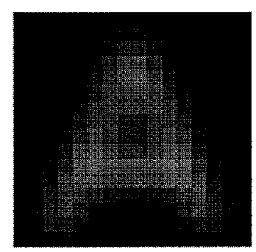
(c)
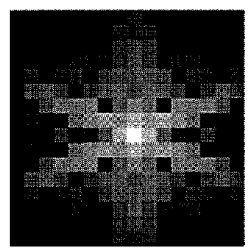
(d)
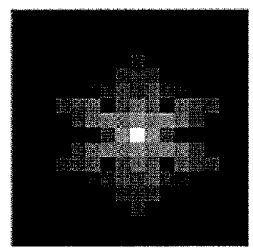
(e)
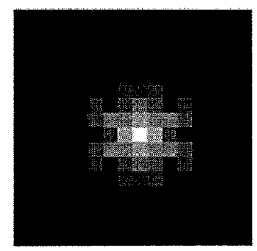
(f)

SUBJECT LUMINANCE

SUBJECT POSITION

IMAGE LUMINANCE

G2, B, R

G1

PIXEL POSITION

SECOND-ORDER DIFFERENTIATION OF LUMINANCE

PIXEL POSITION

LUMINANCE

G1

PIXEL POSITION

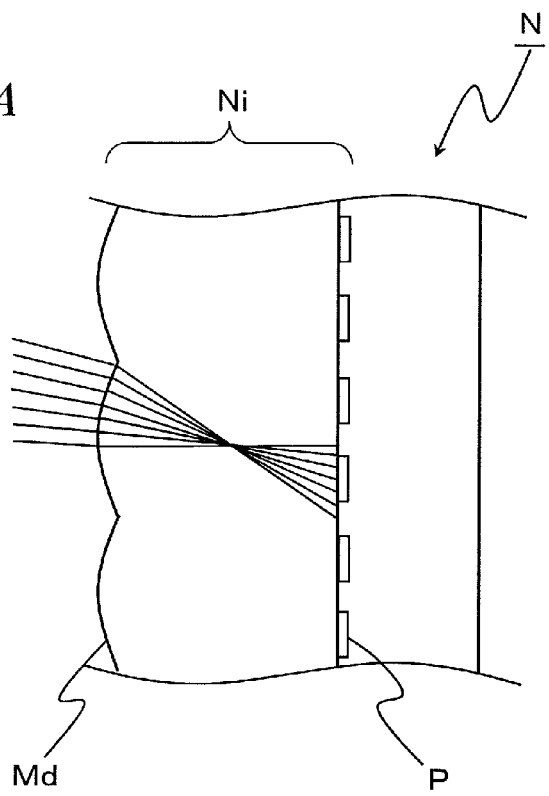
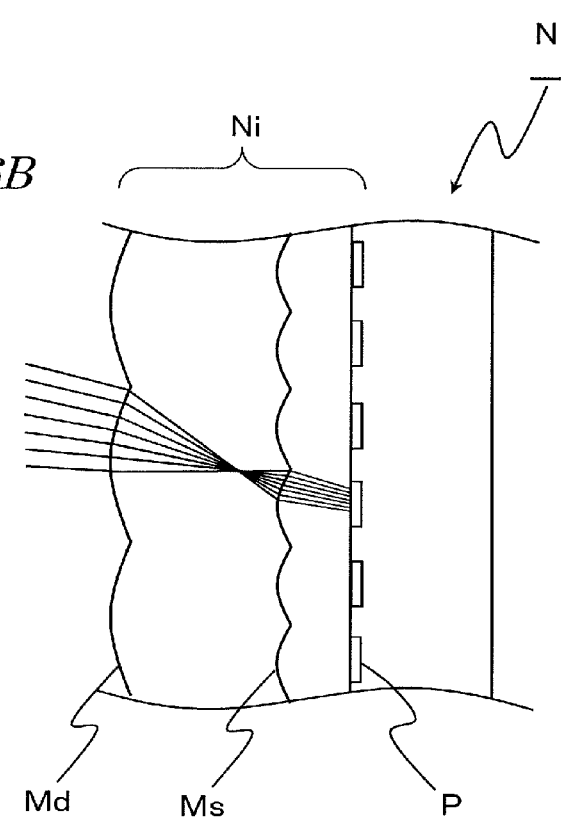

SUBJECT LUMINANCE

SUBJECT POSITION

IMAGE LUMINANCE

PIXEL POSITION

SECOND-ORDER DIFFERENTIATION OF LUMINANCE

PIXEL POSITION

LUMINANCE

PIXEL POSITION

FIG.29
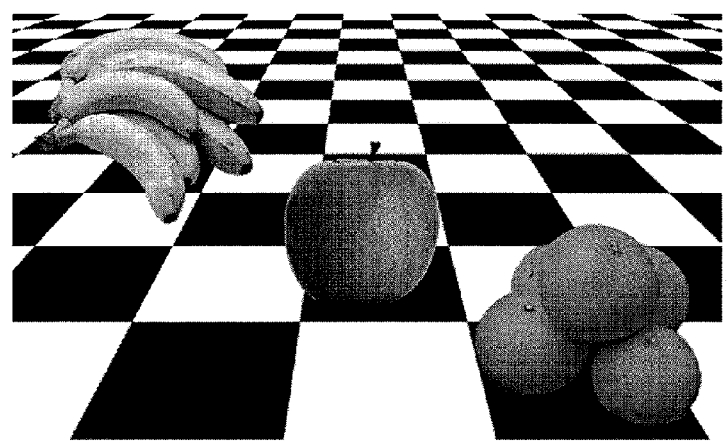
(a) SUBJECT IMAGE
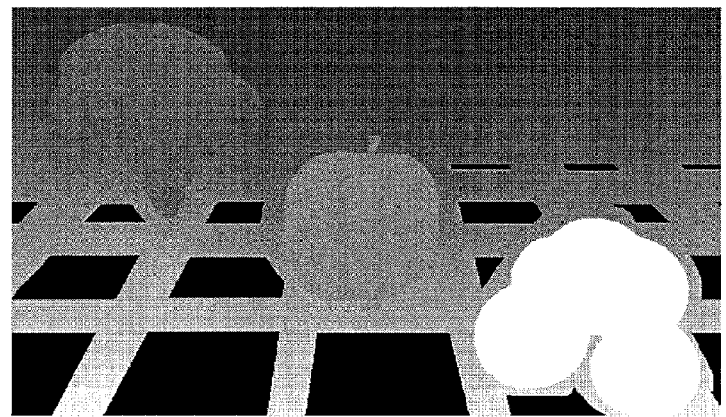
(b) DEPTH MAP

| 0.092 | 0.119 | 0.092 |
|---|---|---|
| 0.119 | 0.154 | 0.119 |
| 0.092 | 0.119 | 0.092 |

(b) 5×5

| 0.012 | 0.026 | 0.034 | 0.026 | 0.012 |
|---|---|---|---|---|
| 0.026 | 0.056 | 0.072 | 0.056 | 0.026 |
| 0.034 | 0.072 | 0.093 | 0.072 | 0.034 |
| 0.026 | 0.056 | 0.072 | 0.056 | 0.026 |
| 0.012 | 0.026 | 0.034 | 0.026 | 0.012 |

(c) 7×7

| 0.001 | 0.003 | 0.006 | 0.008 | 0.006 | 0.003 | 0.001 |
|---|---|---|---|---|---|---|
| 0.003 | 0.011 | 0.023 | 0.030 | 0.023 | 0.011 | 0.003 |
| 0.006 | 0.023 | 0.050 | 0.064 | 0.050 | 0.023 | 0.006 |
| 0.008 | 0.030 | 0.064 | 0.083 | 0.064 | 0.030 | 0.008 |
| 0.006 | 0.023 | 0.050 | 0.064 | 0.050 | 0.023 | 0.006 |
| 0.003 | 0.011 | 0.023 | 0.030 | 0.023 | 0.011 | 0.003 |
| 0.001 | 0.003 | 0.006 | 0.008 | 0.006 | 0.003 | 0.001 |

*FIG.33A*   *FIG.33B*
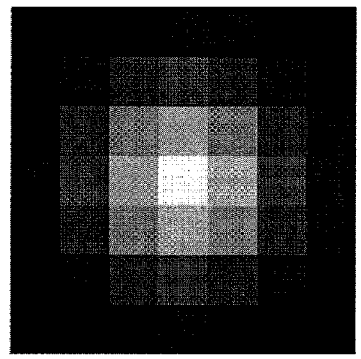
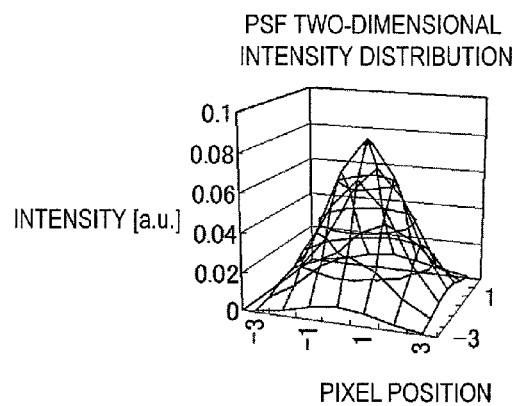
*FIG.34*
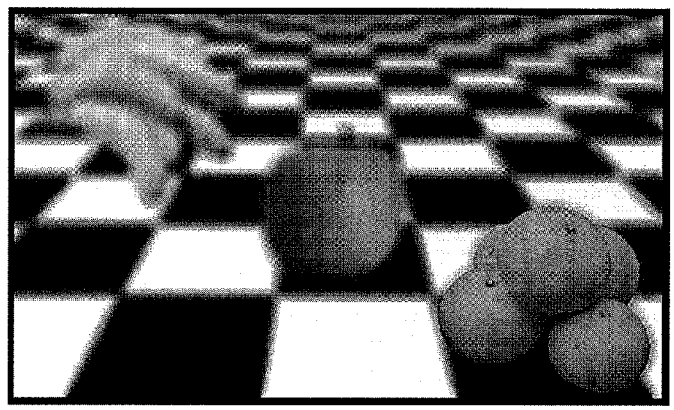

FIG.50
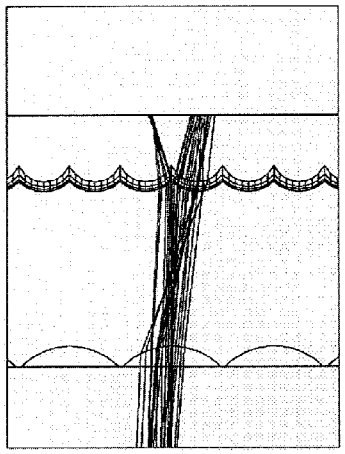
(a2)
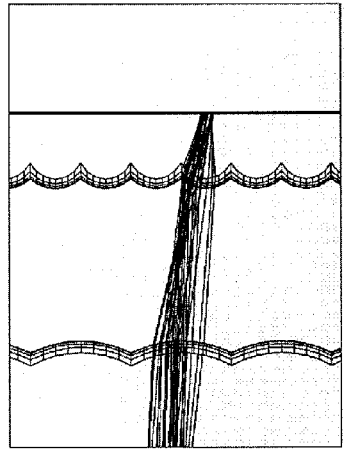
(b2)
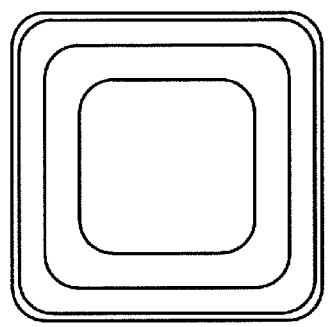
(a3)
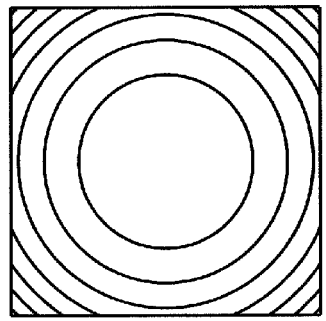
(b3)
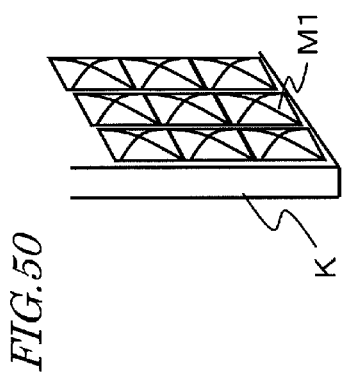
(a1)
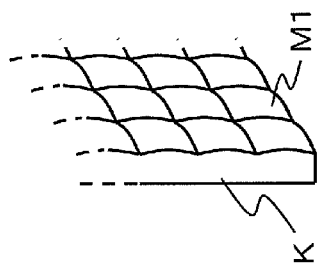
(b1)

IMAGING DEVICE AND IMAGING SYSTEM

This is a continuation of International Application No. PCT/JP2012/007668, with an international filing date of Nov. 29, 2012, which claims priority of Japanese Patent Applications No. 2011-261594 filed on Nov. 30, 2011 and No. 2011-274680 filed on Dec. 15, 2011, the entire contents of which are hereby incorporated by reference.

BACKGROUND

1. Technical Field

The present disclosure relates to an imaging apparatus such as a camera.

2. Description of the Related Art

In recent years, distance measuring apparatuses which measure a distance from a subject (target of distance measurement) based on a parallax between a plurality of imaging optical systems are used for the measurement of vehicular gaps between automobiles and in camera auto-focus systems and three-dimensional shape measurement systems.

In such distance measuring apparatuses, a pair of imaging optical systems that are positioned in right-left or upper-lower relationship create images in their respective imaging regions, such that a distance from the subject is detected from the parallax between these images based on triangulation.

As a method of measuring a distance from a subject with a single imaging optical system, a DFD (Depth From Defocus) technique is known. Although the DFD technique is a technique for calculating a distance by analyzing an amount of blur of an acquired image, it is impossible to know from a single image whether something is a pattern possessed by the subject itself, or a blur caused by subject distance; therefore, a technique of estimating a distance from a plurality of images is adopted (Patent Document 1 (Japanese Patent No. 3110095), Non-Patent Document 1 (Xue Tu, Youn-sik Kang and Murali Subbarao Two- and Three-Dimensional Methods for Inspection and Metrology V. Edited by Huang, Peisen S. Proceedings of the SPIE, Volume 6762, pp. 676203 (2007))).

SUMMARY

However, in the aforementioned conventional techniques, downsizing and cost reduction of the imaging apparatus, improvement in the accuracy of distance measurement, and so on have been desired. One non-limiting and exemplary embodiment of the present disclosure provides an imaging apparatus which, in small size, is capable of accurate distance measurement.

An imaging apparatus according to one embodiment of the present invention comprises: a lens optical system having a first region, a second region, and a third region, the first region transmitting light of a first wavelength band, the second region transmitting light of the first wavelength band and having optical characteristics for providing a different focusing characteristic from a focusing characteristic associated with rays transmitted through the first region, and the third region transmitting light of a second wavelength band different from the first wavelength band; an imaging device on which light having passed through the lens optical system is incident, the imaging device having a plurality of first, second, and third pixels; and a microlens array disposed between the lens optical system and the imaging device, the microlens array causing light having passed through the first region to enter the plurality of first pixels, light having passed through the second region to enter the plurality of second pixels, and light having passed through the third region to enter the plurality of third pixels.

With a distance measuring apparatus according to one embodiment of the present invention, it is possible to achieve accurate distance measurement by using a single imaging system.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF DRAWINGS

FIG. 5 is a graph showing a spherical aberration associated with rays passing through an optical region D1 and an optical region D2 in Embodiment 1 of the present invention.

FIG. 6 is a conceptual diagram of point spread distributions for different subject distances.

FIG. 7 is a graph showing a relationship between subject distance and sharpness (how sharp an image is) according to Embodiment 1 of the present invention.

FIG. 8($a$) to FIG. 8($c$) each show a luminance distribution in an image block sized 16×16; and FIG. 8($d$) to FIG. 8($f$) show frequency spectrums obtained by applying a two-dimensional Fourier transform to the respective image blocks shown in FIG. 8($a$) to FIG. 8($c$).

FIG. 16A and FIG. 16B are enlarged diagrams each showing an array optical device K and an imaging device N according to Embodiment 2 of the present invention.

FIG. 25($d$) to FIG. 25($f$) show frequency spectrums obtained by applying a two-dimensional Fourier transform to the respective image blocks shown in FIG. 25($a$) to FIG. 25($c$).

FIG. 29($a$) is a diagram showing a subject image according to Embodiment 4 of the present invention; and FIG. 29($b$) is a diagram showing a depth map of the subject image of FIG. 29($a$).

FIG. 32($a$) to FIG. 32($c$) are diagrams showing PSF two-dimensional data according to Embodiment 4 of the present invention.

FIG. 33A and FIG. 33B are distribution diagrams of PSF two-dimensional intensity according to Embodiment 4 of the present invention.

FIG. 34 is a diagram showing a refocused image of the subject image of FIG. 29($a$) based on the depth map of FIG. 29($b$), according to Embodiment 4 of the present invention.

FIG. 50(a1) is a perspective view showing a microlens array having a rotation-asymmetric shape with respect to the optical axis; FIG. 50(a2) is a diagram showing contours of the microlens array shown in FIG. 50(a1); FIG. 50(a3) is a diagram showing a ray tracing simulation result when the microlens shown in FIG. 50(a1) and FIG. 50(a2) is applied to the array optical device according to the present invention; FIG. 50(b1) is a perspective view showing a microlens array having a rotation symmetric shape with respect to the optical axis; FIG. 50(b2) is a diagram showing contours of the microlens array shown in FIG. 50(b1); and FIG. 50(b3) is a diagram showing a ray tracing simulation result when the microlens shown in FIG. 50(b1) and FIG. 50(b2) is applied to the array optical device according to an embodiment of the present invention.

DETAILED DESCRIPTION

Figure 1:
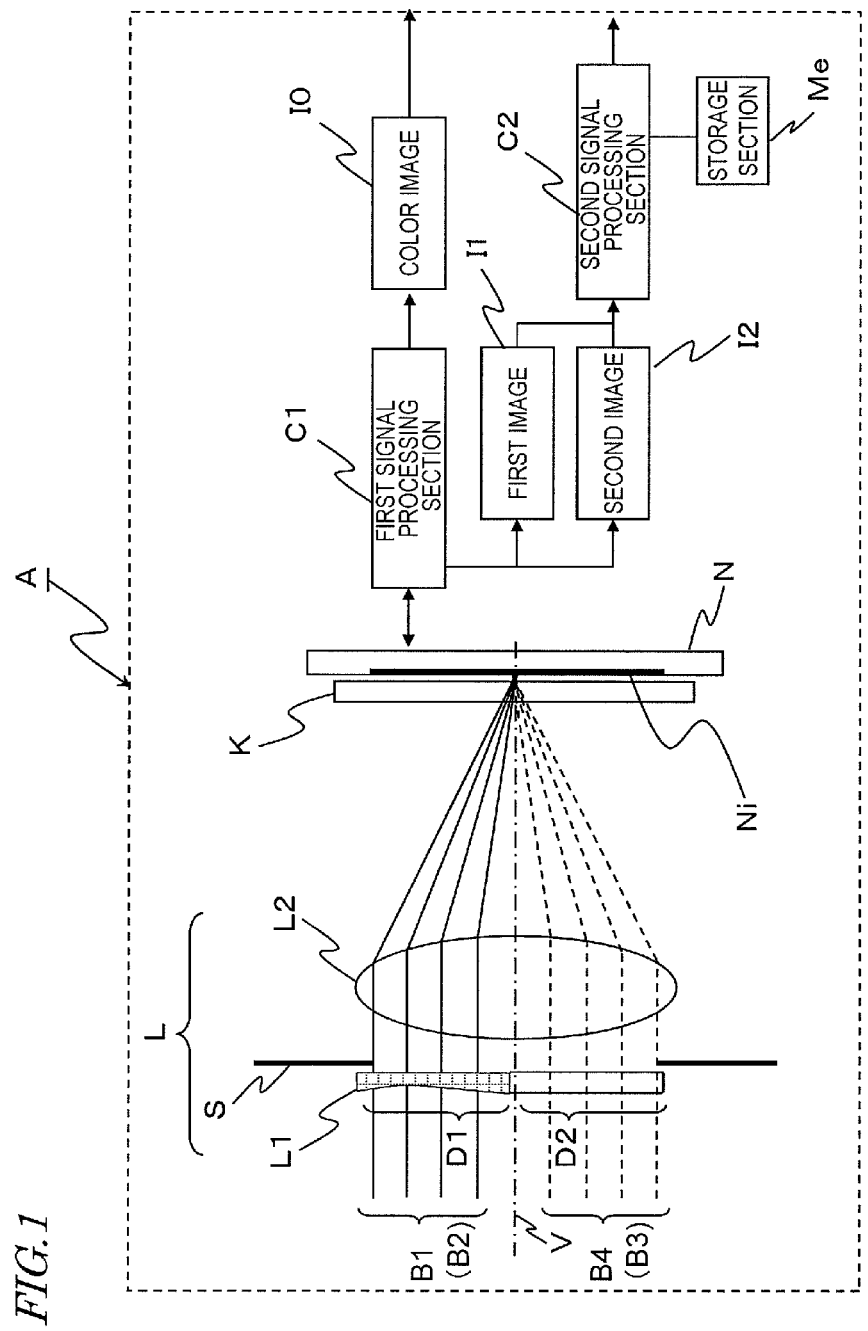
FIG. 1 is a schematic diagram showing Embodiment 1 of an imaging apparatus A according to the present invention.

According to studies under the present inventors, in conventional constructions using a plurality of imaging optical systems, the imaging apparatus will increase in size and cost. Moreover, the need to ensure matching characteristics between the plurality of imaging optical systems and a highly precise parallelism between the optical axes of the two imaging optical systems makes fabrication difficult. Furthermore, the need for a calibration step for determining camera parameters will presumably require a large number of steps.

In the DFD technique, as disclosed in Patent Document 1 and Non-Patent Document 1, a distance from the subject can be calculated with a single imaging optical system. However, in the methods of Patent Document 1 and Non-Patent Document 1, it is necessary to obtain a plurality of images via time division while varying the distance from the subject at which focus is achieved (focusing distance). When such a technique is applied to a motion video, discrepancies between images will occur due to time lags in imaging, thus resulting in a problem of lowered accuracy of distance measurement.

Moreover, Patent Document 1 discloses an imaging apparatus which splits the optical path with a prism so that imaging occurs on two imaging planes with different back focuses, thereby making it possible to measure the distance from a subject through a single instance of imaging. However, such a method requires two imaging planes, thus leading to a problem in that the imaging apparatus is increased in size and the cost is considerably increased.

In view of the above problems, the inventors have arrived at a novel imaging apparatus. In outline, embodiments of the present invention may be as follows.

An imaging apparatus according to one embodiment of the present invention comprises: a lens optical system having a first region, a second region, and a third region, the first region transmitting light of a first wavelength band, the second region transmitting light of the first wavelength band and having optical characteristics for providing a different focusing characteristic from a focusing characteristic associated with rays transmitted through the first region, and the third region transmitting light of a second wavelength band different from the first wavelength band; an imaging device on which light having passed through the lens optical system is incident, the imaging device having a plurality of first, second, and third pixels; and a microlens array disposed between the lens optical system and the imaging device, the microlens array causing light having passed through the first region to enter the plurality of first pixels, light having passed through the second region to enter the plurality of second pixels, and light having passed through the third region to enter the plurality of third pixels.

The lens optical system may further have a fourth region transmitting light of a third wavelength band different from the first and second wavelength bands; the imaging device may further include a plurality of fourth pixels; and the microlens array may cause light having passed through the fourth region to enter the plurality of fourth pixels.

The first, second, and third regions may be regions divided around an optical axis of the lens optical system.

In the lens optical system, a focusing characteristic associated with rays transmitted through the third region and the fourth region may be identical to either a focusing characteristic associated with rays transmitted through the first region or a focusing characteristic associated with rays transmitted through a second region.

Rays may be incident on the first, second, and third regions through a single instance of imaging.

The first and second regions may allow rays of the green band to pass through, the third region may allow rays of the blue band to pass through, and the fourth region may allow rays of the red band to pass through.

When a subject distance is within a predetermined range, a point spread distribution created by light entering the first region may be substantially constant, and a point spread distribution created by light entering the second region may vary in accordance with distance from a subject.

A surface of the first region and a surface of the second region may have mutually different radii of curvature.

The plurality of first and second pixels may respectively generate first and second luminance information through a single instance of imaging; and the imaging apparatus may further comprise a first signal processing section for generating a first image and a second image by using the first and second luminance information.

The first signal processing section may include a sharpness detection section for detecting a sharpness of at least one pixel component, within luminance information of the plurality of first to fourth pixels, for each predetermined region in an image; and based on a component of a highest sharpness among the respective sharpnesses, a luminance information component of another pixel may be sharpened.

By using a previously stored point spread function, the first signal processing section may perform a restoration process for an image which is formed based on luminance information of a pixel reached by light entering the first region, and generate a restored sharpened image.

The first signal processing section may use a single said point spread function to perform a restoration process for all regions of an image which is formed based on luminance information of a pixel reached by light entering the first region, and generate a restored sharpened image.

The first signal processing section may include a sharpness detection section for detecting a sharpness for each predetermined region in the restored sharpened image, and, based on a sharpness of each predetermined region in the restored sharpened image, sharpen a luminance information component of another pixel.

The imaging apparatus may further comprise a second signal processing section for calculating a distance from a subject, wherein the second signal processing section may calculate a distance from the subject by using the first image and the second image.

When the subject distance is within a certain range, a value of a ratio between a sharpness of the first image and a sharpness of the second image may have a correlation with the distance from the subject; and the second signal processing section may calculate the distance from the subject based on the correlation and the ratio between the sharpness of the first image and the sharpness of the second image.

The first signal processing section may include a contrast detection section for detecting a contrast of the first image obtained from the plurality of first pixels and a contrast of the second image obtained from the plurality of second pixels and; when the subject distance is within a certain range, a ratio between the contrast of the first image and the contrast of the second image may have a correlation with the subject distance; and the second signal processing section may calculate the distance from the subject based on the correlation, the contrast of the first image and the contrast of the second image.

The second signal processing section may calculate the distance from the subject by using luminance information of an image obtained through addition of the first image and the second image and luminance information of the first image or the second image.

When the subject distance is within a certain range, a point spread function derived from an image which is formed from the restored sharpened image and light entering the second region may have a correlation with the subject distance; and the second signal processing section may calculate the distance from the subject based on the correlation and the point spread function.

The second region, the third region, and the fourth region may have mutually different optical powers; and focusing positions of light transmitted through the second region, the third region, and the fourth region may be closer to one another than when the second region, the third region, and the fourth region have an equal optical power to one another.

The imaging apparatus may further comprise a light-shielding member provided at a boundary between the first region and the second region.

The lens optical system may further include a stop; and the first region and the second region may be disposed near the stop.

The second signal processing section may calculate a subject distance for each predetermined region in an image; and the imaging apparatus may further comprise a third signal processing section for generating a refocused image by using the subject distance for each predetermined region calculated by the second signal processing section.

The second signal processing section may generate a point spread function for each subject distance by using a subject distance for each predetermined region.

Along the subject distance direction, an intensity change in the point spread function may decrease away from at least one best focus position, the at least one best focus position defining a subject distance at which an intensity change in the point spread function takes a local maximum.

The at least one best focus position may be an externally input position or a position determined by the second signal processing section.

The third signal processing section may generate the refocused image by using the subject distance for each predetermined region and the point spread function.

The point spread function may be a Gaussian function.

The third signal processing section may generate the refocused image by performing a convolution calculation for the point spread function using a Fourier transform for each predetermined region.

The third signal processing section may generate the refocused image by performing a spatial filter process based on the subject distance for each predetermined region.

The at least one best focus position may exist in plurality and discretely.

The imaging apparatus may further comprise first to fourth filters near the lens optical system, the first to fourth filters being provided respectively in the first region, the second region, the third region, and the fourth region, wherein, the first filter may transmit light of the first wavelength band; the second filter may transmit light of the first wavelength band; the third filter may transmit light of the second wavelength band; and the fourth filter may transmit light of the third wavelength band.

The lens optical system may further comprise a stop; and the first to fourth filters may be disposed near the stop.

An imaging system according to one embodiment of the present invention comprises: the above imaging apparatus; and a first signal processing apparatus for generating a color image, wherein the first signal processing apparatus generates the color image by using luminance information of the plurality of first pixels, the plurality of second pixels, the plurality of third pixels, and the plurality of fourth pixels obtained through a single instance of imaging.

The imaging system may further comprise a second signal processing apparatus for calculating a distance from a subject, wherein the second signal processing apparatus may calculate a distance from the subject by using the luminance information of the plurality of first pixels and the plurality of second pixels obtained through the single instance of imaging.

An imaging system according to another embodiment of the present invention comprises an imaging apparatus and a signal processing apparatus, wherein the imaging apparatus includes: a lens optical system having a first region and a second region, the second region having optical characteristics for providing a different focusing characteristic from a focusing characteristic associated with rays having passed through the first region; an imaging device on which light having passed through the lens optical system is incident, the imaging device at least having a plurality of first pixels and a plurality of second pixels; and an array optical device disposed between the lens optical system and the imaging device, the array optical device causing light having passed through the first region to enter the plurality of first pixels and light having passed through the second region to enter the plurality of second pixels, and the signal processing apparatus includes: a first signal processing section for calculating a subject distance for each predetermined region in a captured image, by using luminance information of a first image obtained from the plurality of first pixels and a second image obtained from the plurality of second pixels; and a second signal processing section for generating a refocused image by using the subject distance for each predetermined region calculated by the first signal processing section.

With an imaging apparatus and imaging system according to the above embodiment, by using a single optical system, it is possible to acquire luminance information for color image output and subject distance measurement through a single instance of imaging. This is unlike in an imaging apparatus having a plurality of imaging optical systems, where it would be necessary to ensure matching characteristics and positions between the plurality of imaging optical systems. Moreover, even if the subject position changes with lapse of time during the shooting of a motion video, an accurate distance from the subject can be measured. Moreover, it is possible to obtain an image with internal variety such that focus is placed on an arbitrary subject position, e.g., the main person or thing being sharp, while leaving the background solely blurred. Hereinafter, embodiments of the imaging apparatus according to the present invention will be described with reference to the drawings.

Embodiment 1

FIG. 1 is a schematic diagram showing an imaging apparatus A according to Embodiment 1. The imaging apparatus A of the present embodiment includes: a lens optical system L having an optical axis V; an array optical device K disposed near the focal point of the lens optical system L; an imaging device N; a first signal processing section C1; a second signal processing section C2; and a storage section Me.

The lens optical system L is composed of: an optical element L1 on which light beams B1 to B4 from a subject (not shown) are incident; a stop S on which light having passed through the optical element L1 is incident; and a lens L2 on which light having passed through the stop S is incident. The optical element L1 has an optical region D1 and an optical region D2, the optical region D2 having optical characteristics for providing a different focusing characteristic from the focusing characteristic associated with rays having passed through the optical region D1. The optical element L1 may be provided near the stop S.

Figure 2:
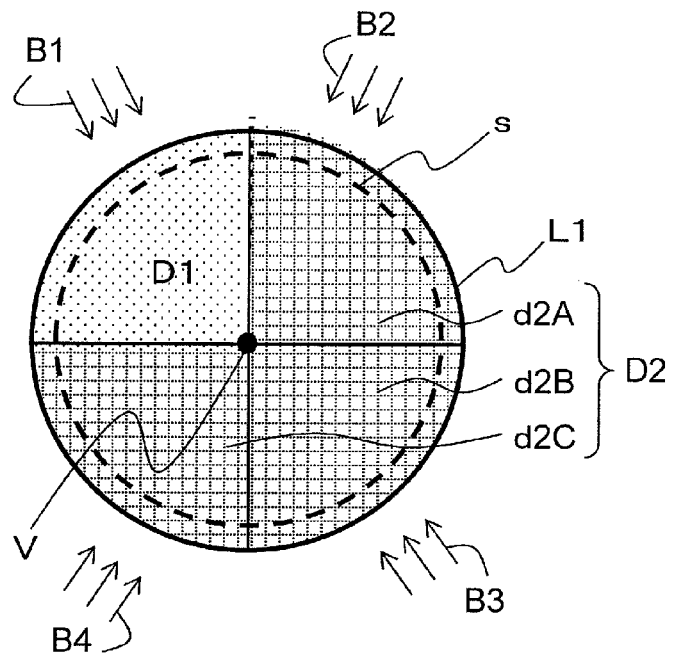
FIG. 2 is a front view showing an optical element L1 according to Embodiment 1 of the present invention as viewed from the subject side.

FIG. 2 is a front view of the optical element L1 as viewed from the subject side. The optical region D2 has optical subregions d2A, d2B, and d2C. In the optical element L1, the optical region D1 and the optical subregions d2A, d2B, and d2C are four divided, upper-lower/right-left parts around the optical axis V as a center of boundary, in a plane which is perpendicular to the optical axis V. The optical region D1 has identical spectral transmittance characteristics to those of the optical subregion d2B. The optical region D1 and the optical subregions d2A and d2C have respectively different spectral transmittance characteristics.

For example, the optical region D1 and the optical subregion d2B have first spectral transmittance characteristics, such that they mainly allow rays of the green band to pass through, while absorbing rays in any other band. The optical subregion d2A have second spectral transmittance characteristics, such that it mainly allows rays of the red band to pass through, while absorbing rays in any other band. The optical subregion d1C has third spectral transmittance characteristics, such that it mainly allows rays of the blue band to pass through, while absorbing rays in any other band.

By providing filters which transmit light of different wavelength bands (e.g., filters made of organic materials or dielectric multilayer films) in portions of the optical element L1, for example, it can be ensured that the light transmitted through the respective regions of the optical region D1 and the optical subregions d2A, d2B, and d2C have different wavelength bands. Alternatively, the material of the optical element L1 itself may have spectral transmittance characteristics. For example, in the case where the optical element L1 is made of a resin, coloring materials may be added to the resin to ensure that the wavelength bands of light transmitted by the respective regions of the optical region D1 and the optical subregions d2A, d2B, and d2C are different. In the case where the optical element L1 is made of glass, microparticles, e.g., metals, may be added to the glass to ensure that the wavelength bands of light transmitted by the respective regions are different. Instead of using an absorbing material, multilayered interference films may be formed on the surface of the optical element L1 to ensure that the wavelength bands of light transmitted by the respective regions are different. In this case, the optical element L1 is a color filter of a reflection type, which may be formed by vapor deposition technique or the like.

In the example shown in FIG. 2, the focusing characteristics associated with rays transmitted through the optical subregions d2A, d2B, and d2C are identical. As a result, the same sharpness at a predetermined subject distance is obtained, whereby a natural color image can be obtained. However, it is not necessary for the focusing characteristics associated with rays transmitted through the optical subregions d2A, d2B, and d2C to be identical.

In FIG. 2, a broken line s indicates where the stop S is. The light beams B1, B2, B3, and B4 shown in FIG. 1 are light beams passing through the optical region D1 and the optical subregions d2A, d2B, and d2C of the optical element L1, respectively. The light beams B1, B2, B3, and B4 pass through the optical element L1, the stop S, the lens L2, and the array optical device K in this order, and arrive at the imaging plane Ni on the imaging device N (shown in FIG. 4 and so on).

Figure 3:
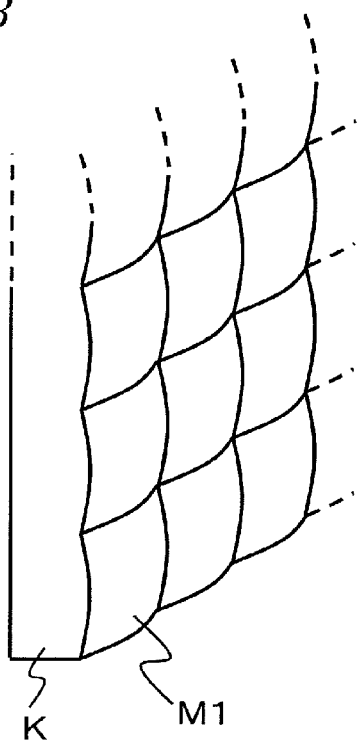
FIG. 3 is a perspective view of an array optical device K according to Embodiment 1 of the present invention.

FIG. 3 is a perspective view of the array optical device K. On the face of the array optical device K closer to the imaging device N, optical elements M1 are provided in a lattice form. Each optical element M1 has cross sections (cross sections along the vertical direction and along the lateral direction) in arc shapes, each optical element M1 protruding toward the imaging device N. Thus, the optical elements M1 are microlenses, and the array optical device K is a microlens array.

As shown in FIG. 1, the array optical device K is provided near the focal point of the lens optical system L, being at a position which is a predetermined distance away from the imaging plane Ni. Although the optical characteristics of the optical element L1 will actually affect the focusing characteristic of the entire lens optical system L, the position of the array optical device K may be determined based on the focal point of the lens L2 as a reference, for example.

In the present embodiment, what is meant by "different focusing characteristics" is that, when a comparison is made based on light of a predetermined wavelength, at least one of the characteristics contributing to convergence of that light in the optical system is different. Specifically, it is meant that, when a comparison is made based on light of a predetermined wavelength, light having passed through the optical regions D1 and D2 is conducive to different focal lengths of the lens optical system L, different distances from the subject at which focus is achieved, different distance ranges in which sharpness of a certain value or higher is obtained, and so on. By adjusting the radii of curvature, aspheric coefficients, and refractive indices of the optical regions D1 and D2, different focusing characteristics of the lens optical system L can be induced.

In the present embodiment, light having passed through the optical region D1 and the optical subregions d2A, d2B, and d2C through a single instance of imaging passes through the lens L2 and thereafter enters the array optical device K. The array optical device K causes light having passed through the optical region D1 and the optical subregions d2A, d2B, and d2C to each enter a pixel(s) of the imaging device N.

Figure 4A:
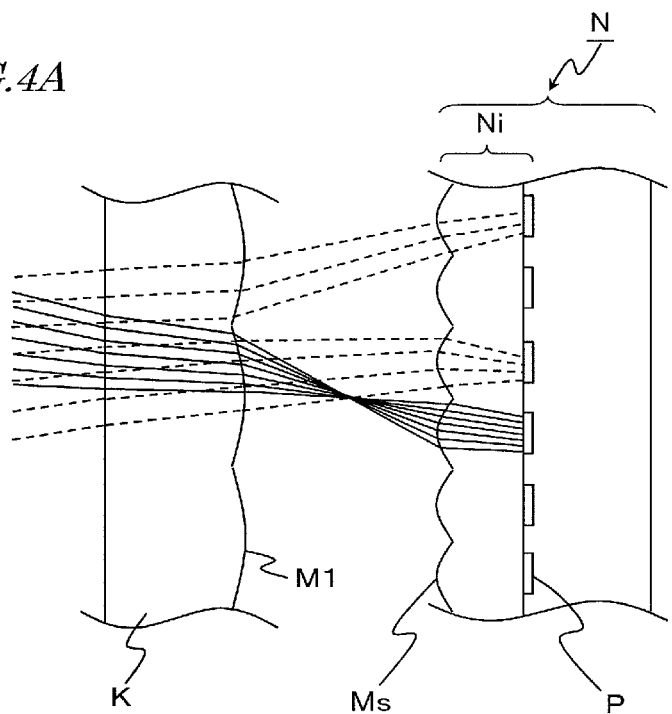
FIG. 4A is an enlarged diagram showing the array optical device K and imaging device N shown in FIG. 1.
Figure 4B:
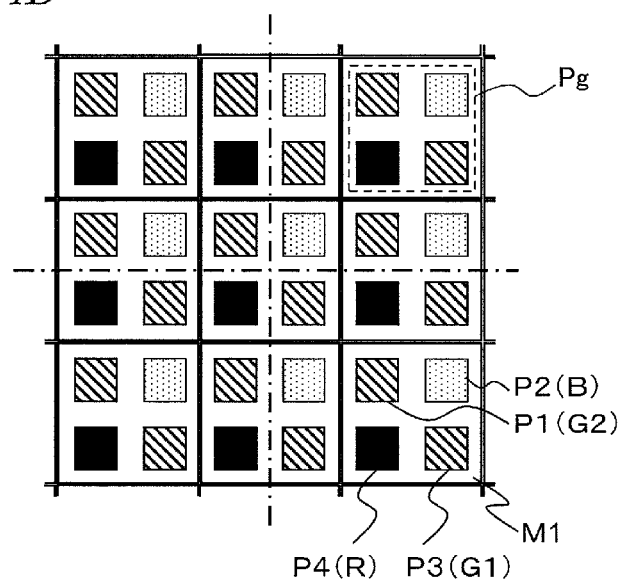
FIG. 4B is a diagram showing relative positioning between the array optical device K and pixels on the imaging device N.

FIG. 4A is an enlarged diagram showing the array optical device K and the imaging device N shown in FIG. 1, and FIG. 4B is a diagram showing relative positioning between the array optical device K and pixels on the imaging device N. The array optical device K is disposed so that the face on which the optical elements M1 are formed is oriented toward the imaging plane Ni.

As shown in FIG. 4B, pixels P are disposed in a matrix shape on the imaging plane Ni. The pixels P can be classified into pixels P1, P2, P3, and P4.

For the sake of description, one set of pixels P1, P2, P3, and P4 arranged in two rows by two columns is referred to as a "pixel group Pg". In one pixel group Pg, given that the position of the pixel P1 is (1, 1), then the pixel P2 is at position (2, 1), the pixel P3 at position (2, 2), and the pixel P4 at position (1, 2). The pixel P1 and pixel P3, both of which are entered by light of the green band, are disposed at oblique positions in the plane of the imaging plane Ni. Thus, in the present embodiment, the wavelength bands of light entering the pixels P1, P2, P3, and P4 may be arranged according to a Bayer pattern. The positions of the pixel P1 and the pixel P3 may be reversed. Any arrangement other than the Bayer pattern may also be used. Since light of the respective wavelength bands of R, G, and B is obtained with the optical region D1 and the optical subregions d2A, d2B, and d2C, there is no need to form color filters for the pixels P1, P2, P3, and P4, but monochromatic sensors may be used.

The array optical device K is disposed so that the face on which the optical elements M1 are formed is oriented toward the imaging plane Ni. The array optical device K is arranged so that one optical element M1 thereof corresponds to four pixels, i.e., two rows by two columns of pixels P1 to P4 (pixel group Pg), on the imaging plane Ni. Microlenses Ms are provided on the imaging plane Ni so as to cover the surface of the pixels P1, P2, P3, and P4.

The array optical device K is designed so that: (a large part of) the light beam B1 having passed through the optical region D1 (shown in FIG. 1, FIG. 2) on the optical element L1 (the light beam B1 indicated by solid lines in FIG. 1) reaches the pixel P3 on the imaging plane Ni; (a large part of) the light beam B2 having passed through the optical subregion d2A reaches the pixel P4 on the imaging plane Ni; (a large part of) the light beam B3 having passed through the optical subregion d2B reaches the pixel P1 on the imaging plane Ni; and (a large part of) the light beam B4 having passed through the optical subregion d2C reaches the pixel P2 on the imaging plane Ni. Specifically, the above construction is realized by appropriately setting parameters such as the refractive index of the array optical device K, the distance from the imaging plane Ni, and the radius of curvature of the surface of the optical elements M1.

The filters which are used in the optical region D1 and the optical subregions d2A, d2B, and d2C are filters made of organic materials, for example. Note that filters respectively having the first spectral transmittance characteristics, the second spectral transmittance characteristics, and the third spectral transmittance characteristics mainly transmit rays of mutually different wavelength bands. However, there may be partial overlaps between the wavelength bands of light transmitted by the respective filters. Moreover, without being limited to primary color filters of RGB, complementary color filters (cyan, magenta, yellow) may also be used.

The stop S is a region through which light beams of all angles of view will pass. Therefore, by inserting a surface having optical characteristics for controlling the focusing characteristic in the neighborhood of the stop S, it becomes possible to control the focusing characteristic of light beams of all angles of view alike. In other words, in the present embodiment, the optical element L1 may be provided in the neighborhood of the stop S. By disposing the optical regions D1 and D2 for inducing different focusing characteristics of the optical system L in the neighborhood of the stop S, the light beam can be allowed to have a focusing characteristic that is in accordance with the number of divided regions.

In FIG. 1, the optical element L1 is provided at a position for allowing light having passed through the optical element L1 to be incident on the stop S directly (i.e., not via any other optical member). The optical element L1 may be provided on the imaging device N side of the stop S. In that case, the optical element L1 may be provided between the stop S and the lens L2, so that light having passed through the stop S is incident on the optical element L1 directly (i.e., not via any other optical member).

Moreover, the array optical device K has a function of branching out into outgoing directions depending on the incident angle of the ray. Therefore, the light beam can be branched out over the pixels on the imaging plane Ni so as to correspond to the optical region D1 and the optical subregions d2A, d2B, and d2C as divided near the stop S.

The first signal processing section C1 (shown in FIG. 1) generates a color image by using a plurality of pieces of luminance information obtained from the pixels P1, P2, P3, and P4 through a single instance of imaging. Hereinafter, the specific method of color image generation will be described.

In the optical system of the imaging apparatus A in FIG. 1, the optical region D1 has a non-spherical surface, whereas the optical region D2 (the optical subregions d2A, d2B, and d2C) has a planar surface. For simplicity of description, it is assumed that the lens L2 is an ideal lens free of aberration.

Since the optical region D2 has a planar surface, rays having passed through the optical region D2 and the lens L2 have no (or little) spherical aberration, as in the graph indicated by a solid line in FIG. 5. When there is no spherical aberration, the point spread distribution varies with an increase in shift from the focal point. In other words, the point spread distribution varies with changing subject distance.

Moreover, due to the aspherical shape of the optical region D1, there is spherical aberration associated with rays having passed through the optical region D1 and the lens L2 as shown by the graph indicated by a broken line in FIG. 5. Such spherical aberration can be imparted by adjusting the aspherical shape of the optical region D1. With such spherical aberration, in a predetermined range near the focal point of the lens optical system L, the point spread distribution associated with rays having passed through the optical region D1 can be kept substantially constant. In other words, the point spread distribution can be kept substantially constant within the predetermined subject distance range.

FIG. 6 is a conceptual diagram of point spread distributions for different subject distances. The left (as one faces the figure) column in FIG. 6 shows what is obtained by extracting only the point spread distribution of the pixel P3 while masking the point spread distributions of the pixels P1, P2, and P4 at 0 level. In other words, it is a point spread distribution which is created by a light beam having passed through the optical region D1. Moreover, the right column is obtained by extracting only the point spread distribution of the pixel P1, while masking the point spread distributions of the pixels P2, P3, and P4 at 0 level. In other words, it is a point spread distribution which is created by a light beam having passed through the optical subregion d2B. It can be seen that the point spread distribution of the pixel P3 is substantially constant against changing subject distance, and that the point spread distribution of the pixel P1 has its point image decrease in size as the subject distance increases.

Sharpness also changes with changes in point spread distribution. Since the image sharpness increases as the point image decreases in size, a graph indication of the relationship between subject distance and sharpness will result in a relationship as shown in FIG. 7. In the graph of FIG. 7, G1 represents the sharpness in a predetermined region of an image formed at the pixel P3 (green component)(an image formed by light having passed through the optical region D1), and G2, R, and B respectively represent the sharpnesses in a predetermined region of images formed at the pixel P1 (green component), the pixel P4 (red component), and P2 (blue component).

Sharpness can be determined based on differences between the luminance values of adjacent pixels in an image block of a predetermined size. Alternatively, it may be determined based on a frequency spectrum obtained by applying Fourier transform to the luminance distribution of an image block of a predetermined size.

When determining a sharpness E in a block of a predetermined size for each component of the pixels P1, P2, P3, and P4 based on differences between the luminance values of adjacent pixels, (math. 1) is used, for example.

$$E = \sum_i \sum_j \sqrt{(\Delta x_{i,j})^2 + (\Delta y_{i,j})^2}$$ [math. 1]

Since the pixels P1, P2, P3, and P4 compose a Bayer pattern as mentioned earlier, the sharpness of each component is to be determined through a calculation by extracting pixel information from every other pixel along both the x direction and the y direction of the image.

In (math. 1), $\Delta x_{i,j}$ is a difference value between the luminance value of a pixel at coordinates (i,j) and the luminance value of a pixel at coordinates (i+2,j) within an image block of a predetermined size; and $\Delta y_{i,j}$ is a difference value between the luminance value of a pixel at coordinates (i,j) and the luminance value of a pixel at coordinates (i,j+2), within the image block of the predetermined size. The reason why the calculation is done by using coordinate j and coordinate j+2 is that, in an image obtained at each of the pixels P3 and P1, luminance information along the lateral direction (x direction) or the vertical direction (y direction) is created for every other pixel.

From the calculation of (math. 1), the greater the difference between luminance values in the image block of the predetermined size is, the greater sharpness is obtained.

Although image sharpness can be determined by using (math. 1) mentioned above, it may also be determined based on a frequency spectrum obtained by applying Fourier transform to the sharpness within the block of the predetermined size.

FIGS. 8(a) to (c) each show a luminance distribution in an image block sized 16×16. Sharpness decreases in the order of FIGS. 8(a), (b), (c). FIGS. 8(d) to (f) show frequency spectrums obtained by applying a two-dimensional Fourier transform to the respective image blocks shown in FIGS. 8(a) to (c). In FIGS. 8(d) to (f), for ease of understanding, the intensity of each frequency spectrum is indicated through logarithmic transformation, such that the more intense the frequency spectrum is, the brighter it appears. In each frequency spectrum, the place of highest luminance in the center is a DC component, and increasingly higher frequencies exist closer to the peripheral portion.

In FIGS. 8(d) to (f), it can be seen that the higher frequency spectrum is lost as the image sharpness decreases. Therefore, in order to determine sharpness from any such frequency spectrum, the entire frequency spectrum or a portion thereof may be extracted, for example.

When generating a color image, the color image may be generated by simply interpolating the chromatic information that is lost for each pixel position on the basis of the luminance information of the pixels P1, P2, P3, and P4; however, the sharpness of G1 is smaller than the sharpnesses of G2, B, and R as shown in FIG. 7, and therefore the color image may be generated after enhancing the sharpness of G1.

Figure 9A:
FIG. 9A is a diagram showing a subject, which is a chart of white and black.
Figure 9B:
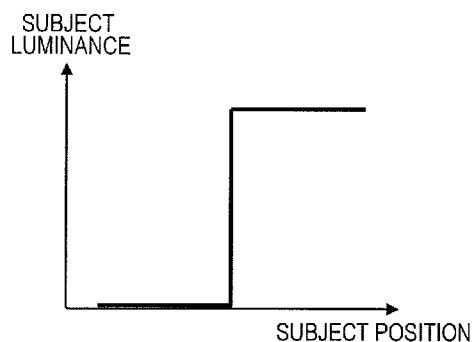
FIG. 9B is a diagram showing a cross section in the luminance of the subject of FIG. 9A.
Figure 9C:
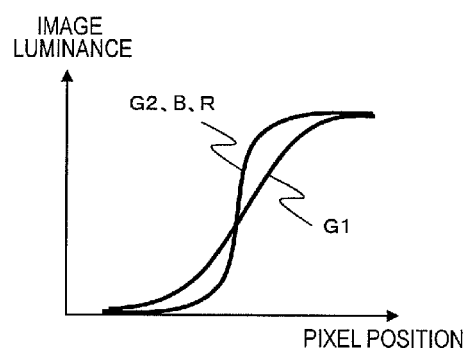
FIG. 9C is a diagram showing a cross section in the luminance of an image which is captured by the imaging apparatus A of FIG. 1 for each color.

FIGS. 9A to 9E is a diagram describing a method of enhancing the sharpness of G1 based on the sharpnesses of G2, B, and R. FIG. 9A shows a subject, which is a white-black chart, and FIG. 9B is a diagram showing a cross section in the luminance of the subject of FIG. 9A. As shown in FIG. 9B, the luminance of the chart has a step-like cross section; however, the image will have a luminance cross section as shown in FIG. 9C when taken by placing the chart at a predetermined position that is shifted slightly frontward from the subject position at which the rays reaching the pixels P1, P2, and P4 are best focused, for example. In the graph of FIG. 9C, G1 is a luminance cross section of an image which is generated at the pixel P3 (green component), whereas G2, B, and R are luminance cross sections of images which are generated at the pixel P1 (green component), the pixel P2 (blue component), and the pixel P4 (red component), respectively. Thus, the luminance cross sections of G2, B, and R is closer to the luminance cross section of the actual chart in FIG. 9B than is the luminance cross section of G1, therefore having a higher sharpness.

Figure 9D:
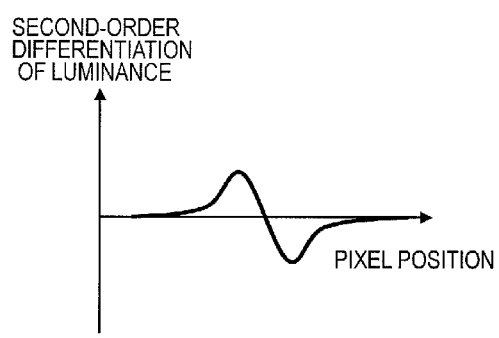
FIG. 9D is a diagram showing a second-order differentiation of the G1 (green) and R(red) luminance in FIG. 9C.
Figure 9E:
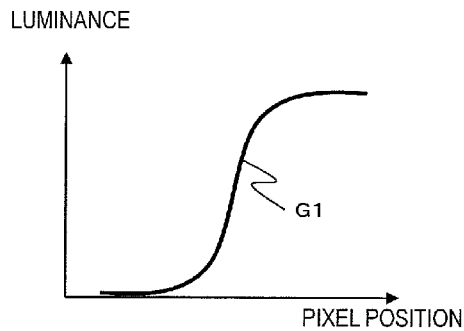
FIG. 9E is a diagram showing a cross section in the luminance when the second-order differentiation of FIG. 9D is subtracted from the G2 (green) and B(blue) luminance in FIG. 9C.

When a white-black chart such as that shown in FIG. 9A is imaged, the respective luminance cross sections of G2, B, and R will have substantially identical cross sections; in actuality, however, a subject image of every possible color component will be taken, and the luminance cross sections of G2, B, and R in FIG. 9C will not coincide in most cases. Therefore, the respective sharpnesses may be detected from the luminance cross sections of G2, B, and R, and a color component with a high sharpness may be selected to sharpen the luminance cross section of G1. Detection of sharpness is performed at a sharpness detection section which is in the first signal processing section C1. When a luminance cross section with a high sharpness is selected, and its luminance cross section is subjected to second-order differentiation, the distribution of FIG. 9D is obtained, and the edge of an image of the color component with a high sharpness can be detected. Next, by subtracting the distribution of FIG. 9D from the G1 luminance distribution of FIG. 9C, the distribution of FIG. 9E is obtained, whereby the G1 luminance distribution has been sharpened. Now, when subtracting the distribution of FIG. 9D, the distribution of FIG. 9D may be multiplied by a predetermined coefficient, which then may be subtracted from the G1 luminance distribution of FIG. 9C, thus controlling the degree of sharpening G1.

Although the present embodiment illustrates the image sharpening in one-dimensional terms for simplicity of description, an image is two-dimensional and therefore a two-dimensional sharpening process is actually to take place.

Through the above image processing, the sharpness of G1 which is indicated by a solid line in FIG. 7 can be sharpened as in G1' which is indicated by a broken line, thus sharpening the resultant color image.

Figure 10:
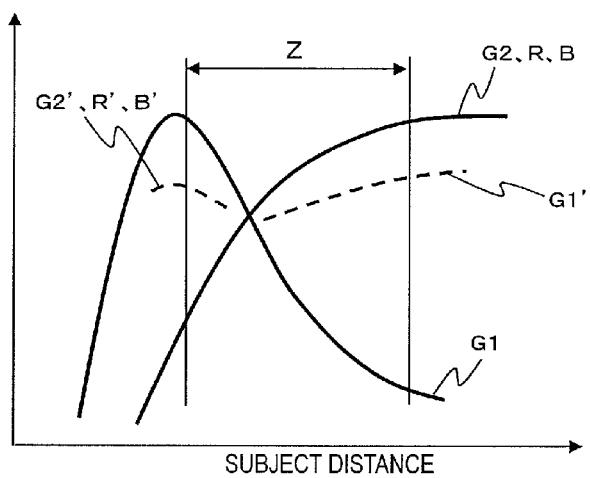
FIG. 10 is a graph showing another relationship between subject distance and sharpness (how sharp an image is) according to Embodiment 1 of the present invention.

FIG. 10 is a graph showing the relationship between subject distance and sharpness in the case where the optical surface in the optical region D1 is changed from an aspherical shape to a spherical shape in FIG. 1. In this case, too, the color image can be sharpened similarly to FIG. 7.

In FIG. 10, different color components have a high sharpness depending on the subject distance. Therefore, respective sharpnesses are detected from the luminance cross sections of G1, G2, R, and B, and the color component with the highest sharpness is selected to sharpen any other color component.

Through the above image processing, the sharpnesses of G1, G2, R, and B which are indicated by solid lines in FIG. 10 can be respectively sharpened as in G1', G2', R', and B' which are indicated by broken lines, thus sharpening the resultant color image.

Figure 11:
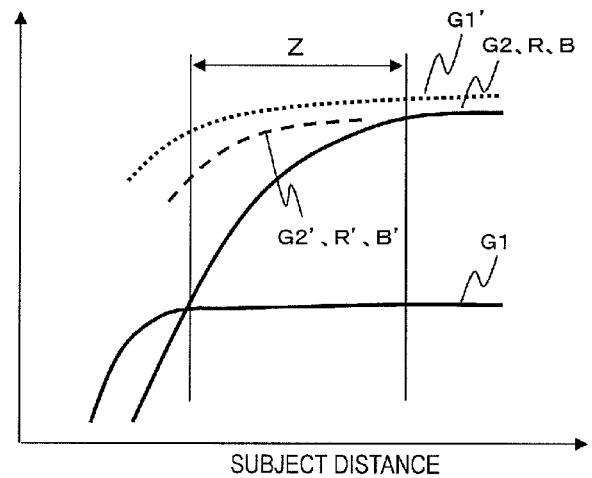
FIG. 11 is a graph showing another relationship between subject distance and sharpness (how sharp an image is) according to Embodiment 1 of the present invention.

Next, another image sharpening technique will be described. FIG. 11 is a diagram describing a method of enhancing the sharpnesses of G2, B, and R based on G1', which is a sharpness-enhanced version of G1. The construction of the optical regions D1 and D2 is the same as that in FIG. 7, and the point spread distribution created by rays having passed through the optical region D1 is substantially constant within a predetermined subject distance range. Therefore, the point spread distribution which is created by extracting each pixel P3 (G1 component) is substantially constant within a predetermined subject distance range. So long as the point spread distribution is substantially constant in the predetermined subject distance range, an image which is formed by extracting the pixel P3 (G1 component) is restorable based on a predetermined point spread distribution, regardless of the subject distance.

Hereinafter, a method of restoring a captured image based on a previously stored point spread function will be described. Assuming that the original image is f(x,y), and the point spread distribution is h(x,y), the captured image g(x,y) is expressed by (math. 2).

$$g(x,y)=f(x,y) \otimes h(x,y) \text{ (where } \otimes \text{ represents convolution)} \quad \text{[math. 2]}$$

A Fourier transform applied to both sides of (math. 2) gives (math. 3).

$$G(u,v)=R(u,v)H(u,v) \quad \text{[math. 3]}$$

Now, by applying an inverse filter Hinv(u,v) of (math. 4) to the deteriorated image G(u,v), a two-dimensional Fourier transform F(u,v) of the original image is obtained as in (math. 5). By applying an inverse Fourier transform to this, the original image f(x,y) can be obtained as a restored image.

$$Hinv(u, v) = \frac{1}{H(u, v)} \quad \text{[math. 4]}$$

$$F(u, v) = Hinv(u, v)G(u, v) \quad \text{[math. 5]}$$

However, if H(u,v) is 0 or has a very small value, Hinv(u,v) will diverge; therefore, a Wiener filter Hw(u,v) as indicated by (math. 6) is used for restoration from the deteriorated image.

$$Hw(u, v) = \frac{1}{H(u, v)} \frac{|H(u, v)|^2}{|H(u, v)|^2 + |N(u, v)|^2/|F(u, v)|^2} \quad \text{[math. 6]}$$

In (math. 6), N(u,v) is noise. Since usually the noise and the original image F(u,v) are unknown, a constant k is actually used to restore the deteriorated image with a filter of (math. 7).

$$Hw(u, v) = \frac{1}{H(u, v)} \frac{|H(u, v)|^2}{|H(u, v)|^2 + k} \quad \text{[math. 7]}$$

With such a restoration filter, the sharpness of G1 which is indicated by a solid line in FIG. 11 can be sharpened as in G1' which is indicated by a dotted line. Thus, according to the present embodiment, by using a point spread function, optical it is possible to perform a restoration process for all regions of an image which is formed from luminance information of the pixels that are reached by light entering the region D1. Since a point spread function generally changes with the imaging position of the optical system, a point spread function corresponding to each imaging position may be used. However, in an optical system whose point spread function hardly depends on the imaging position, it is possible to perform a restoration process for all regions of an image with a single point spread function. While there is a need to store the point spread function in advance in a memory or the like, use of a single point spread distribution allows the amount of used memory to be reduced. Furthermore, in a manner similar to the method shown in FIG. 9, from the G1' luminance cross section (restored sharpened image), respective sharpnesses may be detected for each predetermined region (sharpness detection section); the luminance cross section of a color component with a high sharpness may be subjected to second-order differentiation; and this may be subtracted from G2, B, and R, whereby the sharpnesses of G2, B, and R can be improved as in G2', B', and R' which is indicated by a broken line in FIG. 11. Thus, the luminance information components of other pixels can be sharpened based on sharpness.

Through the above image processing, the sharpness of G1 and the sharpnesses of G2, B, and R which are indicated by solid lines in FIG. 11 are improved as in G1' which is indicated by a dotted line and G2', B', and R' which are indicated by a broken line, thus sharpening the resultant color image. Through such a sharpening process, the depth of field can be further expanded from the sharpening process described in FIG. 7.

Next, a specific method of determining subject distance will be described.

Figure 12:
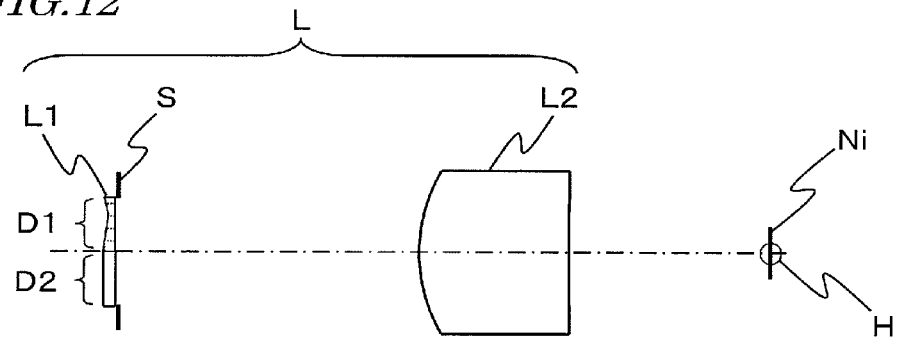
FIG. 12 is a cross-sectional view showing the imaging apparatus A of Embodiment 1.

FIG. 12 is a cross-sectional view showing the imaging apparatus A of Embodiment 1. In FIG. 12, constituent elements which are identical to those in FIG. 1 are indicated by the same alphanumeric expressions as in FIG. 1. Although FIG. 12 omits the array optical device K (shown in FIG. 1 and the like) from illustration, the array optical device K is actually included in a region H in FIG. 12. The region H has the construction shown in FIG. 4A.

Table 1 and Table 2 show design data for the optical system of the imaging apparatus A shown in FIG. 12. In Table 1 and Table 2, Ri represents a paraxial radius of curvature (mm) of each surface; di represents an inter-surface-center interval (mm) of each surface; nd represents a d-line refractive index of the lens or filter; and v d represents a d-line Abbe number of each optical element. Moreover, an aspherical shape is expressed by (math. 8), where x is a distance from a tangent plane of the surface vertex in the optical axis direction; h is a height from the optical axis; r is a paraxial radius of curvature; k is a conical constant; and Am (m=4,6,8,10) is an $m^{th}$ aspheric coefficient. Moreover, Table 3 shows spectral transmittance characteristics of the optical region D1 and the optical subregions d2A, d2B, and d2C. The optical region D1 and the optical subregion d2B have identical spectral transmittance characteristics.

$$x = \frac{\frac{1}{r}h^2}{1 + \sqrt{1-(1+k)\left(\frac{1}{r}\right)^2 h^2}} + A_4 h^4 + A_6 h^6 + A_8 h^8 + A_{10} h^{10} \quad \text{[math. 8]}$$

TABLE 1 lens data
focal length = 10 mm, F value = 2.8
angle of view 2ω = 10°,
effective imaging circle = φ1.75 mm

| surface number | Ri | di | di | vd |
|---|---|---|---|---|
| object | ∞ | 4000 | — | — |
| R1 surface | region d2A | ∞ | 0.5 | 1.5253 | 56.0 |
| | region D1 | 2000 | | | |
| | region d2C | ∞ | | | |
| | region d2B | ∞ | | | |
| R2 surface | ∞ | 0.1 | — | — |
| stop | ∞ | 10 | — | — |
| R3 surface | 5.332237 | 5 | 1.5253 | 56.0 |
| R4 surface | −319.8501 | 6.75 | — | — |
| image surface | ∞ | — | — | — |

TABLE 2

| | k | A4 | A6 | A8 | A10 |
|---|---|---|---|---|---|
| R1 surface region D2 | 0 | 0 | 0 | 0 | 0 |
| region D1 | 0 | 0.000064653 | 0.00018193 | 0 | 0 |
| R3 surface | −0.296987 | 0.000421138 | −0.000059237 | 0.000016321 | −0.000001294 |
| R4 surface | 0 | 0.00274336 | −0.000566209 | 0.000216386 | −0.000026416 |

TABLE 3 spectral transmittance characteristics

| region d2A | 400 to 500 nm |
|---|---|
| region D1 | 500 to 600 nm |
| region d2C | 600 to 700 nm |
| region d2B | 500 to 600 nm |

The first signal processing section C1 shown in FIG. 1 outputs a first image I1 (shown in FIG. 1) which is obtained by extracting luminance information from the pixel P3 (G1 component) and a second image I2 which is obtained by extracting luminance information from the pixel P1 (G2 component). Since the two optical regions D1 and D2 have mutually different optical characteristics, the image sharpnesses (values calculated by using luminance) of the first and second images I1 and I2 vary depending on the subject distance. In the storage section Me (shown in FIG. 1), a correlation between sharpness and subject distance of light having passed through each of the optical regions D1 and D2 is stored. In the second signal processing section C2 (shown in FIG. 1), the distance from the subject can be determined based on the sharpnesses of the first and second images I1 and I2 and the aforementioned correlations.

Herein, the range Z in FIG. 7 and FIG. 11 represents a region in which G2 changes but in which G1 hardly changes. In the range Z, the subject distance can be determined by utilizing this relationship. For example, in the range Z, since there is a correlation between the subject distance and the ratio between the sharpnesses G1 and G2, the correlation between the subject distance and the ratio between the sharpnesses G1 and G2 is stored in the storage section Me in advance.

When the imaging apparatus is used, within the data which is obtained through a single instance of imaging, a ratio in sharpness between the first image I1 which is generated from the pixel P3 (G1 component) alone and the second image I2 which is generated from the pixel P1 (G2 component) alone is determined for each calculation block. Then, by using the correlations stored in the storage section Me, the subject distance can be determined. Specifically, for each calculation block, the sharpness ratio in the aforementioned correlation and the sharpness ratio between the first image I1 and the second image I2 are compared in value. Then, a subject distance that corresponds to a matching value between the two is regarded as the distance from the subject at shooting.

In order to univocally determine the subject distance from the ratio between the sharpness of the first image I1 generated from the pixel P3 alone and the sharpness of the second image I2 generated from the pixel P1 alone, it is necessary that the sharpness ratio always varies throughout a predetermined subject distance range.

In FIG. 7, FIG. 10, and FIG. 11, the sharpness ratio always varies throughout the range Z, and thus the subject distance can be univocally determined. Moreover, since the sharpness values being too low would make it impossible to determine a ratio, the sharpness values may be equal to or greater than a certain value.

Note that the relationship between subject distance and sharpness is determined from the radii of curvature, aspheric coefficients, and refractive indices of the surfaces in the optical regions D1 and D2. In other words, the optical regions D1 and D2 need to have optical characteristics such that the ratio between the sharpness of the first image I1 and the sharpness of the second image I2 always varies throughout the predetermined distance range.

In the present embodiment, the subject distance may be determined by using any value other than sharpness, e.g., contrast, so long as it is a value that is calculated by using luminance (luminance information). Contrast can be determined from a ratio between the highest luminance value and the lowest luminance value within a predetermined calculation block, for example. Sharpness is a difference between luminance values, whereas contrast is a ratio between luminance values. A contrast may be determined from a ratio between a point of the highest luminance value and a point of the lowest luminance value, or a contrast may be determined from a ratio between an average value of several points of the largest luminance values and an average value of several points of the lowest luminance values. When the subject distance is within a certain range, the contrast of the first image I1 and the contrast of the second image I2 have a correlation with the subject distance. In the case of using contrast to determine the subject distance, similarly to the case of sharpness, a correlation between the subject distance and the contrast ratio is stored in advance in the storage section Me. In this case, the first signal processing section C1 includes a contrast detection section which detects the contrast of the first image I1 obtained from the pixel P3 and the contrast of the second image I2 obtained from the pixel P1. By determining a contrast ratio between the first image I1 and the second image I2 for each calculation block, it is possible to determine the subject distance by utilizing the correlation (second signal processing section C2).

Moreover, in the present embodiment, the subject distance may be determined by using a value other than sharpness or contrast, e.g., point spread distribution. Hereinafter, a method of determining a point spread distribution from the first image I1 and the second image I2 will be described.

When the aforementioned (math. 7) is used to restore the first image I1 generated from the pixel P3 (G1 component) alone, a restored image $i1'(x,y)$ which is very close to the original image $f(x,y)$ is obtained. Now, assuming a second image $i2(x,y)$ which is generated from the pixel P1 (G2 component) alone, and a point spread distribution $h2(x,y)$ associated with rays passing through the optical region D2, it is possible to express $i2(x,y)$ by (math. 9).

$$i2(x,y) \approx i1'(x,y) \otimes h2(x,y) \text{ (where } \otimes \text{ represents convolution)} \quad \text{[math. 9]}$$

A Fourier transform applied to both sides of (math. 9) gives (math. 10).

$$I2(u,v) \approx I1'(u,v)H2(u,v) \quad \text{[math. 10]}$$

Through transformation of (math. 10), frequency domain values $H2(u,v)$ of the point spread distribution $h2(x,y)$ are obtained as in (math. 11).

$$H2(u,v) \approx \frac{I2(u,v)}{I1'(u,v)} \quad \text{[math. 11]}$$

By applying an inverse Fourier transform to this, a point spread distribution $h2(x,y)$ associated with rays passing through the optical region D2 can be obtained.

Since the point spread distribution $h2(x,y)$ associated with rays passing through the optical region D2 varies with subject distance, when the subject distance is within a certain range, the point spread distribution $h2(x,y)$ and the subject distance have a correlation. This correlation can be utilized to determine the subject distance.

In the case of using a representative value to express a point spread distribution, the diameter of the point spread distribution can be used, for example. Similarly to the case of sharpness or contrast, a correlation between subject distance and point image diameter is stored in advance in the storage section Me. By determining a point spread distribution from the first image I1 or the second image I2 for each block, and determining the diameter of the point image from the point spread distribution, the subject distance can be determined through correlation. The diameter of a point image can be determined from the half-width of the point spread distribution, for example.

The present embodiment may be constructed so as to generate an image obtained through addition of the first image I1 and the second image I2 in the case where the radii of curvature of the respective regions are made different from each other as shown in FIG. 10. The distance range in which sharpness attains a certain value or greater in the image generated through addition of the first image I1 and the second image I2 is larger than those of the first image I1 and the second image I2. In this case, the ratio between the sharpness of the image generated through addition and the sharpness of either the first image I1 or the second image I2 has a correlation with subject distance. By storing this correlation in advance, it is possible to determine a subject distance for each predetermined region of an image.

Note that the optical system of the imaging apparatus of the present embodiment may be an image-side telecentric optical system. As a result, even if the angle of view changes, incidence occurs with the principal-ray incident angle of the array optical device K having a value close to 0 degrees, so that the crosstalk between light beams reaching the pixels P1, P2, P3, and P4 can be reduced across the entire imaging region.

Although the present embodiment has illustrated the lens L2 to be an ideal lens for simplicity of description as mentioned above, it is not necessary to employ an ideal lens. For example, a non-ideal lens would have axial chromatic aberration, but it is possible to select a color component with a high sharpness to sharpen other color components as described earlier; thus, a color image with sharpness can be generated even without an ideal lens. Moreover, in the case of determining the subject distance, the distance is to be determined based on a single color component (which in the present embodiment is the green component); thus, there may be some axial chromatic aberration.

Moreover, in the case of using a non-ideal lens, a construction that corrects for axial chromatic aberration at the optical element L1 may be employed. Although the present embodiment assumes that the optical region D2 (the optical subregions d2A, d2B, and d2C) of the optical element L1 is all planar surface, they may respectively have different optical surfaces to correct for axial chromatic aberration. As described earlier, rays having passed through the optical subregions d2A, d2B, and d2C reach the pixel P4, the pixel P1, and the pixel P2, respectively. Light of the red, green, and blue wavelength components mainly reach the pixel P4, the pixel P1, and the pixel P2, respectively; therefore, in the case where a lens having axial chromatic aberration is adopted for the lens L2, the optical surfaces of the optical subregions d2A, d2B, and d2C may be allowed to have different optical powers so that the respective wavelength bands of light have the same focusing position. With such a construction, as compared to the case where the optical subregions d2A, d2B, and d2C have an equal optical power, the focusing positions of light transmitted through the optical subregions d2A, d2B, and d2C can be brought close to one another, whereby the axial chromatic aberration occurring in the lens L2 can be corrected for by the optical element L1. By correcting for the axial chromatic aberration with the optical element L1, the number of lenses composing the lens L2 can be reduced, thus downsizing the optical system.

Although the optical element L1 and the lens L2 are separate in the present embodiment, another possible construction is where the lens L2 has the optical regions D1 and D2, with the optical element L1 being eliminated. In this case, the stop S may be disposed near the optical regions D1 and D2 of the lens L2.

In this Embodiment 1, the optical region D1 and the optical subregion d2B are equal in area. With this construction, the exposure times for the pixel P3 and the pixel P1 may be made equal. In the case where the optical region D1 and the optical subregion d2B have different areas, the exposure times for the pixel P3 and the pixel P1 may be different. For example, when the area of the optical region D1 is broader than the area of the optical subregion d2B, the exposure time for the pixel P3 may be shorter than the exposure time for the pixel P1.

Thus, according to the present embodiment, both a color image and the subject distance can be obtained through a single instance of imaging using a single imaging system. In other words, through a single instance of imaging using the imaging apparatus of the present embodiment, luminance information for a color image output and subject distance measurement can be obtained. Then, using the luminance information, both the color image and the subject distance can be obtained. Since the subject distance can be calculated for each calculation block, it is possible to obtain the subject distance at any arbitrary image position in the color image. Thus, it is also possible to obtain a subject distance map across the entire image. Moreover, the distance from the subject can be obtained with a single imaging system, which is unlike in an imaging apparatus having a plurality of imaging optical systems, where it would be necessary to ensure matching characteristics and positions between the plurality of imaging optical systems. Moreover, since rays enter the optical regions D1 and D2 (optical subregions d2A, d2B, and d2C) through a single instance of imaging, discrepancies between images will not occur due to time lags in imaging. Moreover, when a motion video is shot by using the imaging apparatus of the present embodiment, an accurate distance from the subject can be measured even if the subject position changes with lapse of time.

Figure 13:
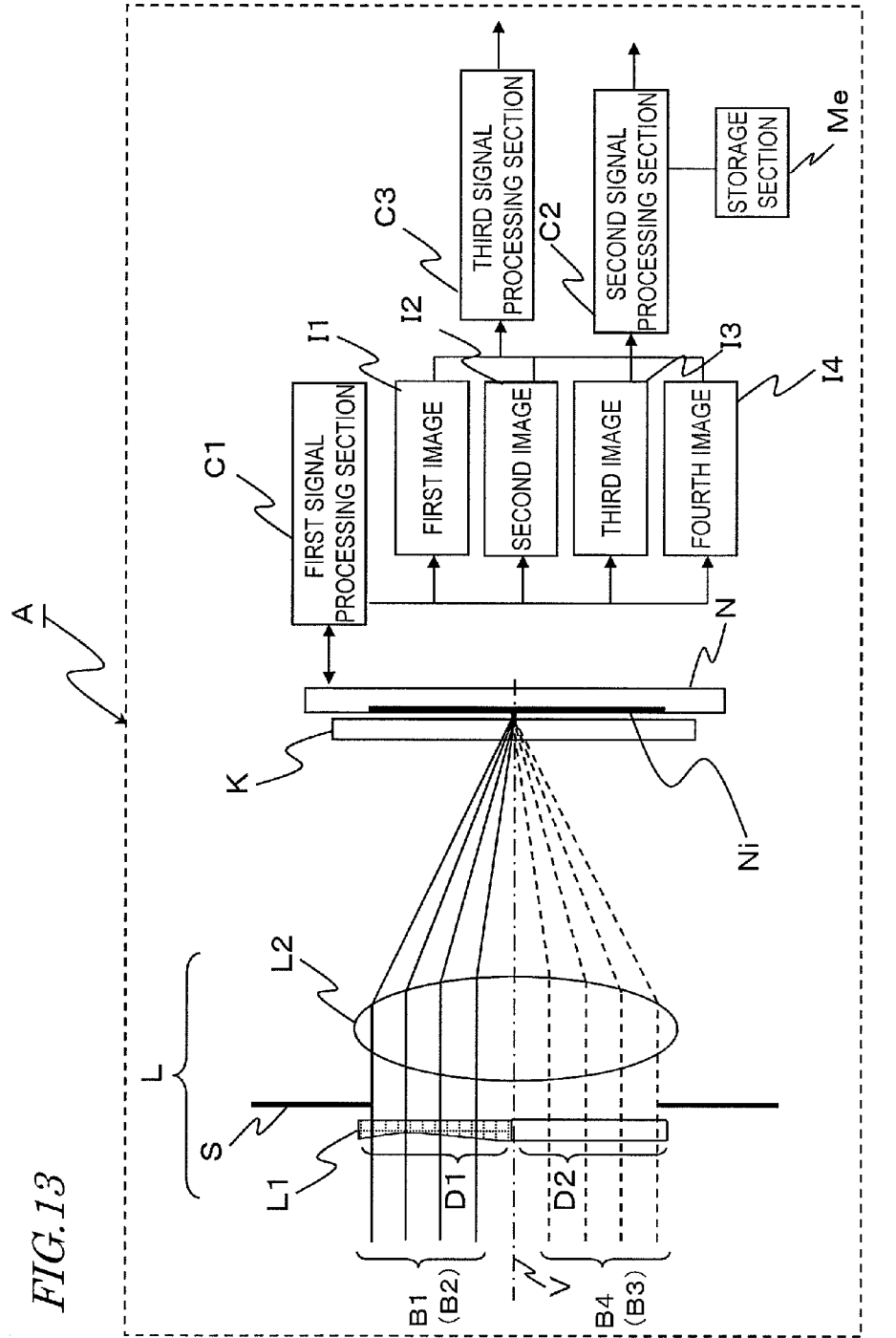
FIG. 13 is a diagram showing another imaging apparatus according to Embodiment 1.

In the present embodiment, the imaging apparatus may have a construction as shown in FIG. 13. FIG. 13 is a diagram showing another imaging apparatus according to Embodiment 1. In the imaging apparatus shown in FIG. 13, the first signal processing section C1 outputs a first image I1 obtained from the pixel P3, a second image I2 obtained from the pixel P1, and third and fourth images I3 and I4 obtained from the pixels P2 and P4. A second signal processing section C2 performs a distance measurement calculation by using luminance information which is expressed as a difference (sharpness) in luminance value between adjacent pixels in the first image I1 and the second image I2. A third signal processing section C3 generates a color image by merging at least two or more images of different wavelength bands from among the images I1 to I4 of respective wavelength bands.

In the construction shown in FIG. 13, a color image is formed by merging the images I2, I3, and I4, for example. Although it would be possible to use the image I1 instead of the image I2, this in itself would result in an unnatural image because the sharpness G1 for the subject distance is different from G2, G3, or G4, as shown in FIG. 7. Therefore, in the case of using the image I1 for color image formation, a conversion into a clear image through image processing may be performed as indicated in FIG. 7. For example, a sharpening process through a Laplacian filter process may be employed.

Figure 14:
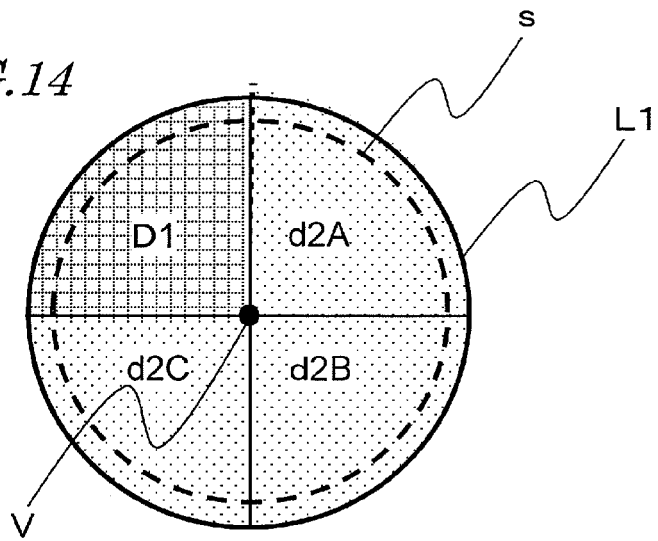
FIG. 14 is a front view showing another optical element L1 according to Embodiment 1 of the present invention as viewed from the subject side.

Table 1 assumes that the three optical subregions d2A, d2B, and d2C have planar surfaces while the optical region D1 has a non-spherical surface generating a substantially constant point spread distribution. Alternatively, as shown in FIG. 14, the optical region D1 may have a planar surface, whereas the three optical subregions d2A, d2B, and d2C may have optical surfaces generating a substantially constant point spread distribution. In this case, similarly to FIG. 2, a distance from the subject can be measured by using the images I1 and I2 having passed through the optical region D1 and the optical subregion d2B. Moreover, a color image can be generated by merging the images obtained from the respective pixels. At this time, any image with a low sharpness may be sharpened through image processing, so that a clear color image will be obtained.

Figure 15:
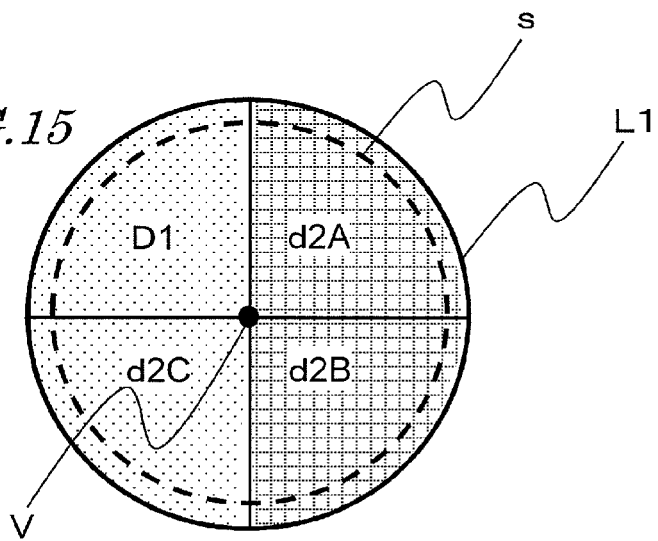
FIG. 15 is a front view showing another optical element L1 according to Embodiment 1 of the present invention as viewed from the subject side.

Moreover, as shown in FIG. 15, the optical region D1 and the optical subregion d2C may have planar surfaces, whereas the two optical subregions d2A and d2B may have optical surfaces generating a substantially constant point spread distribution. In this case, it may do well to apply a sharpening process to the image I4 and the image I2 before color image formation.

Embodiment 2

Embodiment 2 differs from Embodiment 1 in that a microlens array is formed on the imaging plane. In the present embodiment, any detailed description directed to similar subject matter to Embodiment 1 will be omitted.

FIGS. 16A and 16B are enlarged diagrams each showing an array optical device K and an imaging device N. In the present embodiment, the microlens array Md is formed on an imaging plane Ni of the imaging device N. Similarly to Embodiment 1 and the like, pixels P are disposed in a matrix shape on the imaging plane Ni. A single optical element of a microlens corresponds to the plurality of pixels P. In the present embodiment, too, similarly to Embodiment 1, light beams having passed through different regions of the optical element L1 can be led to respectively different pixels. FIG. 16B is a diagram showing a variant of the present embodiment. In the construction shown in FIG. 16B, microlenses Ms are disposed on the imaging plane Ni so as to cover the pixels P, and the array optical device K is stacked on the surface of the microlens Ms. With the construction shown in FIG. 16B, the efficiency of convergence can be enhanced over that of the construction in FIG. 16A.

Embodiment 3

This Embodiment 3 differs from Embodiments 1 and 2 in that a light-shielding member is provided at the boundaries between optical regions of the optical element L1. In the present embodiment, any detailed description directed to similar subject matter to Embodiment 1 will be omitted.

Figure 17A:
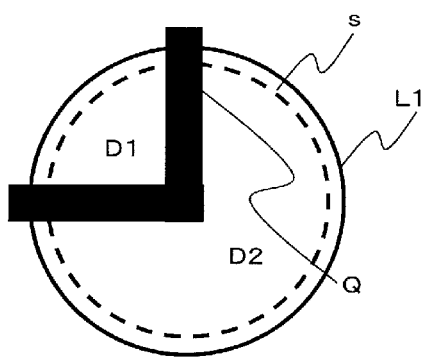
FIG. 17A and FIG. 17B are front views showing relative positioning between different optical regions and a light-shielding member according to Embodiment 3 of the present invention.
Figure 17B:
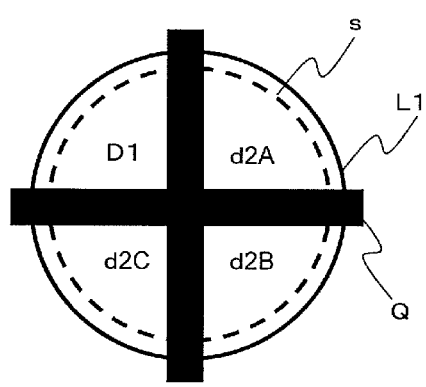

FIG. 17A is a front view in which a light-shielding member Q is provided at the boundaries between optical regions D1 and D2 according to Embodiment 3. FIG. 17B is a front view in which a light-shielding member Q is provided at the boundaries between an optical region D1 and optical subregions d2A, d2B, and d2C according to Embodiment 3.

At the boundaries between regions, discontinuous changes in shape cause level differences at the boundaries, possibly causing unwanted light. Therefore, disposing the light-shielding member Q at the boundaries can suppress unwanted light. As the light-shielding member Q, a polyester film with carbon black knead therein or the like may be used, for example. The light-shielding member Q may be formed so as to be integral with the stop.

FIG. 17B shows an implementation in which the linear light-shielding member Q is employed in such a manner that the shapes of the portions partitioned by the light-shielding member Q appear as sectors of a circle. In the present embodiment, a light-shielding member may be used whose light-transmitting portions are apertures in the shapes of circles, ellipses, rectangles, etc., so that circles, ellipses, or rectangles are obtained as the portions partitioned by the light-shielding member Q.

Embodiment 4

Figure 18:
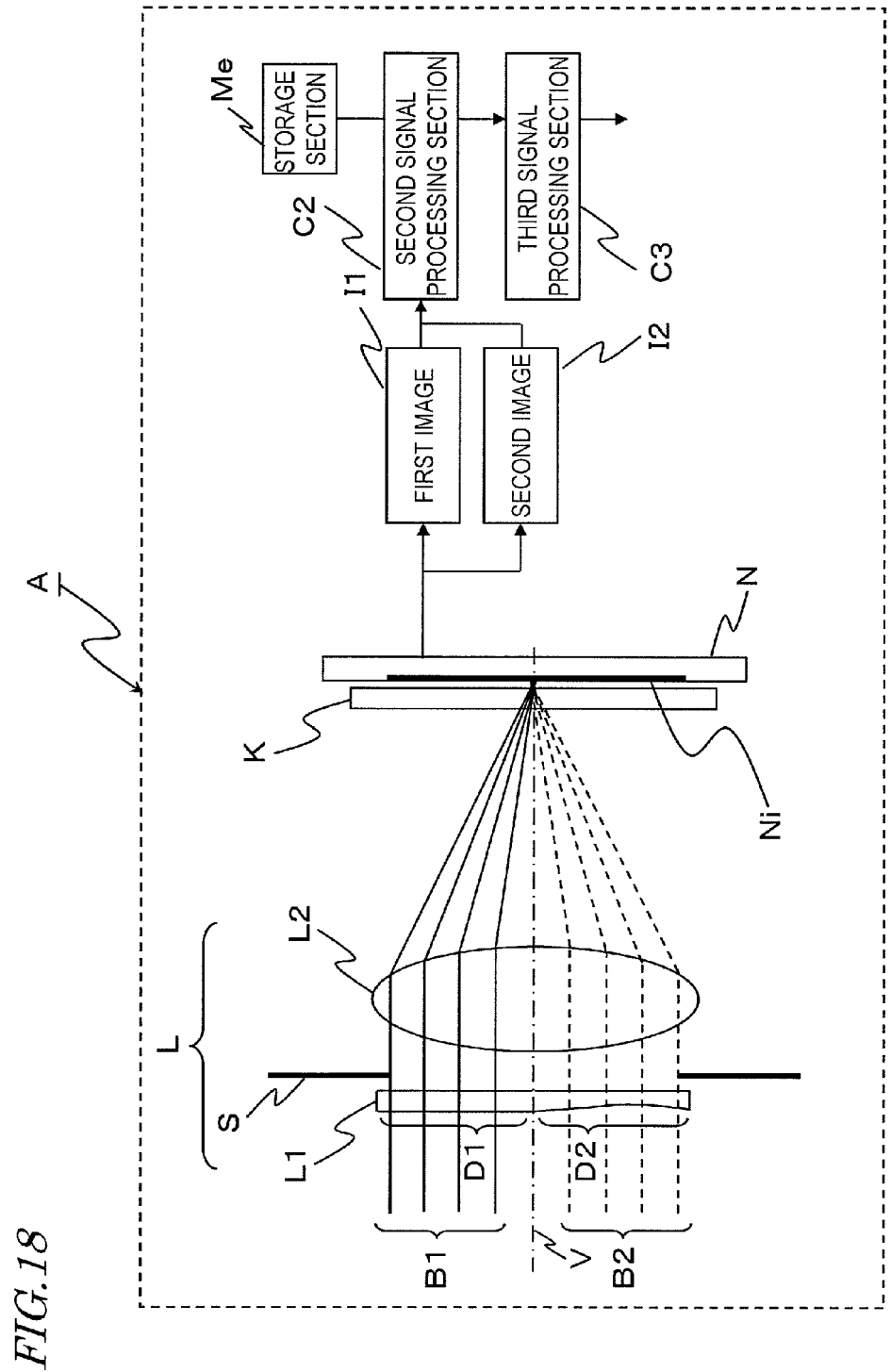
FIG. 18 is a schematic diagram showing Embodiment 4 of an imaging apparatus A according to the present invention.

FIG. 18 is a schematic diagram showing an imaging apparatus A according to Embodiment 4. The imaging apparatus A of the present embodiment includes: a lens optical system L having an optical axis V; an array optical device K disposed near the focal point of the lens optical system L; an imaging device N; a second signal processing section C2; a third signal processing section C3; and a storage section Me.

The lens optical system L is composed of: an optical element L1 including two optical regions D1 and D2 having optical characteristics which provide mutually different focusing characteristics, and on which light beams B1 and B2 from a subject (not shown) are incident; a stop S on which light having passed through the optical element L1 is incident; and a lens L2 on which light having passed through the stop S is incident. The optical element L1 may be provided near the stop S.

Figure 19:
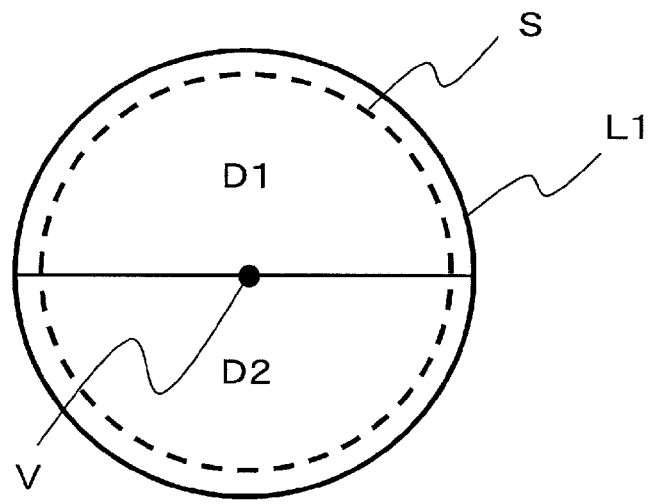
FIG. 19 is a front view showing an optical element L1 according to Embodiment 4 of the present invention as viewed from the subject side.

FIG. 19 is a front view of the optical element L1 as viewed from the subject side. In the optical element L1, the optical regions D1 and D2 are two divided, upper-lower parts around the optical axis V as a center of boundary, in a plane which is perpendicular to the optical axis V. In FIG. 19, a broken line s indicates where the stop S is. In FIG. 18, the light beam B1 is a light beam passing through the optical region D1 on the optical element L1, and the light beam B2 is a light beam passing through the optical region D2 on the optical element L1. The light beams B1 and B2 pass through the optical element L1, the stop S, the lens L2, and the array optical device K in this order, and arrive at the imaging plane Ni on the imaging device N (shown in FIG. 21 and so on).

Figure 20:
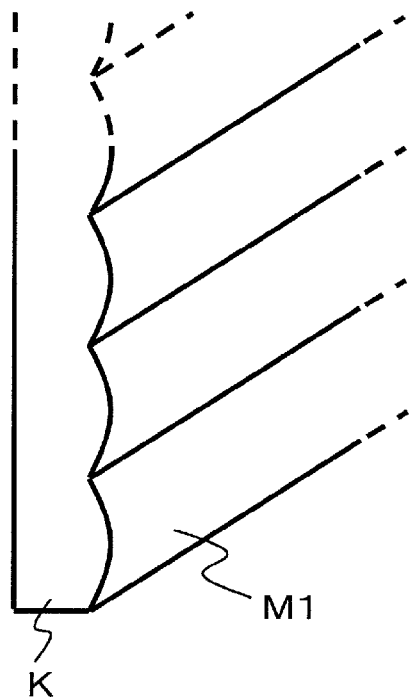
FIG. 20 is a perspective view of an array optical device K according to Embodiment 4 of the present invention.

FIG. 20 is a perspective view of the array optical device K. On the face of the array optical device K closer to the imaging device N, a plurality of optical elements M1, each longitudinally extending in the lateral direction, are flanking along the vertical direction in a plane which is perpendicular to the optical axis V. The cross section (a cross section along the vertical direction) of each optical element M1 has an arc shape protruding toward the imaging device N. Thus, the array optical device K has a lenticular lens construction.

As shown in FIG. 18, the array optical device K is provided near the focal point of the lens optical system L, being at a position which is a predetermined distance away from the imaging plane Ni. Although the optical characteristics of the optical element L1 will actually affect the focusing characteristic of the entire lens optical system L, the position of the array optical device K may be determined based on the focal point of the lens L2 as a reference, for example. In the present embodiment, what is meant by "different focusing characteristics" is that at least one of the characteristics contributing to light convergence in the optical system is different, specifically: different focal lengths, different distances from the subject at which focus is achieved, different distance ranges in which sharpness of a certain value or higher is obtained, and so on. By adjusting the radii of curvature, aspheric coefficients, and refractive indices of the optical regions D1 and D2, different focusing characteristics of the lens optical system L can be induced.

In the present embodiment, light having passed through the two optical regions D1 and D2 passes through the lens L2 and thereafter enters the array optical device K. The array optical device K causes light having passed through the optical region D1 to enter the pixel P1 (shown in FIG. 21 and so on) of the imaging device N and light having passed through the optical region D2 to enter the pixel P2 of the imaging device N.

Figure 21A:
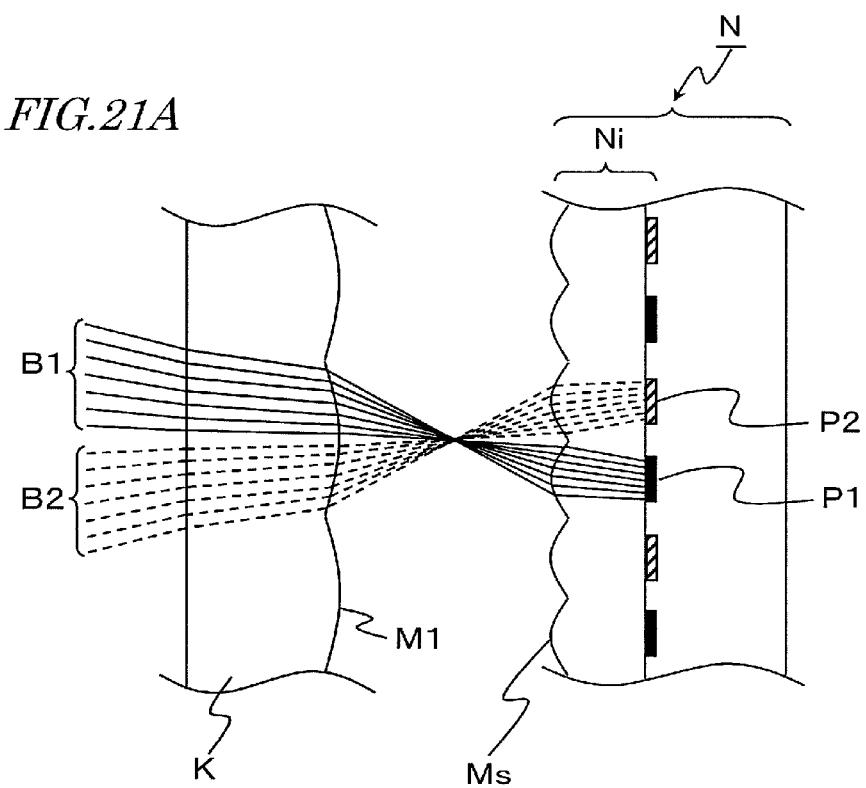
FIG. 21A is an enlarged diagram showing the array optical device K and imaging device N shown in FIG. 18.
Figure 21B:
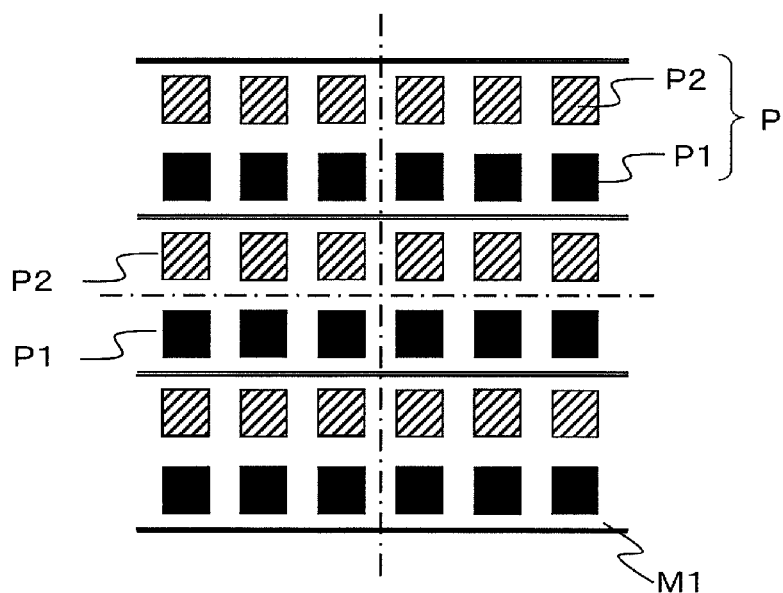
FIG. 21B is a diagram showing relative positioning between the array optical device K and pixels on the imaging device N.

FIG. 21A is an enlarged diagram showing the array optical device K and the imaging device N shown in FIG. 18, and FIG. 21B is a diagram showing relative positioning between the array optical device K and pixels on the imaging device N. The array optical device K is disposed so that the face on which the optical elements M1 are formed is oriented toward the imaging plane Ni. Pixels P are disposed in a matrix shape on the imaging plane Ni. The pixels P can be classified into pixels P1 and P2.

The pixels P1 are arranged in one row along the lateral direction (row direction). Along the vertical direction (column direction), pixels P1 are arranged in every other row. Moreover, the pixels P2 are arranged in one row along the lateral direction (row direction). Along the vertical direction (column direction), pixels P2 are arranged in every other row. Moreover, rows of pixels P1 and rows of pixels P2 alternate along the vertical direction (column direction).

The array optical device K is arranged so that one optical element M1 thereof corresponds to two rows of pixels, consisting of one row of pixels P1 and one row of pixels P2, on the imaging plane Ni. Microlenses Ms are provided on the imaging plane Ni so as to cover the surface of the pixels P1 and P2.

The array optical device K is designed so that: a large part of the light beam B1 having passed through the optical region D1 (shown in FIG. 18, FIG. 19) on the optical element L1 (the light beam B1 indicated by solid lines in FIG. 18) reaches the pixel P1 on the imaging plane Ni; and a large part of the light beam having passed through the optical region D2 (the light beam B2 indicated by broken lines in FIG. 18) reaches the pixel P2 on the imaging plane Ni. Specifically, the above construction is realized by appropriately setting parameters such as the refractive index of the array optical device K, the distance from the imaging plane Ni, and the radius of curvature of the surface of the optical elements M1.

The stop S is a region through which light beams of all angles of view will pass. Therefore, by inserting a surface having optical characteristics for controlling the focusing characteristic in the neighborhood of the stop S, it becomes possible to control the focusing characteristic of light beams of all angles of view alike. In other words, in the present embodiment, the optical element L1 may be provided in the neighborhood of the stop S. By disposing the optical regions D1 and D2 having optical characteristics which provide mutually different focusing characteristics in the neighborhood of the stop S, the light beam can be allowed to have a focusing characteristic that is in accordance with the number of divided regions.

In FIG. 18, the optical element L1 is provided at a position for allowing light having passed through the optical element L1 to be incident on the stop S directly (i.e., not via any other optical member). The optical element L1 may be provided on the imaging device N side of the stop S. In that case, the optical element L1 may be provided between the stop S and the lens L2, so that light having passed through the stop S is incident on the optical element L1 directly (i.e., not via any other optical member).

Moreover, the array optical device K has a function of branching out into outgoing directions depending on the incident angle of the ray. Therefore, the light beam can be branched out over the pixels on the imaging plane Ni so as to correspond to the optical regions D1 and D2 as divided near the stop S.

Figure 22:
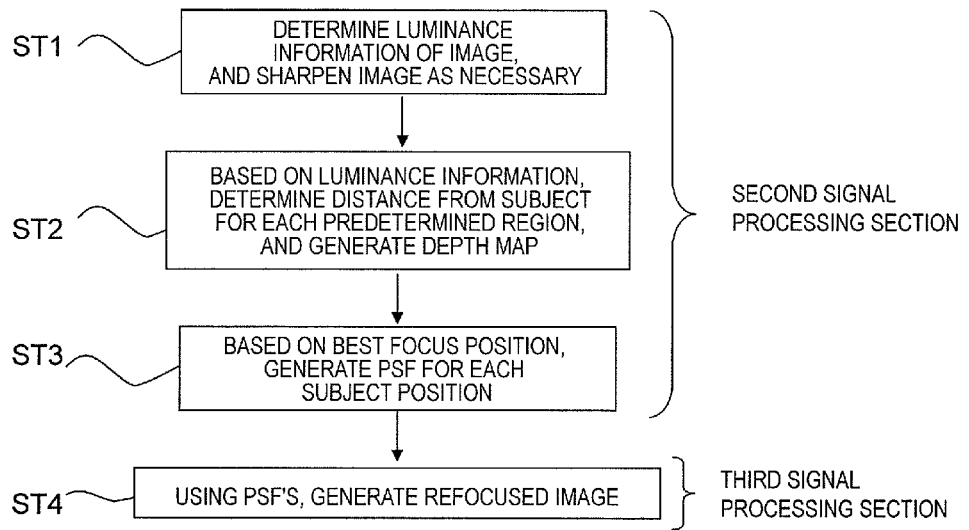
FIG. 22 is a flowchart for signal processing sections according to Embodiment 4 of the present invention.

FIG. 22 is a flowchart describing processing by the signal processing sections according to the present embodiment. A signal processing section has a function of generating a refocused image. As used herein, refocusing means, by using an image which is obtained with an imaging apparatus (captured image), reconstructing an image which is focused on a subject which is at a desired (arbitrary) subject distance. Note that a "subject distance" means the distance from the imaging apparatus to a subject. Through refocusing, in an image, the sharpness of a subject that is at a desired subject distance becomes higher than the sharpness of the surrounding region. A refocused image is an image in which the sharpness of a subject at a desired subject distance is higher than the sharpness of the surrounding region.

As shown in FIG. 22, at step ST1, first, luminance information of an image obtained from the imaging device N is acquired, and the image is sharpened as necessary. Herein, specific examples of "luminance information" are sharpness, contrast, and point spread distribution. As shown in FIG. 18, images to be obtained from the imaging device N may be either a first image I1 from the first pixel P1 or a second image I2 from the second pixel P2. In this step ST1, the luminance information of these two images I1 and I2 is acquired.

Next, at step ST2, by using the luminance information, a distance from the subject is calculated for each predetermined region in the image, thus generating a depth map.

Next, at step ST3, based on the position at which focus is desired (best focus position), PSF is generated for each subject position. The best focus position may be externally input by a user to the imaging apparatus A, or may be determined by the second signal processing section C2 in the imaging apparatus A.

Finally, at step ST4, the PSFs which are determined based on the depth map are convoluted into the sharpened image, thus generating a refocused image at the arbitrary position. For example, steps ST1 to ST3 are performed by the second signal processing section C2, whereas step ST4 is performed by the third signal processing section C3. Note that the image sharpening step of step ST1 and steps ST2 and ST3 may be reversed as necessary. Hereinafter, each item of the flowchart will be specifically described.

First, step ST1 will be described. Hereinafter, a case will be illustrated where the "luminance information" is sharpness.

In the optical system of the imaging apparatus A of FIG. 18, the optical region D1 has a planar surface, whereas the optical region D2 has an aspherical shape. For simplicity of description, it is assumed that the lens L2 is an ideal lens free of aberration.

Figure 23:
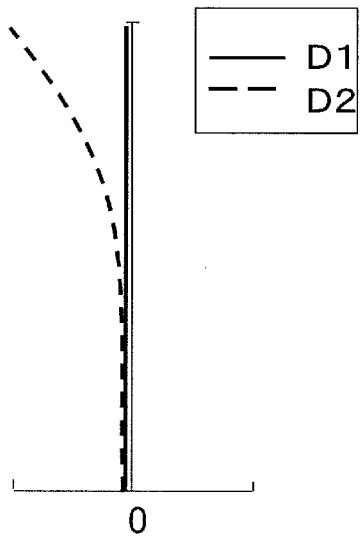
FIG. 23 is a graph showing a spherical aberration associated with rays passing through an optical region D1 and an optical region D2 in Embodiment 4 of the present invention.

Since the surface of the optical region D1 is a planar surface, rays having passed through the optical region D1 and the lens L2 have no spherical aberration, as indicated by a solid line in FIG. 23. When there is no spherical aberration, the point spread distribution varies with an increase in shift from the focal point. In other words, the point spread distribution varies with changing subject distance.

Moreover, due to the aspherical shape of the optical region D2, there is spherical aberration associated with rays having passed through the optical region D2 and the lens L2 as shown by the graph indicated by a broken line in FIG. 23. Such spherical aberration can be imparted by adjusting the aspherical shape of the optical region D2. With such spherical aberration, in a predetermined range near the focal point of the lens optical system L, the point spread distribution associated with rays having passed through the optical region D2 can be kept substantially constant. In other words, the point spread distribution can be kept substantially constant within the predetermined subject distance range.

Figure 24:
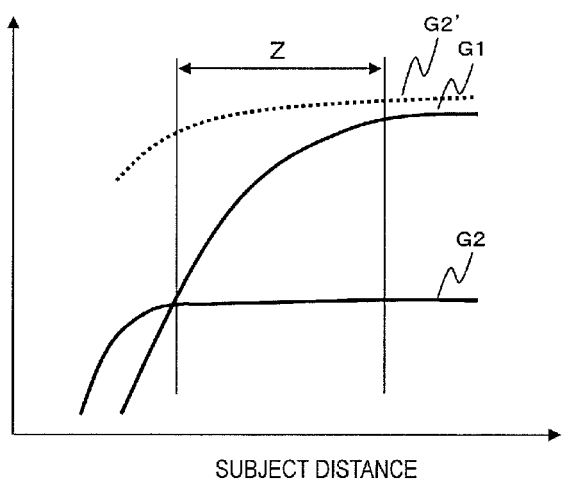
FIG. 24 is a graph showing a relationship between subject distance and sharpness (how sharp an image is) according to Embodiment 4 of the present invention.

Sharpness also changes with changes in point spread distribution. Since the image sharpness increases as the point image decreases in size, a graph indication of the relationship between subject distance and sharpness will result in a relationship as shown in FIG. 24. In the graph of FIG. 24, G1 represents the sharpness in a predetermined region of an image obtained at the pixel P1 (first image I1), and G2 represents the sharpness in a predetermined region of an image obtained at the pixel P2 (second image I2).

Sharpness can be determined based on differences between the luminance values of adjacent pixels in an image block of a predetermined size. Alternatively, it may be determined based on a frequency spectrum obtained by applying Fourier transform to the luminance distribution of an image block of a predetermined size.

When determining a sharpness E in a block of a predetermined size based on differences between the luminance values of adjacent pixels, (math. 12) is used, for example.

$$E = \sum_i \sum_j \sqrt{(\Delta x_{i,j})^2 + (k \Delta y_{i,j})^2} \quad [\text{math. 12}]$$

In (math. 12), $\Delta x_{i,j}$ is a difference value between the luminance value of a pixel at coordinates (i,j) and the luminance value of a pixel at coordinates (i+1,j) within an image block of a predetermined size; $\Delta y_{i,j}$ is a difference value between the luminance value of a pixel at coordinates (i,j) and the luminance value of a pixel at coordinates (i,j+2) within the image block of the predetermined size; and k is a coefficient. The reason why the luminance value of $\Delta y_{i,j}$ in the y direction is calculated by using coordinate j and coordinate j+2 is that, in an image obtained at each of the pixels P1 and P2, luminance information along the vertical direction (y direction) is created for every other pixel. It is desirable that $\Delta y_{i,j}$ is multiplied by a predetermined coefficient (e.g., k=0.5).

In each of the first and second images I1 and I2, luminance information of the image in the y direction is missing for every other pixel. The luminance information of any missing pixel may be interpolated from the luminance information of an adjacent pixel along the y direction. For example, if the luminance information at coordinates (i,j+1) is missing from the image, coordinates (i,j+1) may be interpolated by taking an average of the luminance information of coordinates (i,j) and coordinates (i,j+2). When determining the sharpness E of coordinates (i,j+1) with (math. 1), it may be assumed that k=1, and $\Delta y_{i,j}$ will be a difference value between the luminance value of a pixel at coordinates (i,j) and the luminance value of a pixel at coordinates (i,j+1) (a value interpolated from the luminance information of coordinates (i,j+2)) within an image block of a predetermined size. From the calculation of (math. 2), the greater the difference between luminance values in the image block of the predetermined size is, the greater sharpness is obtained.

Although image sharpness can be determined by using (math. 12) mentioned above, it may also be determined based on a frequency spectrum obtained by applying Fourier transform to the sharpness within the block of the predetermined size.

Figure 25:
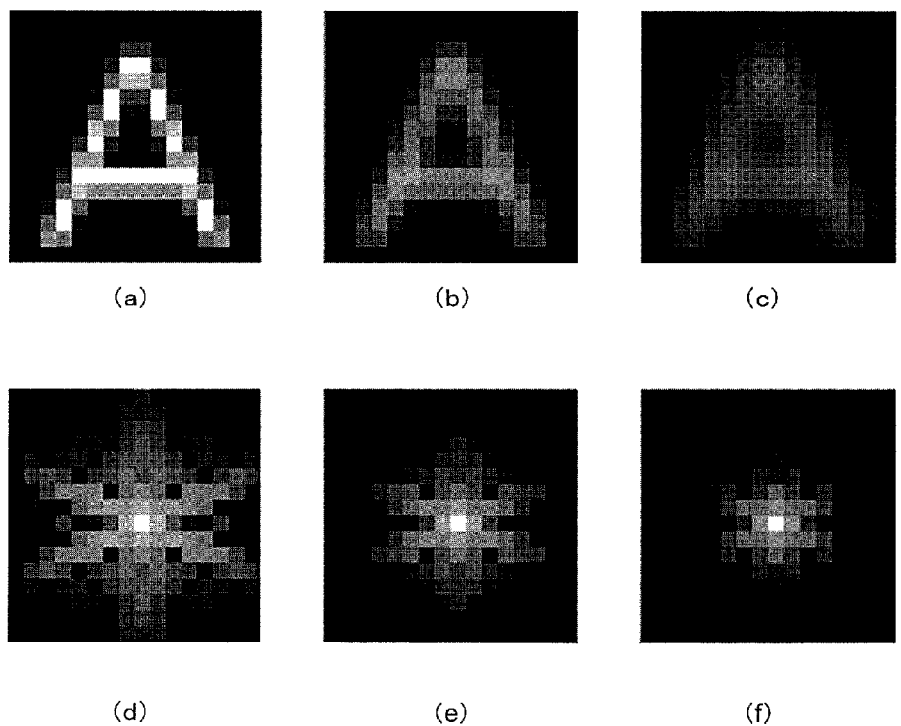
FIG. 25($a$) to FIG. 25($c$) each show a luminance distribution in an image block sized 16×16.

FIGS. 25(a) to (c) each show a luminance distribution in an image block sized 16×16. Sharpness decreases in the order of FIGS. 25(a), (b), (c). FIGS. 25(d) to (f) show frequency spectrums obtained by applying a two-dimensional Fourier transform to the respective image blocks shown in FIGS. 25(a) to (c). In FIGS. 25(d) to (f), for ease of understanding, the intensity of each frequency spectrum is indicated through logarithmic transformation, such that the more intense the frequency spectrum is, the brighter it appears. In each frequency spectrum, the place of highest luminance in the center is a DC component, and increasingly higher frequencies exist closer to the peripheral portion.

In FIGS. 25(d) to (f), it can be seen that the higher frequency spectrum is lost as the image sharpness decreases. Therefore, in order to determine sharpness from any such frequency spectrum, the entire frequency spectrum or a portion thereof may be extracted, for example.

Figure 26A:
FIG. 26A is a diagram showing a subject, which is a chart of white and black.
Figure 26B:
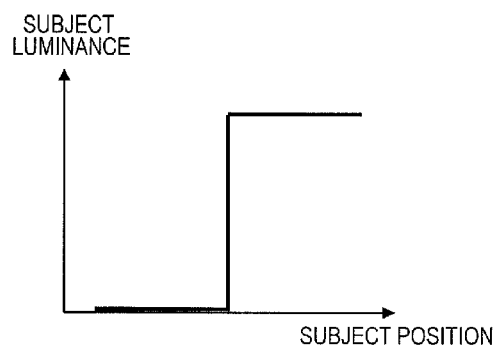
FIG. 26B is a diagram showing a cross section in the luminance of the subject of FIG. 26A.
Figure 26C:
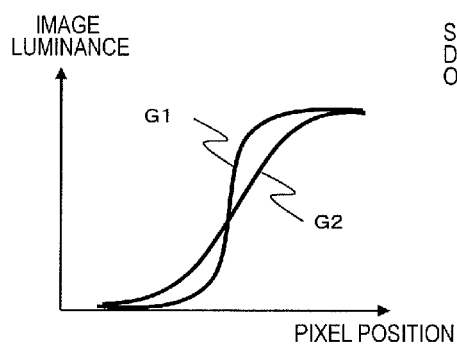
FIG. 26C is a diagram showing a cross section in the luminance of an image which is captured by the imaging apparatus A of FIG. 1.

FIGS. 26A to 26E is a diagram describing a method of enhancing the sharpness of G2 based on the sharpness of G1. FIG. 26A shows a subject, which is a white-black chart, and FIG. 26B is a diagram showing a cross section in the luminance of the subject of FIG. 26A. As shown in FIG. 26B, the luminance of the chart has a step-like cross section; however, the image will have a luminance cross section as shown in FIG. 26C when taken by placing the chart at a predetermined position that is shifted slightly frontward from the subject position at which the rays reaching the pixel P1 are best focused, for example. In the graph of FIG. 26C, G1 is a luminance cross section of an image which is generated at the pixel P1, whereas G2 is a luminance cross section of an image which is generated at the pixel P2. Thus, the luminance cross section of G1 is closer to the luminance cross section of the actual chart in FIG. 26B than is the luminance cross section of G2, therefore having a higher sharpness.

Figure 26D:
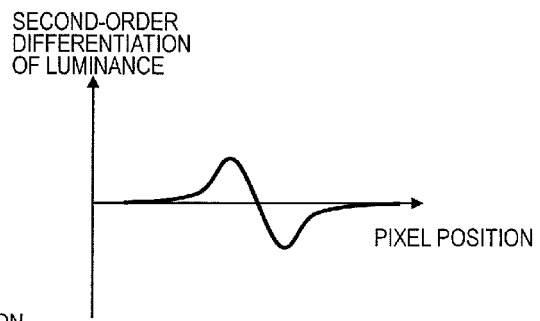
FIG. 26D is a diagram showing second-order differentiation of the G1 luminance in FIG. 26C.
Figure 26E:
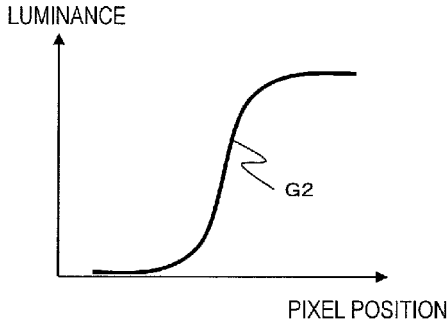
FIG. 26E is a diagram showing a cross section in the luminance when the second-order differentiation of FIG. 26D is subtracted from the G2 luminance in FIG. 26C.

When the luminance cross section of G1 with a high sharpness is subjected to a second-order differentiation, the distribution of FIG. 26D is obtained, and the edge of the G1 image can be detected. Next, by subtracting the distribution of FIG. 26D from the G2 luminance distribution of FIG. 26C, the distribution of FIG. 26E is obtained, whereby the G2 luminance distribution has been sharpened. Now, when subtracting the distribution of FIG. 26D, the distribution of FIG. 26D may be multiplied by a predetermined coefficient, which then may be subtracted from the G2 luminance distribution of FIG. 26C, thus controlling the degree of sharpening G2.

Although the present embodiment illustrates the image sharpening in one-dimensional terms for simplicity of description, an image is two-dimensional and therefore a two-dimensional sharpening process is actually to take place.

Through the above image processing, the sharpness of G2 which is indicated by a solid line in FIG. 24 can be sharpened as in G2' which is indicated by a broken line, thus sharpening the resultant color image.

Figure 27:
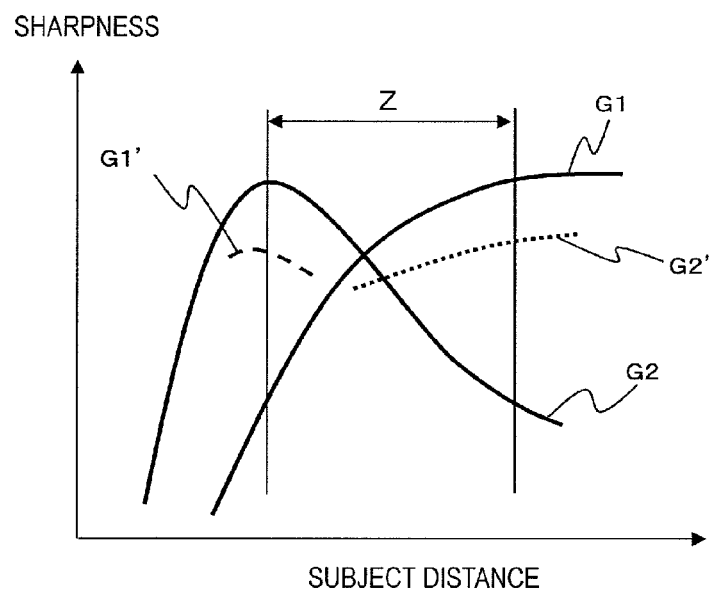
FIG. 27 is a graph showing a relationship between subject distance and sharpness (how sharp an image is) according to Embodiment 4 of the present invention.

FIG. 27 is a graph showing the relationship between subject distance and sharpness in the case where the surface in the optical region D2 is changed from an aspherical shape to a spherical shape in FIG. 18. In this case, too, the image can be sharpened similarly to FIG. 24.

In the present embodiment, as shown in FIG. 27, different components have a high sharpness depending on the subject distance. Therefore, respective sharpnesses are detected from the luminance cross sections of G1 and G2, and the component with the higher sharpness is selected to sharpen any other component.

Through the above image processing, the sharpnesses of G1 and G2 which are indicated by solid lines in FIG. 27 can be respectively sharpened as in G1' and G2' which are indicated by broken lines, thus sharpening the resultant color image.

Figure 28:
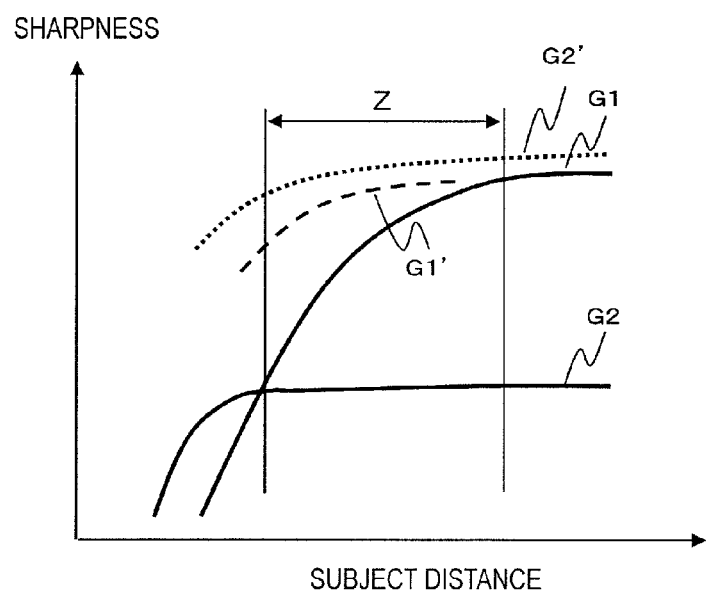
FIG. 28 is a graph showing a relationship between subject distance and sharpness (how sharp an image is) according to Embodiment 4 of the present invention.

Next, another image sharpening technique will be described. FIG. 28 is a diagram describing a method of enhancing the sharpness of G1 based on G2', which is a sharpness-enhanced version of G2. The construction of the optical regions D1 and D2 is the same as that in FIG. 24, and the point spread distribution created by rays having passed through the optical region D2 is kept substantially constant within a predetermined subject distance range. Therefore, the point spread distribution which is created by extracting the pixel P2 (G2 component) is substantially constant within a predetermined subject distance range. So long as the point spread distribution is substantially constant in the predetermined subject distance range, an image which is formed by extracting the pixel P2 (G2 component) is restorable based on a predetermined point spread distribution, regardless of the subject distance.

Hereinafter, a method of restoring a captured image based on a point spread distribution will be described. Assuming that the original image is f(x,y), and the point spread distribution is h(x,y), the captured image g(x,y) is expressed by (math. 13).

$$g(x,y)=f(x,y)\otimes h(x,y) \text{ (where } \otimes \text{ represents convolution)} \quad [\text{math. 13}]$$

A Fourier transform applied to both sides of (math. 13) gives (math. 3).

$$G(u,v)=F(u,v)H(u,v) \quad [\text{math. 3}]$$

Now, by applying an inverse filter Hinv(u,v) of (math. 14) to the deteriorated image G(u,v), a two-dimensional Fourier transform F(u,v) of the original image is obtained as in (math. 15). By applying an inverse Fourier transform to this, the original image f(x,y) can be obtained as a restored image.

$$Hinv(u,v) = \frac{1}{H(u,v)} \quad [\text{math. 14}]$$

$$F(u,v) = Hinv(u,v)G(u,v) \quad [\text{math. 15}]$$

However, if H(u,v) is 0 or has a very small value, Hinv(u,v) will diverge; therefore, a Wiener filter Hw(u,v) as indicated by (math. 16) is used for restoration from the deteriorated image.

$$Hw(u,v) = \frac{1}{H(u,v)} \frac{|H(u,v)|^2}{|H(u,v)|^2 + |N(u,v)|^2/|F(u,v)|^2} \quad [\text{math. 16}]$$

In (math. 16), N(u,v) is noise. Since usually the noise and the original image F(u,v) are unknown, a constant k is actually used to restore the deteriorated image with a filter of (math. 17).

$$Hw(u,v) = \frac{1}{H(u,v)} \frac{|H(u,v)|^2}{|H(u,v)|^2 + k} \quad [\text{math. 17}]$$

With such a restoration filter, the sharpness of G2 which is indicated by a solid line in FIG. 28 can be sharpened as in G2' which is indicated by a dotted line. Furthermore, in a manner similar to the method shown in FIG. 26, the G2' luminance cross section may be subjected to second-order differentiation, and this may be subtracted from G1, whereby the sharpness of G1 is enhanced to result in the sharpened G1' which is indicated by a broken line in FIG. 28.

Through the above image processing, the sharpness of G2 and the sharpness of G1 which are indicated by solid lines in FIG. 28 can be respectively sharpened as in G2' indicated by a dotted line and G1' indicated by a broken line. Through such a sharpening process, the depth of field can be expanded from the sharpening process described in FIG. 24.

Next, the depth map generation at step ST2 in FIG. 22 will be specifically described. The depth map is generated by determining a subject distance for each predetermined region (each calculation block) in a captured image.

To the second signal processing section C2 shown in FIG. 18, the first image I1 (shown in FIG. 18) obtained by extracting the pixel P1 (G1 component) and the second image obtained by extracting the pixel P2 (G2 component) are input. Since the two optical regions D1 and D2 have mutually different optical characteristics, the image sharpnesses (values calculated by using luminance) of the first and second images I1 and I2 vary depending on the subject distance. In the storage section Me (shown in FIG. 18), a correlation between sharpness and subject distance of light having passed through each of the optical regions D1 and D2 is stored. In the third signal processing section C3 (shown in FIG. 18), the distance from the subject can be determined based on the sharpnesses of the first and second images I1 and I2 and the aforementioned correlations.

Herein, the range Z in FIG. 24 and FIG. 28 represents a region in which G1 changes but in which G2 hardly changes. In the range Z, the subject distance can be determined by utilizing this relationship. For example, in the range Z, since there is a correlation between the subject distance and the ratio between the sharpnesses G1 and G2, the correlation between the subject distance and the ratio between the sharpnesses G1 and G2 is stored in the storage section Me in advance.

When the imaging apparatus is used, within the data (captured image) which is obtained through a single instance of imaging, a ratio in sharpness between the first image I1 which is generated from the pixel P1 (G1 component) alone and the second image I2 which is generated from the pixel P2 (G2 component) alone is determined for each calculation block. Then, by using the correlations stored in the storage section Me, the subject distance can be determined. Specifically, for each calculation block, the sharpness ratio in the aforementioned correlation and the sharpness ratio values of the first image I1 and the second image I2. Then, a subject distance that corresponds to a matching value between the two is regarded as the distance from the subject at shooting.

In order to univocally determine the subject distance from the ratio between the sharpness of the first image I1 generated from the pixel P1 alone and the sharpness of the second image I2 generated from the pixel P2 alone, it is necessary that the sharpness ratio always varies throughout a predetermined subject distance range.

In FIG. 24, FIG. 27, and FIG. 28, the sharpness ratio always varies throughout the range Z, and thus the subject distance can be univocally determined. Moreover, since the sharpness values being too low would make it impossible to determine a ratio, the sharpness values may be equal to or greater than a certain value.

Note that the relationship between subject distance and sharpness is determined from the radii of curvature, aspheric coefficients, and refractive indices of the optical regions D1 and D2. In other words, the optical regions D1 and D2 need to have optical characteristics such that the ratio between the sharpness of the first image I1 and the sharpness of the second image I2 always varies throughout the predetermined distance range.

In the present embodiment, the subject distance may be determined by using any value other than sharpness, e.g., contrast, so long as it is a value that is calculated by using luminance (luminance information). Contrast can be determined from a ratio between the highest luminance value and the lowest luminance value within a predetermined calculation block, for example. Sharpness is a difference between luminance values, whereas contrast is a ratio between luminance values. A contrast may be determined from a ratio between a point of the highest luminance value and a point of the lowest luminance value, or a contrast may be determined from a ratio between an average value of several points of the largest luminance values and an average value of several points of the lowest luminance values. In the case of using contrast to determine the subject distance, similarly to the case of sharpness, a correlation between the subject distance and the contrast ratio is stored in advance in the storage section Me. By determining a contrast ratio between the first image I1 and the second image I2 for each calculation block, it is possible to determine the subject distance by utilizing the correlation.

Moreover, in the present embodiment, the subject distance may be determined by using a value other than sharpness or contrast, e.g., point spread distribution. Hereinafter, a method of determining a point spread distribution from the first image I1 and the second image I2 will be described.

When the aforementioned (math. 17) is used to restore the second image I2 generated from the pixel P2 (G2 component) alone, a restored image $i2'(x,y)$ which is very close to the original image $f(x,y)$ is obtained. Now, assuming a first image $i1(x,y)$ which is generated from the pixel P1 (G1 component) alone, and a point spread distribution $h1(x,y)$ associated with rays passing through the region D1, it is possible to express $I1(x,y)$ by (math. 18).

$$i1(x,y) \approx i2'(x,y) \otimes h1(x,y) \text{ (where } \otimes \text{ represents convolution)} \quad [\text{math. 18}]$$

A Fourier transform applied to both sides of (math. 18) gives (math. 19).

$$I1(u,v) \approx I2'(u,v)H1(u,v) \quad [\text{math. 19}]$$

Through transformation of (math. 19), frequency domain values $H1(u,v)$ of the point spread distribution $h1(x,y)$ are obtained as in (math. 20).

$$H1(u, v) \approx \frac{I1(u, v)}{I2'(u, v)} \quad [\text{math. 20}]$$

By applying an inverse Fourier transform to this, a point spread distribution $h1(x,y)$ associated with rays passing through the region D1 can be obtained.

Since the point spread distribution $h1(x,y)$ associated with rays passing through the region D1 varies with subject distance, the point spread distribution $h1(x,y)$ and the subject distance have a correlation. This correlation can be utilized to determine the subject distance.

In the case of using a representative value to express a point spread distribution, the diameter of the point spread distribution can be used, for example. Similarly to the case of sharpness or contrast, a correlation between subject distance and point image diameter is stored in advance in the storage section Me. By determining a point spread distribution from the first image I1 or the second image I2 for each block, and determining the diameter of the point image from the point spread distribution, the subject distance can be determined through correlation. The diameter of a point image can be determined from the half-width of the point spread distribution, for example.

The present embodiment may be constructed so as to generate an image obtained through addition of the first image I1 and the second image I2 in the case where the radii of curvature of the respective regions are made different from each other as shown in FIG. 27. The distance range in which sharpness attains a certain value or greater in the image generated through addition of the first image I1 and the second image I2 is larger than those of the first image and the second image. In this case, the ratio between the sharpness of the image generated through addition and the sharpness of either the first image I1 or the second image I2 has a correlation with subject distance. By storing this correlation in advance, it is possible to determine a subject distance for each predetermined region of an image.

By calculating a subject distance(s) in a captured image, and expressing the subject distance(s) in a monochromatic luminance value(s) (e.g., 256 gray scale levels), an image representing the depth information is obtained; this is the depth map. FIG. 29(a) is a subject image (captured image)

according to the present embodiment, whereas FIG. 29(*b*) is a depth map of the subject image of FIG. 29(*a*). This is a representation in 256 gray scale levels, where the whiter the more frontward, and the blacker the more rearward the subject exists. In FIG. 29(*b*), the completely black portions in the check pattern are places of error in distance measurement. In a subject image, in any place with a broadly uniform luminance value, no change in sharpness occurs near its center, thereby making distance measurement impossible. However, refocused image generation is not affected by any place where distance measurement is impossible because, near the center of a range having a broadly uniform luminance value, the image sharpness would not change irrespective of whether a refocus calculation is applied or not. It is not necessary that the depth map is in 256 gray scale levels; it may be a 16-bit (i.e. 65536 gray scale levels) image; it does not even need to be image data, but may be numerical data based on distance. It may also contain negative values so long as relative positioning of subjects can be indicated.

Next, the PSF generation at step ST3 in FIG. 22 will be specifically described. PSF is generated for each subject position (subject distance), for example. Furthermore, a PSF may be generated for each angle of view (pixel or predetermined region).

It may do well to express the PSF shape by a mathematical expression, e.g., a Gaussian distribution (Gaussian function) as indicated by (math. 21), because it is possible to obtain a PSF at any arbitrary subject position on the fly, through simple calculation according to the mathematical expression; this way, there is no need to store enormous subject PSF data in a memory in advance.

$$\text{Weight}(i, j) = \exp\left(-\frac{i^2 + j^2}{2\sigma^2}\right)$$
$$\sigma = k \cdot d + 0.001$$

[math. 21]

Herein, i is a lateral coordinate in the PSF; j is a vertical coordinate in the PSF; and (i,j)=(0,0) represents the center of the PSF. Weight(i,j) is the intensity (weight) of the PSF at i,j; and d is the subject distance, such that the best focus position is expressed as the origin (d=0). As used herein, the "best focus position" refers to a subject position (subject distance) at which intensity change in the PSF takes a local maximum. If the "intensity change in the PSF" is large, the PSF has a sharp peak, e.g., the peak has a small half-width. If the "intensity change in the PSF" is small, the PSF has a gentle peak; e.g., the peak may have a large half-width. Moreover, k is a coefficient for gain adjustment, which adjusts the intensity change in the PSF. The addition "0.001" to σ is a constant for preventing divergence when (i,j)=(0,0), which has been selected to be a sufficiently small value relative to k·d. This constant does not need to be "0.001", and may be changed as appropriate.

Figure 30:
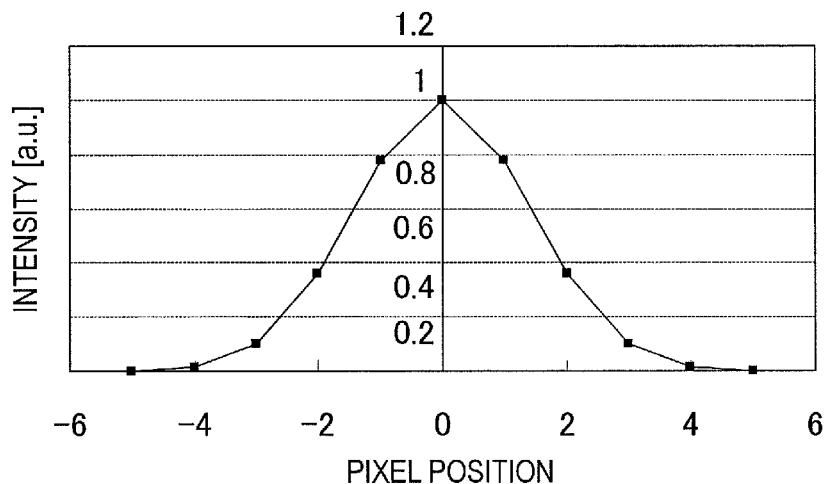
FIG. 30 is a distribution diagram of a PSF (point spread function) cross-sectional intensity, expressed as a Gaussian distribution, according to Embodiment 4 of the present invention.

FIG. 30 is a PSF cross-sectional intensity distribution as determined by the Gaussian distribution of (math. 21), where the plotting is made based on j=0, i=−5 to 5, σ=1.4. When i=0, j=0, the PSF has the highest intensity and has a distribution which is symmetric between right and left (rotation symmetric). Although it is not necessary that the intensity distribution of the PSF is rotation symmetric, rotational symmetry would be desirable in order to generate a non-biased natural refocused image.

Intensity change (how sharp it is) in the PSF is adjusted by k. It must be set so that the PSF is sharpest when the subject position is at the best focus position and becomes more gentle as the subject position becomes farther away from the best focus position. The particular subject position to become the best focus position can be arbitrarily set. The best focus position may be externally input by a user, or determined by the second signal processing section C2. In the case where the user determines the best focus position, the user may select a region in the image, and the second signal processing section C2 may determine the subject distance in the region that has been selected by the user and designate it as the best focus position. Alternatively, the user may directly choose the subject distance. Once the best focus position is determined, that subject position is defined as the origin.

Figure 31A:
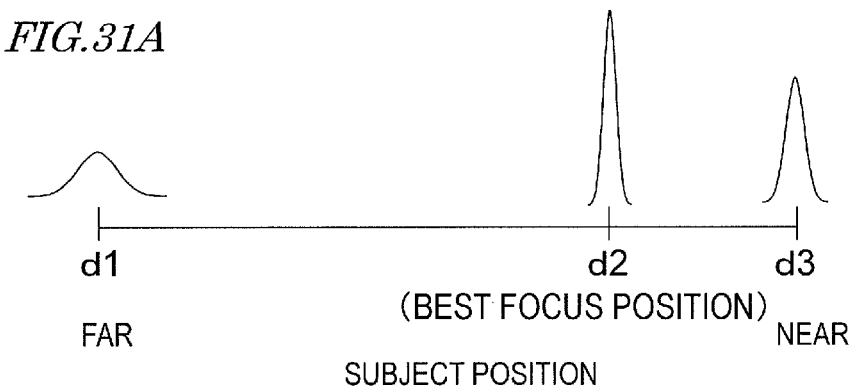
FIG. 31A and FIG. 31B are diagrams showing a relationship between subject positions and PSFs according to Embodiment 4 of the present invention.
Figure 31B:
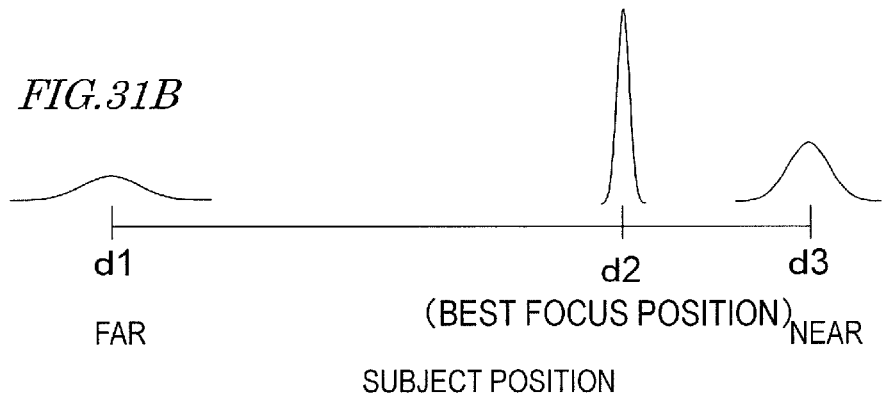

FIG. 31 is a conceptual diagram of changes in the PSF cross-sectional intensity distribution when focusing on the subject position d2. In FIG. 31A, the gradient of PSF intensity is gentler at a subject position d3, which is slightly distant from the subject position d2, than at the subject position d2. The gradient of PSF intensity is even gentler at a more distant subject position d1. By setting the origin of d (=0) at the best focus position in (math. 21), it is ensured that the absolute value of a increases as the subject position becomes more distant from the best focus position, thus allowing a more gentle gradient of PSF intensity to be set. Moreover, by increasing the k value in (math. 21), it is possible to adjust the degree of change in the intensity distribution of the PSF relative to subject position. FIG. 31B illustrates a case where the k value is increased from FIG. 31A. In FIG. 31B, the intensity distribution of the PSF changes more drastically with the subject position than in FIG. 31A; and, given the same subject position d1 (or d3), the intensity distribution of the PSF has a gentler gradient in FIG. 31B. The k value may be thus adjusted as appropriate, and changes in the blur of an image as described later may be adjusted. Although the σ equation in (math. 21) undergoes linear change against d, a non-linear function such as a quadric function or a polynomial may also be used, other than a linear function. Using a non-linear function makes it possible to non-linearly adjust intensity changes in the PSF against the subject position d, i.e., changes in blur.

Although FIGS. 31A and 31B shows one cross section of PSF intensity, a PSF is two-dimensional data also having expanse in the depth direction. For the actual calculation, a two-dimensional matrix of intensity as shown in FIG. 32 may well be used. With (i,j)=(0,0) being the origin, (math. 21) can be used for the calculation. It is desirable that the number of rows and the number of columns in the matrix are the same, both of which are desirably odd numbers, because this will allow one origin to be set in the center of the matrix, and provide a PSF which is rotation symmetric around that axis. Although the number of rows and the number of columns in the matrix may be arbitrary, the greater they are, the greater the amount of blur can be. On the other hand, as the number of rows and the number of columns in the matrix decrease, the calculation time can be reduced. In FIG. 32, (a) shows a 3×3 matrix, (b) shows a 5×5 matrix, and (c) shows a 7×7 matrix of two-dimensional distribution of PSF intensity. Similarly to FIG. 30, it is assumed that σ=1.4. The values in the matrix may well be normalized so that the matrix product equals 1. Specifically, after calculating values according to (math. 21), a product of all components in the matrix may be calculated, and each component may be divided by that product. The reason for performing normalization is to prevent change in luminance of the image after convolution in the subsequent refocus. By normalizing the intensity product of the PSF to 1, it becomes possible to maintain a constant image brightness in both the image before the refocusing and the image after the refocusing. Normalization of PSF data may be performed at the time of PSF calculation, or performed immediately before the refocusing process. For reference, FIG. 33A shows an image expression in 256 gray scale levels of numerical data of the PSF intensity distribution of the 7×7 matrix in FIG. 32(c). Likewise, FIG. 33B is a three-dimensional graph of FIG. 32(c).

Instead of using a mathematical expression, the actual PSF value pertaining to the optical system might be used for the PSF calculation; in this case, however, the need to previously calculate a PSF for each subject distance through simulation at every certain interval requires an enormous amount of memory for the database. On the other hand, by using a Gaussian distribution in the form of a mathematical expression, it becomes possible to generate a PSF at any arbitrary subject position at the time of refocus calculation, thus saving memory and reducing calculation time. Moreover, when expressed as a Gaussian distribution, the PSF when the subject position is at the best focus position will have 1 at the center and be surrounded by 0's, which means that the image at the best focus position will not be deteriorated. In other words, intensity change in the PSF at the best focus position is greater than the intensity change in the PSF at any other subject position, and intensity change in the PSF becomes smaller as the subject position becomes away from the best focus position along the subject distance direction.

Note that the mathematical expression representing a PSF may be an equation other than that of a Gaussian distribution. For example, it may be an equation of a non-spherical surface that contains higher orders.

Next, the refocused image generation at step ST4 of FIG. 22 will be described. This process is performed, using the subject distances determined at step ST2 and the PSFs generated at step ST3, by the third signal processing section C3. In correspondence with the depth map of FIG. 29(b), a PSF convolution process is performed for each pixel of the sharpened image. For example, if the subject position at a given pixel $(i,j)=(i_0,j_0)$ in the depth map is d1 in FIG. 31, a convolution calculation is performed by using the PSF at d1 for a matrix which is centered around the pixel $(i_0,j_0)$ of the sharpened image (=a matrix having the same numbers of rows and columns as in the PSF). This operation is performed for every pixel of the sharpened image. This process provides a refocused image with internal variety such that focus is placed only on a desired place(s) while leaving anything else blurred, as opposed to the sharpened image, which has little image blur at any and all subject positions.

FIG. 34 is an image obtained by refocusing the subject image of FIG. 29(a) based on the depth map of FIG. 29(b). Processing was performed by assuming that: the best focus position (corresponding to d2 in FIG. 31) is the oranges in the front; the PSF matrix has 15×15 regions; k=1. It can be seen that the image of FIG. 29(a) is uniformly focused, whereas the refocused image of FIG. 34 has a frontward focus, the remaining background becoming more blurred as it gets farther away. Note that, in FIG. 29(b), any place of distance measurement detection error may be exempted from the refocusing process through an exception handling. Alternatively, they may be subjected to refocusing by using a value at an arbitrary subject distance because, since those are regions with a constant luminance value, sharpness will not change irrespective of whether refocusing is applied or not.

In the present embodiment, within step ST1, only the process of determining image sharpness (luminance information) may be performed, while omitting the image sharpening process. In this case, the image (captured image) which has been acquired from the sensors (photodiodes) may directly be subjected to a refocusing process. Herein, the image acquired from the sensors may be the first or second image I1 or I2 shown in FIG. 18, or an image that contains images from the first and second pixels P1 and P2. In the case of omitting the sharpening process, it is preferable to use the G1 image (first image I1) having the higher sharpness in FIG. 28. Such a process is especially effective in the case where blurred portions are supposed to become even more blurred for further emphasis.

Moreover, only specific regions of the image may be subjected to a refocusing process. The calculation time can be reduced by processing only the portions where blur is desired.

Without necessarily using a PSF, for example, regions where blur is desired may be exclusively subjected to a spatial filter process, e.g., an averaging filter, thus creating blur. Moreover, region where sharpening is desired may be exclusively subjected to a spatial filter process, e.g., a sharpening filter, thus sharpening the subject image of interest. In these cases, without performing step ST3 of the flowchart shown in FIG. 22, regions where blur is desired (or regions where sharpening is desired) may be determined based on the depth map at step ST4, and a spatial filter process may be performed.

Now, an exemplary method of refocused image generation in the case where the sharpening process of step ST1 in FIG. 22 is omitted will be described.

At step ST1, after obtaining luminance information of the image, a predetermined region with the highest sharpness (i.e., focused) is detected. Then, based on the depth map generated at step ST2, a blurring process is performed for every predetermined region, in accordance with the distance from a subject that has been detected as the region with the highest sharpness. For example, a blurring process may be performed so that more blur is applied to regions which are located at farther (rather than closer) distance from the subject that has been detected as the region with the highest sharpness. As a result, places which are not focused and thus are blurred can be made more blurred for emphasis. Moreover, the region which has been detected as the region with the highest sharpness may be sharpened by using a restoration filter or a spatial filter. As a result, the sharp region and the blurred regions within a captured image can be more emphasized. Note that, when sharpening is performed by using a restoration filter in this method, the PSF (point spread distribution) used may be retained in the form of a mathematical function, or what is determined in advance for each subject distance from the characteristics of the optical system may be retained for use. More desirably, PSFs for different angles of view may be retained for use, in order to realize sharpening with a higher precision.

Moreover, convolution at the end portions of an image may be separately handled by a branched calculation process because of there being scarce pixels in the original image. For example, a part of a PSF may be used so as to be adapted to a partial vignetting at the image end portions.

As the PSF convolution calculation process, Fourier transform may be used. For example, DFT (Discrete Fourier Transform) or FFT (Fast Fourier Transform) may be used, whereby the calculation time can be reduced. This is especially effective when there is a broad region (predetermined region) in which the subject distance remains constant, where the region with the constant subject distance is to be regarded as one block in the calculation. For example, a matrix of PSFs matching the block size of the image for calculation may be generated, and each may be subjected to a Fourier transform so that a calculation may be performed in the frequency space. Once subjected to a Fourier transform, a convolution calculation requires much less calculation because, in the frequency space, calculation can be achieved via multiplication between respective components. After obtaining a multiplication product in the frequency space, it may be subjected to an inverse Fourier transform, whereby an image similar to what would be obtained through a convolution calculation can be obtained.

Note that the optical system of the imaging apparatus of the present embodiment may be an image-side telecentric optical system. As a result, even if the angle of view changes, incidence occurs with the principal-ray incident angle of the array optical device K having a value close to 0 degrees, so that the crosstalk between light beams reaching the pixels P1 and P2 can be reduced across the entire imaging region.

Although the present embodiment has illustrated the lens L2 to be an ideal lens for simplicity of description as mentioned above, it is not necessary to employ an ideal lens.

Although the optical element L1 and the lens L2 are separate in the present embodiment, another possible construction is where the lens L2 has the optical regions D1 and D2, with the optical element L1 being eliminated. In this case, the stop S may be disposed near the optical regions D1 and D2 of the lens L2.

Thus, according to the present embodiment, through (e.g. a single instance of) imaging using a single imaging system, both an image and the subject distance can be obtained. Since a subject distance can be calculated for each calculation block, it is possible to acquire the subject distance at any arbitrary position in the image. Therefore, it is also possible to acquire a depth map across the entire image. Thus, after the capturing has been done, it is possible to focus on every subject in the image.

Moreover, the distance from the subject can be obtained with a single imaging system, which is unlike in an imaging apparatus having a plurality of imaging optical systems, where it would be necessary to ensure matching characteristics and positions between the plurality of imaging optical systems. Moreover, when a motion video is shot by using the imaging apparatus of the present embodiment, an accurate distance from the subject can be measured even if the subject position changes with lapse of time.

Embodiment 5

This Embodiment 5 differs from Embodiment 4 in that a plurality of best focus positions are provided discretely. In the present embodiment, any detailed description directed to similar subject matter to Embodiment 4 will be omitted.

Figure 35:
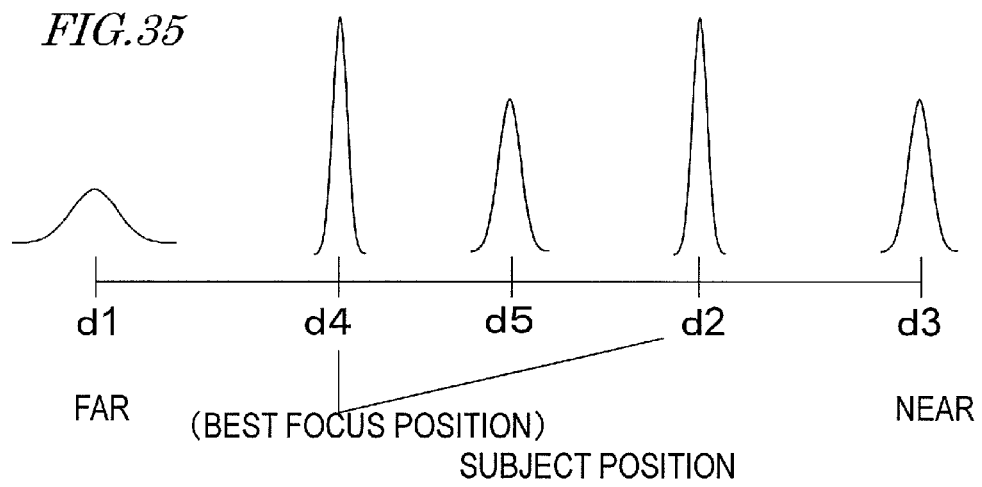
FIG. 35 is a diagram showing a relationship between subject positions and PSFs according to Embodiment 5 of the present invention.

In the present embodiment, as shown in FIG. 35, best focus position are set at two places or an arbitrary plural number of places. In addition to the position d2, the position d4 is also a best focus position. Although the position d5 is in between the position d2 and the position d4, its intensity distribution of the PSF is gentler than those of the positions d2 and d4. To provide "a plurality of best focus positions discretely" means that there exist a plurality of points at which intensity change in the PSF takes a local maximum (best focus positions), such that intensity change in any PSF between the plurality of best focus positions is smaller than the intensity change at the best focus positions. Note that the size of intensity change in the PSF may be different between the plurality of best focuses.

In order to set best focus positions at two places, a may be expressed in a quartic function in (math. 21). It is not necessary to employ a quartic function; any higher order, or an exponential or logarithmic expression may be used. By using the method shown in FIG. 35, in an image in which two people, i.e., one person in the close neighborhood and one person in the distance, are captured, it becomes possible to focus on both of the person in the close neighborhood and the person in the distance, while blurring any other background. This is a technique which cannot be achieved with conventional optical systems. For example, even with a blur effect that is attained by a single-lens reflex camera having a very small Fno, it is only possible to achieve focus at one subject position in the close neighborhood, in the distance, or somewhere in between. Without being limited to two arbitrary places, objects at any larger plural number of places may be chosen for best focus, while blurring anything else.

Embodiment 6

This Embodiment 6 differs from Embodiment 4 in that filters having spectral transmittance characteristics are provided on the pixels. In the present embodiment, any description directed to similar subject matter to Embodiment 4 will be omitted.

Figure 36:
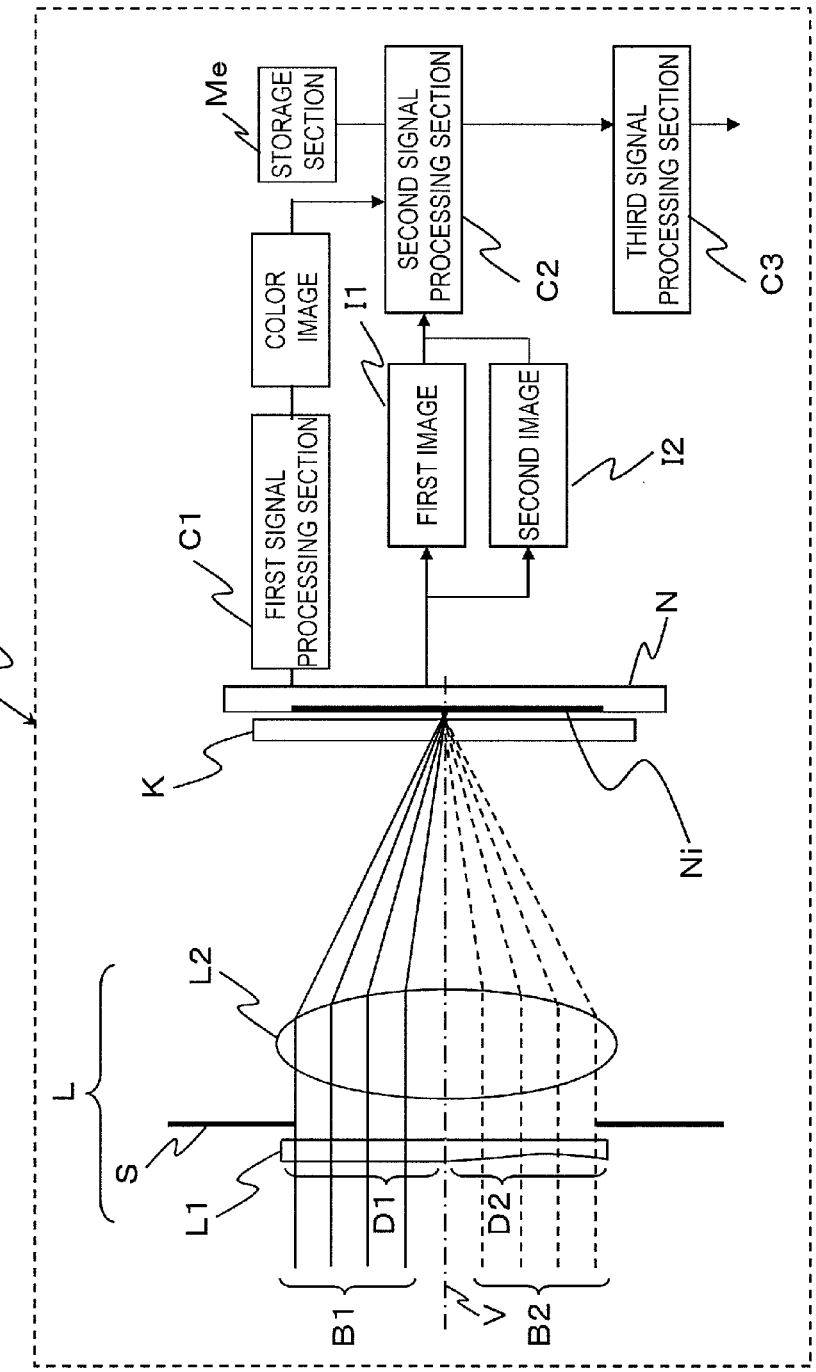
FIG. 36 is a schematic diagram showing Embodiment 6 of an imaging apparatus A according to the present invention.

FIG. 36 is a schematic diagram showing an imaging apparatus A according to Embodiment 6. The imaging apparatus A of the present embodiment includes: a lens optical system L having an optical axis V; an array optical device K disposed near the focal point of the lens optical system L; an imaging device N; a second signal processing section C2; a third signal processing section C3; a first signal processing section C1; and a storage section Me.

Figure 37A:
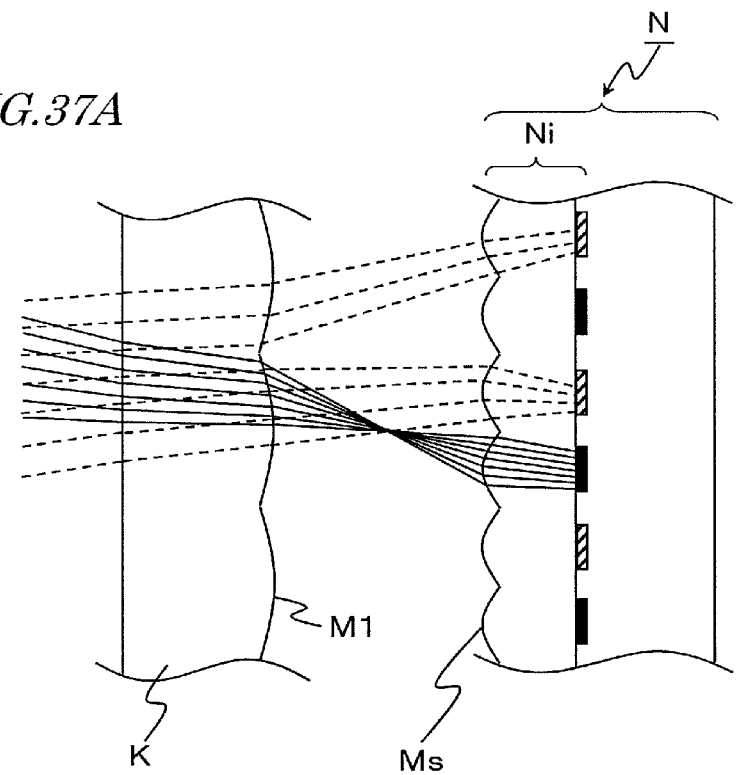
FIG. 37A is an enlarged diagram showing the array optical device K and imaging device N shown in FIG. 36.
Figure 37B:
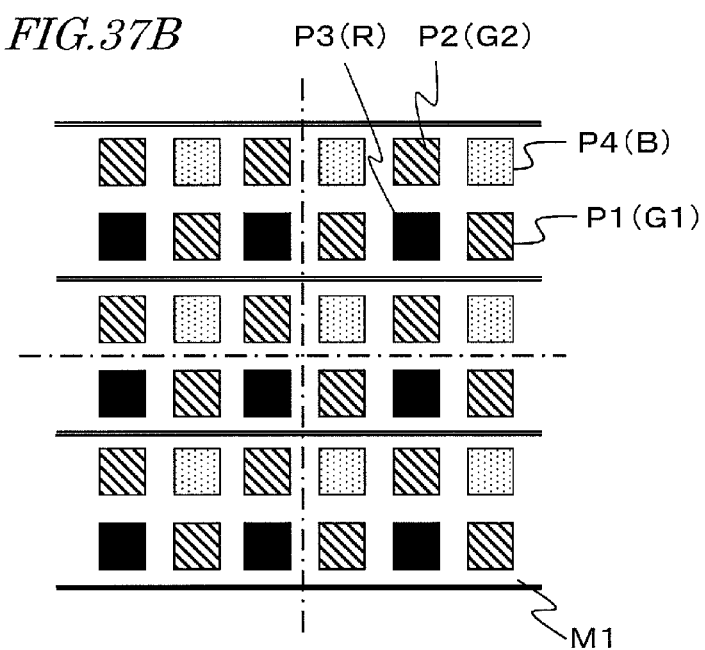
FIG. 37B is a diagram showing relative positioning between the array optical device K and pixels on the imaging device N.

FIG. 37A is an enlarged diagram showing the array optical device K and the imaging device N shown in FIG. 36, and FIG. 37B is a diagram showing relative positioning between the array optical device K and pixels on the imaging device N. The array optical device K is disposed so that the face on which the optical elements M1 are formed is oriented toward the imaging plane Ni. Pixels P are disposed in a matrix shape on the imaging plane Ni. The pixels P can be classified into pixels P1, P2, P3, and P4.

Filters having first spectral transmittance characteristics are provided on the pixels P1 and P2, so as to mainly allow rays of the green band to pass through, while absorbing rays in any other band. A filter having second spectral transmittance characteristics is provided on the pixel P3, so as to mainly allow rays of the red band to pass through, while absorbing rays in any other band. A filter having third spectral transmittance characteristics is provided on the pixel P4, so as to mainly allow rays of the blue band to pass through, while absorbing rays in any other band.

Pixels P1 and pixels P3 alternate within the same row. Moreover, pixels P2 and pixels P4 alternate within the same row. Rows of pixels P1 and P3 and rows of pixels P2 and P4 alternate along the vertical direction (column direction). Thus, the plurality of pixels P1, P2, P3, and P4 compose a Bayer pattern. In the case where the pixels P1, P2, P3, and P4 are arranged in a Bayer pattern, the pixel P1 and the pixel P2 both having a filter transmitting light of the green band are disposed at oblique positions in the plane of the imaging plane Ni. The positions of the pixel P3 and the pixel P4 may be reversed.

The array optical device K is arranged so that one optical element M1 thereof corresponds to two rows of pixels, consisting of one row of pixels P1 and P3 and one row of pixels P2 and P4, on the imaging plane Ni. Microlenses Ms are provided on the imaging plane Ni so as to cover the surface of the pixels P1, P2, P3, and P4.

The array optical device K is designed so that: a large part of the light beam B1 having passed through the optical region D1 (shown in FIG. 36, FIG. 19) on the optical element L1 (the light beam B1 indicated by solid lines in FIG. 36) reaches the pixels P1 and P3 on the imaging plane Ni; and a large part the light beam having passed through the optical region D2 (the light beam B2 indicated by broken lines in FIG. 36) reaches the pixels P2 and P4 on the imaging plane Ni. Specifically, the above construction is realized by appropriately setting parameters such as the refractive index of the array optical device K, the distance from the imaging plane Ni, and the radius of curvature of the surface of the optical elements M1.

The stop S is a region through which light beams of all angles of view will pass. Therefore, by inserting a surface having optical characteristics for controlling the focusing characteristic in the neighborhood of the stop S, it becomes possible to control the focusing characteristic of light beams of all angles of view alike. In other words, in the present embodiment, the optical element L1 may be provided in the neighborhood of the stop S. By disposing the optical regions D1 and D2 having optical characteristics which provide mutually different focusing characteristics in the neighborhood of the stop S, the light beam can be allowed to have a focusing characteristic that is in accordance with the number of divided regions.

In FIG. 36, the optical element L1 is provided at a position for allowing light having passed through the optical element L1 to be incident on the stop S directly (i.e., not via any other optical member). The optical element L1 may be provided on the imaging device N side of the stop S. In that case, the optical element L1 may be provided between the stop S and the lens L2, so that light having passed through the stop S is incident on the optical element L1 directly (i.e., not via any other optical member).

Moreover, the array optical device K has a function of branching out into outgoing directions depending on the incident angle of the ray. Therefore, the light beam can be branched out over the pixels on the imaging plane Ni so as to correspond to the optical regions D1 and D2 as divided near the stop S.

The first signal processing section C1 (shown in FIG. 36) generates a color image by using luminance information from the plurality of pixels P1, P2, P3, and P4. Hereinafter, the specific method of color image generation will be described.

In the optical system of the imaging apparatus A of FIG. 36, the optical region D1 has a planar surface, whereas the optical region D2 has an aspherical shape. For simplicity of description, it is assumed that the lens L2 is an ideal lens free of aberration.

Since the surface of the optical region D1 is a planar surface, there is no spherical aberration associated with rays having passed through the optical region D1 and the lens L2, as indicated by a solid line in the graph of FIG. 23. When there is no spherical aberration, the point spread distribution varies with an increase in shift from the focal point. In other words, the point spread distribution varies with changing subject distance.

Moreover, due to the aspherical shape of the optical region D2, there is spherical aberration associated with rays having passed through the optical region D2 and the lens L2 as shown by the graph indicated by a broken line in FIG. 23. Such spherical aberration can be imparted by adjusting the aspherical shape of the optical region D2. With such spherical aberration, in a predetermined range near the focal point of the lens optical system L, the point spread distribution associated with rays having passed through the optical region D2 can be kept substantially constant. In other words, the point spread distribution can be kept substantially constant within the predetermined subject distance range.

Figure 38:
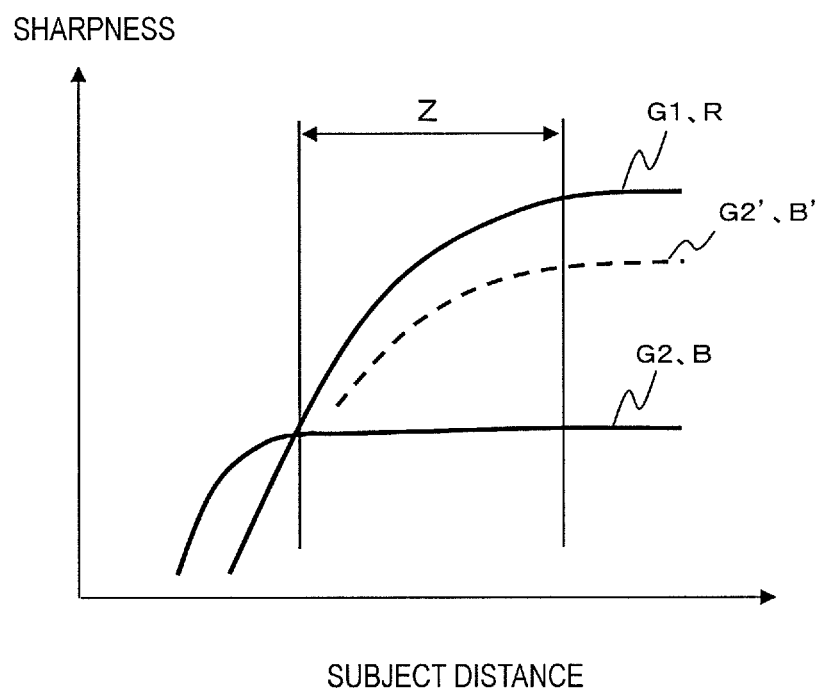
FIG. 38 is a graph showing a relationship between subject distance and sharpness (how sharp an image is) according to Embodiment 6 of the present invention.

Sharpness also changes with changes in point spread distribution. Since the image sharpness increases as the point image decreases in size, a graph indication of the relationship between subject distance and sharpness will result in a relationship as shown in FIG. 38. In the graph of FIG. 38, G1 and R respectively represent the sharpnesses in a predetermined region of images generated at the pixels P1 (green component) and P3 (red component), whereas G2 and B respectively represent the sharpnesses in a predetermined region of images generated at the pixels P2 (green component) and P4 (blue component).

Sharpness can be determined based on differences between the luminance values of adjacent pixels in an image block of a predetermined size. Alternatively, it may be determined based on a frequency spectrum obtained by applying Fourier transform to the luminance distribution of an image block of a predetermined size.

When determining a sharpness E in a block of a predetermined size for each component of the pixels P1, P2, P3, and P4 based on differences between the luminance values of adjacent pixels, (math. 22) is used, for example.

$$E = \sum_i \sum_j \sqrt{(\Delta x_{i,j})^2 + (\Delta y_{i,j})^2}$$ [math. 22]

Since the pixels P1, P2, P3, and P4 compose a Bayer pattern as mentioned earlier, the sharpness of each component is to be determined through a calculation by extracting pixel information from every other pixel along both the x direction and the y direction of the image.

In (math. 22), $\Delta x_{i,j}$ is a difference value between the luminance value of a pixel at coordinates (i,j) within an image block of a predetermined size and the luminance value of a pixel at coordinates (i+2,j); and $\Delta y_{i,j}$ is a difference value between the luminance value of a pixel at coordinates (i,j) and the luminance value of a pixel at coordinates (i,j+2), within the image block of the predetermined size.

From the calculation of (math. 22), the greater the difference between luminance values in the image block of the predetermined size is, the greater sharpness is obtained.

When generating a color image, the color image may be generated by simply interpolating the chromatic information that is lost for each pixel position on the basis of the luminance information of the pixels P1, P2, P3, and P4; however, the sharpnesses of G2 and B is smaller than the sharpnesses of G1 and R as shown in FIG. 38, and therefore the color image may be generated after enhancing the sharpnesses of G1 and R.

Figure 39A:
FIG. 39A is a diagram showing a subject, which is a chart of white and black.
Figure 39B:
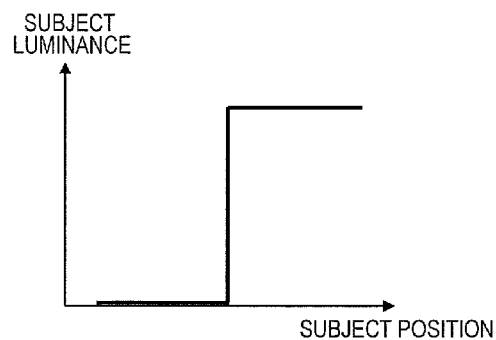
FIG. 39B is a diagram showing a cross section in the luminance of the subject of FIG. 39A.
Figure 39C:
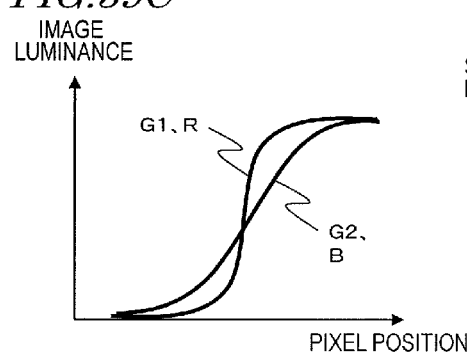
FIG. 39C is a diagram showing a cross section in the luminance of an image which is captured by the imaging apparatus A of FIG. 36 for each color.

FIGS. 39A to 39B is a diagram describing a method of enhancing the sharpnesses of G2 and B based on the sharpnesses of G1 and R. FIG. 39A shows a subject, which is a white-black chart, and FIG. 39B is a diagram showing a cross section in the luminance of the subject of FIG. 39A. As shown in FIG. 39B, the luminance of the chart has a step-like cross section; however, the image will have a luminance cross section as shown in FIG. 39C when taken by placing the chart at a predetermined position that is shifted slightly frontward from the subject position at which the rays reaching the pixels P1 and P3 are best focused, for example. In the graph of FIG. 39C, G1 and R are luminance cross sections of images generated at the pixels P1 (green component) and P3 (red component), respectively, whereas G2 and B are luminance cross sections of images generated at the pixels P2 (green component) and P4 (blue component), respectively. Thus, the luminance cross sections of G1 and R are closer to the luminance cross section of the actual chart in FIG. 39B than are the luminance cross sections of G2 and B, therefore having a higher sharpness.

Figure 39D:
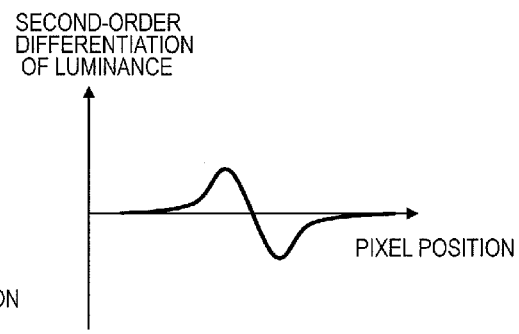
FIG. 39D is a diagram showing a second-order differentiation of the G1 (green) and R(red) luminance in FIG. 39C.
Figure 39E:
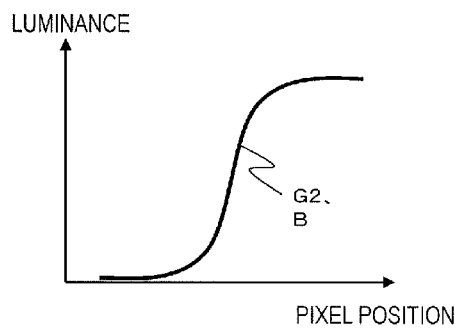
FIG. 39E is a diagram showing a cross section in the luminance of when the second-order differentiation of FIG. 39D is subtracted from the G2 (green) and B(blue) luminance in FIG. 39C.

When a white-black chart such as that shown in FIG. 39A is imaged, the luminance cross section of G1 and the luminance cross section of R will have substantially identical cross sections; in actuality, however, a subject image of every possible color component will be taken, and the luminance cross sections of G1 and R in FIG. 39C will not coincide in most cases. Therefore, the respective sharpnesses may be detected from the luminance cross sections of G1 and R, and a color component with a high sharpness may be selected to sharpen the luminance cross sections of G2 and B. When a luminance cross section with a high sharpness is selected, and its luminance cross section is subjected to second-order differentiation, the distribution of FIG. 39D is obtained, and the edge of an image of the color component with a high sharpness can be detected. Next, by subtracting the distribution of FIG. 39D from the respective G2 and B luminance distributions of FIG. 39C, the distribution of FIG. 39E, whereby the G2 and B luminance distributions have been sharpened. Now, when subtracting the distribution of FIG. 39D, the distribution of FIG. 39D may be multiplied by a predetermined coefficient, which then may be subtracted from the G2 and B luminance distributions of FIG. 39C, thus controlling the degree of sharpening G2 and B.

Although the present embodiment illustrates the image sharpening in one-dimensional terms for simplicity of description, an image is two-dimensional and therefore a two-dimensional sharpening process is actually to take place.

Through the above image processing, the sharpnesses of G2 and B which are indicated by a solid line in FIG. 38 can be sharpened as in G2' and B' which is indicated by a broken line, thus sharpening the resultant color image.

Figure 40:
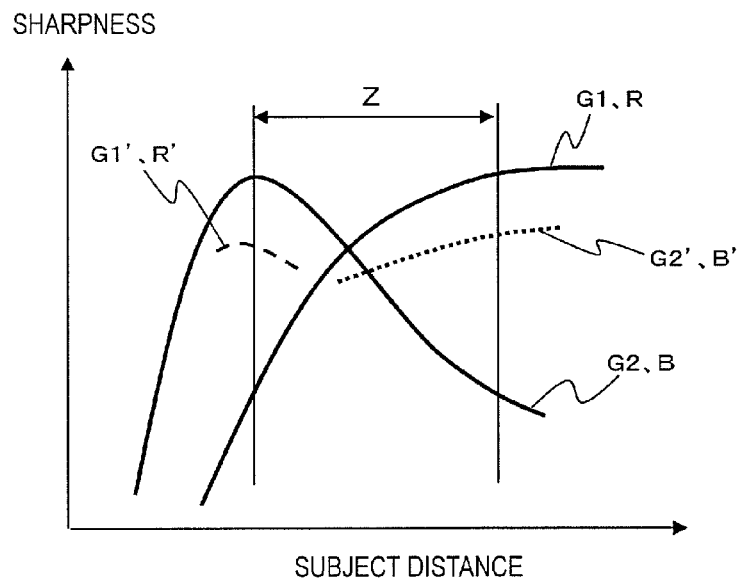
FIG. 40 is a graph showing a relationship between subject distance and sharpness (how sharp an image is) according to Embodiment 6 of the present invention.

FIG. 40 is a graph showing the relationship between subject distance and sharpness in the case where the surface in the optical region D2 is changed from an aspherical shape to a spherical shape in FIG. 36. In this case, too, the color image can be sharpened similarly to FIG. 38.

In the present embodiment, as shown in FIG. 40, different color components have a high sharpness depending on the subject distance. Therefore, respective sharpnesses are detected from the luminance cross sections of G1, G2, R, and B, and the color component with the highest sharpness is selected to sharpen any other color component.

Through the above image processing, the sharpnesses of G1, G2, R, and B which are indicated by solid lines in FIG. 40 can be respectively sharpened as in G1', G2', R', and B' which are indicated by broken lines, thus sharpening the resultant color image.

Figure 41:
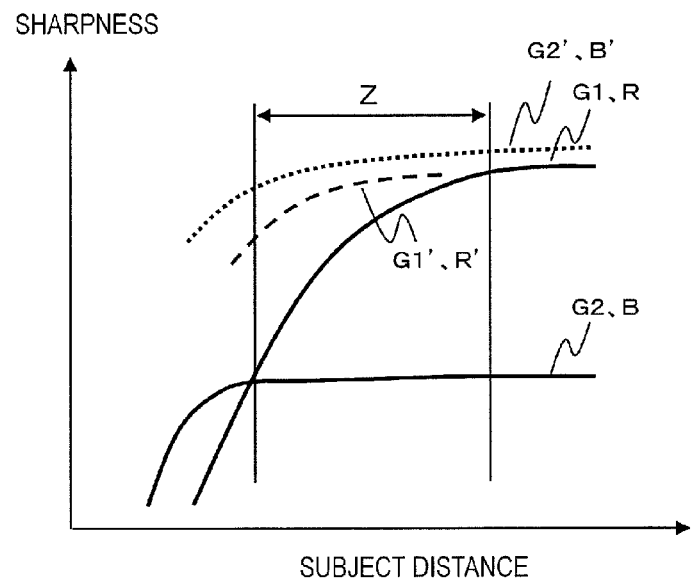
FIG. 41 is a graph showing a relationship between subject distance and sharpness (how sharp an image is) according to Embodiment 6 of the present invention.

Next, another image sharpening technique will be described. FIG. 41 is a diagram describing a method of enhancing the sharpnesses of G1 and R based on G2' and B', which are sharpness-enhanced versions of G2 and B. The construction of the optical regions D1 and D2 is the same as that in FIG. 38, and the point spread distribution created by rays having passed through the optical region D2 is kept substantially constant within a predetermined subject distance range. Therefore, the point spread distribution which is created by extracting the respective pixels P2 (G2 component) and P4 (B component) is substantially constant within a predetermined subject distance range. So long as the point spread distribution is substantially constant in the predetermined subject distance range, an image which is formed by extracting the pixels P2 (G2 component) and P4 (B component) is restorable based on a predetermined point spread distribution, regardless of the subject distance.

Hereinafter, a method of restoring a captured image based on a point spread distribution will be described. Assuming that the original image is f(x,y), and the point spread distribution is h(x,y), the captured image g(x,y) is expressed by (math. 23).

$$g(x,y)=f(x,y) \otimes h(x,y) \text{ (where } \otimes \text{ represents convolution)} \quad \text{[math. 23]}$$

A Fourier transform applied to both sides of (math. 23) gives (math. 24).

$$G(u,v)=F(u,v)H(u,v) \quad \text{[math. 24]}$$

Now, by applying an inverse filter Hinv(u,v) of (math. 25) to the deteriorated image G(u,v), a two-dimensional Fourier transform F(u,v) of the original image is obtained as in (math. 26). By applying an inverse Fourier transform to this, the original image f(x,y) can be obtained as a restored image.

$$Hinv(u, v) = \frac{1}{H(u, v)} \quad \text{[math. 25]}$$

$$F(u, v) = Hinv(u, v)G(u, v) \quad \text{[math. 26]}$$

However, if H(u,v) is 0 or has a very small value, Hinv(u,v) will diverge; therefore, a Wiener filter Hw(u,v) as indicated by (math. 27) is used for restoration from the deteriorated image.

$$Hw(u, v) = \frac{1}{H(u, v)} \frac{|H(u, v)|^2}{|H(u, v)|^2 + |N(u, v)|^2 / |F(u, v)|^2} \quad \text{[math. 27]}$$

In (math. 27), N(u,v) is noise. Since usually the noise and the original image F(u,v) are unknown, a constant k is actually used to restore the deteriorated image with a filter of (math. 28).

$$Hw(u, v) = \frac{1}{H(u, v)} \frac{|H(u, v)|^2}{|H(u, v)|^2 + k} \quad \text{[math. 28]}$$

With such a restoration filter, the sharpnesses of G2 and B which are indicated by a solid line in FIG. 41 can be sharpened as in G2' and B' which is indicated by a dotted line. Furthermore, in a manner similar to the method shown in FIG. 39, respective sharpnesses may be detected from the G2' and B' luminance cross sections; the luminance cross section of a color component with a high sharpness may be subjected to second-order differentiation; and this may be subtracted from G1 and R, whereby the sharpnesses of G1 and R are enhanced to result in the sharpened G1' and R' which are indicated by a broken line in FIG. 41.

Through the above image processing, the sharpnesses of G2 and B and the sharpnesses of G1 and R which are indicated by solid lines in FIG. 41 can be sharpened as in G2' and B' which is indicated by a dotted line and as in G1' and R' which is indicated by a broken line, thus sharpening the resultant color image. Through such a sharpening process, the depth of field can be expanded from the sharpening process described in FIG. 38.

Note that the optical system of the imaging apparatus of the present embodiment may be an image-side telecentric optical system. As a result, even if the angle of view changes, incidence occurs with the principal-ray incident angle of the array optical device K having a value close to 0 degrees, so that the crosstalk between light beams reaching the pixels P1, P2, P3, and P4 can be reduced across the entire imaging region.

Although the present embodiment has illustrated the lens L2 to be an ideal lens for simplicity of description as mentioned above, it is not necessary to employ an ideal lens. For example, a non-ideal lens would have axial chromatic aberration, but it is possible to select a color component with a high sharpness to sharpen other color components as described earlier; thus, a color image with sharpness can be generated even without an ideal lens. Moreover, in the case of determining the subject distance, the distance is to be determined based on a single color component (which in the present embodiment is the green component); thus, there may be some axial chromatic aberration.

Although the optical element L1 and the lens L2 are separate in the present embodiment, another possible construction is where the lens L2 has the optical regions D1 and D2, with the optical element L1 being eliminated. In this case, the stop S may be disposed near the optical regions D1 and D2 of the lens L2.

Thus, according to the present embodiment, through (e.g. a single instance of) imaging using a single imaging system, both a color image and the subject distance can be obtained. Since the subject distance can be calculated for each calculation block, it is possible to obtain the subject distance at any arbitrary image position in the color image. Thus, it is also possible to obtain a subject distance map across the entire image. Moreover, the distance from the subject can be obtained with a single imaging system, which is unlike in an imaging apparatus having a plurality of imaging optical systems, where it would be necessary to ensure matching characteristics and positions between the plurality of imaging optical systems. Moreover, when a motion video is shot by using the imaging apparatus of the present embodiment, an accurate distance from the subject can be measured even if the subject position changes with lapse of time.

Moreover, refocusing can be performed for each of the R, G, and B components, similarly to Embodiment 4. Specifically, at step ST1 shown in FIG. 22, luminance information (e.g. sharpness) is determined for each of RBG, and as necessary, the color having a low sharpness among RBG is sharpened. Next, at step ST2, the distance from the subject is determined. Furthermore, by using the color image generated at the first signal processing section C1, a depth map is generated. Next, at step ST3, a PSF is generated for each subject position, based on the best focus position. Herein, one PSF may be generated for the three colors of RGB. However, in order to take axial chromatic aberration or the like into consideration, a PSF may be generated for each of RGB. Next, at step ST4, a color refocused image at any arbitrary subject position can be generated.

Embodiment 7

This Embodiment 7 differs from Embodiment 6 in that the areas of divided regions of the optical element L1 are different, and that the array optical device is changed from lenticular elements to microlenses. In the present embodiment, any detailed description directed to similar subject matter to Embodiments 4 to 6 will be omitted.

Figure 42:
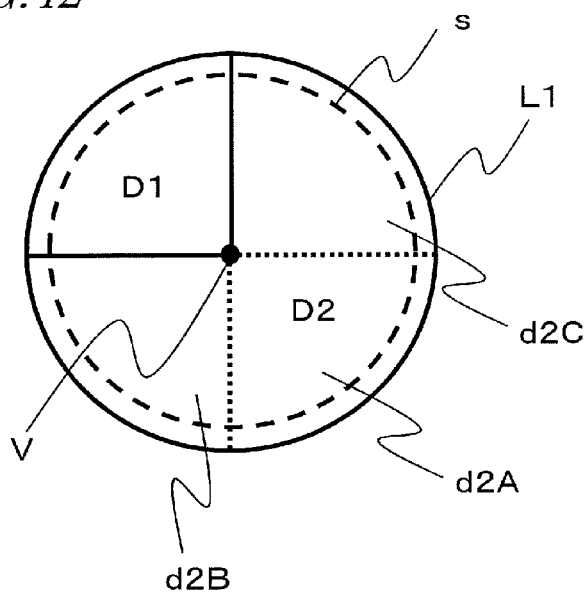
FIG. 42 is a front view showing an optical element L1 according to Embodiment 7 of the present invention as viewed from the subject side.

FIG. 42 is a front view of the optical element L1 as viewed from the subject side, the optical element L1 being divided into optical regions D1 and D2. The optical region D2 is further divided into optical subregions d2A, d2B, and d2C. As shown in FIG. 42, the optical region D1 and the optical subregions d2A, d2B, and d2C are four divided, upper-lower/right-left parts around the optical axis V as a center of boundary, in a plane which is perpendicular to the optical axis V. The optical regions D1 and D2 have optical characteristics which provide mutually different focusing characteristics.

Figure 43:
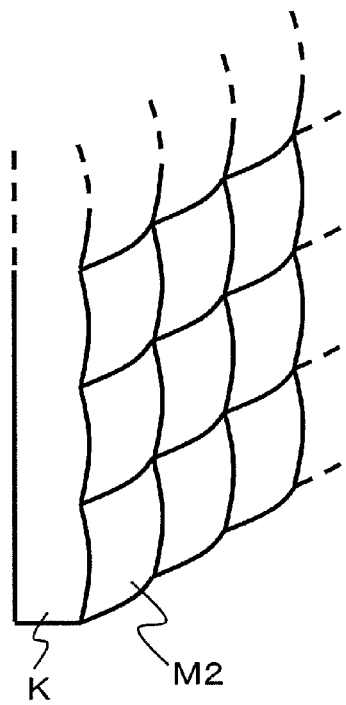
FIG. 43 is a perspective view of an array optical device K according to Embodiment 7 of the present invention.

FIG. 43 is a perspective view of the array optical device K. On the face of the array optical device K closer to the imaging device N, optical elements M2 are provided in a lattice form. Each optical element M2 has cross sections (cross sections along the vertical direction and along the lateral direction) in arc shapes, each optical element M2 protruding toward the imaging device N. Thus, the optical elements M2 are microlenses, and the array optical device K is a microlens array.

Figure 44A:
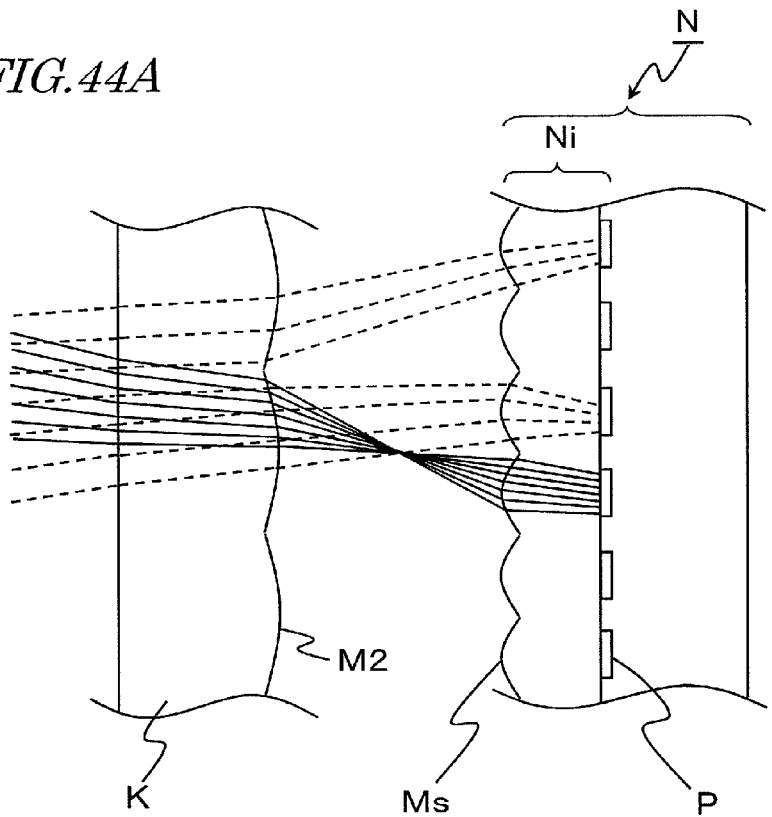
FIG. 44A is an enlarged diagram showing of the array optical device K and imaging device N according to Embodiment 7 of the present invention.
Figure 44B:
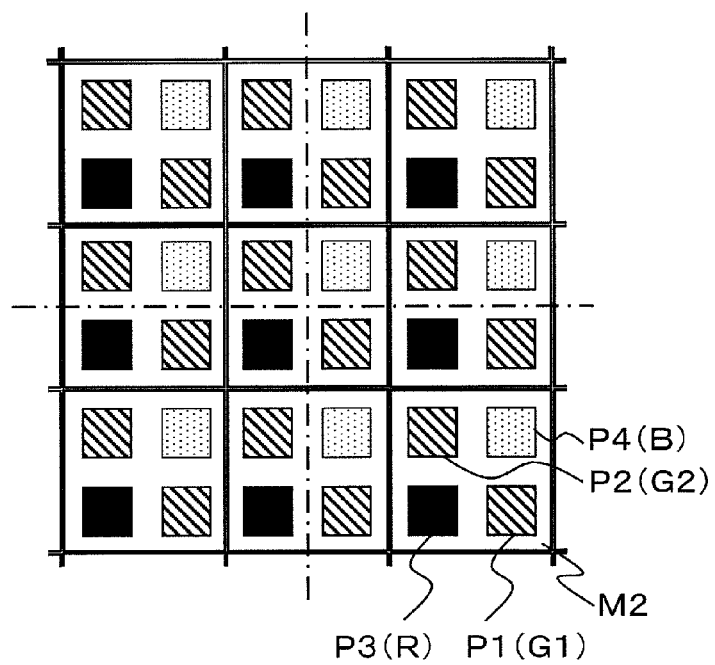
FIG. 44B is a diagram showing relative positioning between the array optical device K and pixels on the imaging device N.

FIG. 44A is an enlarged diagram showing the array optical device K and the imaging device N, and FIG. 44B is a diagram showing relative positioning between the array optical device K and pixels on the imaging device N. Similarly to Embodiment 4, the array optical device K is disposed near the focal point of the lens optical system L, being at a position which is a predetermined distance away from the imaging plane Ni. Microlenses Ms are provided on the imaging plane Ni so as to cover the surface of the pixels P1, P2, P3, and P4.

On the pixels P1, P2, P3, and P4, filters having the same spectral transmittance characteristics as those in Embodiment 6 are respectively provided.

Moreover, the array optical device K is disposed so that the face on which the optical elements M2 are formed is oriented toward the imaging plane Ni. The array optical device K is arranged so that one optical element M2 thereof corresponds to four pixels, i.e., two rows by two columns of pixels P1 to P4, on the imaging plane Ni.

With such a construction, light beams having passed through the optical region D1 and the optical subregions d2A, d2B, and d2C of the optical element L1 shown in FIG. 42 mostly reach the pixel P1, the pixel P2, the pixel P3, and the pixel P4 on the imaging plane Ni, respectively.

Similarly to Embodiment 6, the first signal processing section C1 generates a color image by using luminance information from the plurality of pixels P1, P2, P3, and P4. Hereinafter, the specific method of color image generation will be described.

In FIG. 42, the optical region D1 has a non-spherical surface, whereas the optical subregions d2A, d2B, and d2C all have planar surfaces. For simplicity of description, it is assumed that the lens L2 is an ideal lens free of aberration.

Due to the aspherical shape of the optical region D1, similarly to Embodiment 4, in a predetermined range near the focal point of the lens optical system L, the point spread distribution associated with rays having passed through the optical region D1 can be kept substantially constant. In other words, the point spread distribution can be kept substantially constant within the predetermined subject distance range.

Since the optical region D2 has a planar surface, no spherical aberration occurs, similarly to Embodiment 6. When there is no spherical aberration, the point spread distribution varies with an increase in shift from the focal point. In other words, the point spread distribution varies with changing subject distance.

Figure 45:
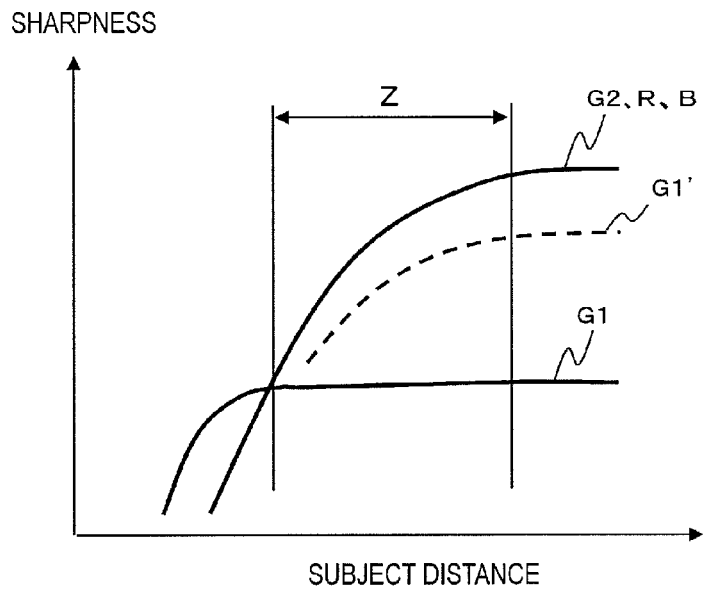
FIG. 45 is a graph showing a relationship between subject distance and sharpness (how sharp an image is) according to Embodiment 7 of the present invention.

Similarly to Embodiment 6, a graph indication of the relationship between subject distance and sharpness will result in a relationship as shown in FIG. 45. In the graph of FIG. 45, G1 represents sharpness of in a predetermined region of an image generated at the pixel P1 (green component), whereas G2, R, and B respectively represent sharpnesses in a predetermined region of images generated at the pixel P2 (green component), the P3 (red component), and the P4 (blue component).

When generating a color image, similarly to Embodiment 6, the color image may be generated by simply interpolating the chromatic information that is lost for each pixel position on the basis of the luminance information of the pixels P1, P2, P3, and P4; however, the sharpness of G1 is smaller than the sharpnesses of G2, R, and B as shown in FIG. 45, and therefore the color image may be generated after enhancing the sharpness of G1, similarly to the method described in FIG. 26.

Through the above image processing, the sharpness of G1 which is indicated by a solid line in FIG. 45 can be enhanced as in G1' which is indicated by a broken line, thus sharpening the resultant color image.

Figure 46:
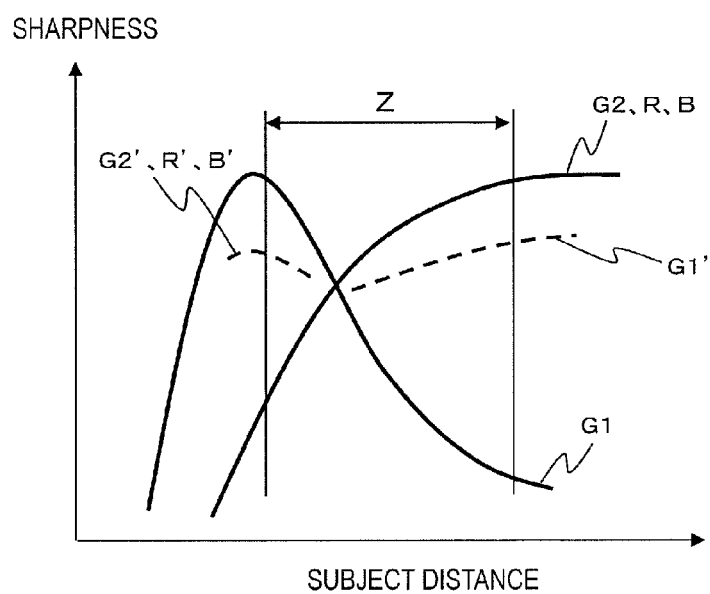
FIG. 46 is a graph showing a relationship between subject distance and sharpness (how sharp an image is) according to Embodiment 7 of the present invention.

FIG. 46 is a graph showing the relationship between subject distance and sharpness in the case where the optical surface in the optical region D1 is changed from an aspherical shape to a spherical shape in FIG. 45. In this case, too, the color image can be sharpened similarly to FIG. 45.

In the present embodiment, as shown in FIG. 46, different color components have a high sharpness depending on the subject distance. Therefore, respective sharpnesses are detected from the luminance cross sections of G1, G2, R, and B, and the color component with the highest sharpness is selected to sharpen any other color component.

Through the above image processing, the sharpnesses of G1, G2, R, and B which are indicated by solid lines in FIG. 46 can be respectively sharpened as in G1', G2', R', and B' which are indicated by broken lines, thus sharpening the resultant color image.

Next, another image sharpening technique will be described. FIG. 46 is a diagram describing a method of enhancing the sharpnesses of G2, R, and B based on G1', which is a sharpness-enhanced version of G1. The construction of the optical region D1 is the same as that in FIG. 45, and the point spread distribution created by rays having passed through the optical region D1 is substantially constant within a predetermined subject distance range. Therefore, the point spread distribution which is created by extracting the pixel P1 (G1 component) is substantially constant within a predetermined subject distance range. So long as the point spread distribution is substantially constant in the predetermined subject distance range, an image which is formed by extracting from the pixel P1 (G1 component) is restorable based on a predetermined point spread distribution, regardless of the subject distance.

Figure 47:
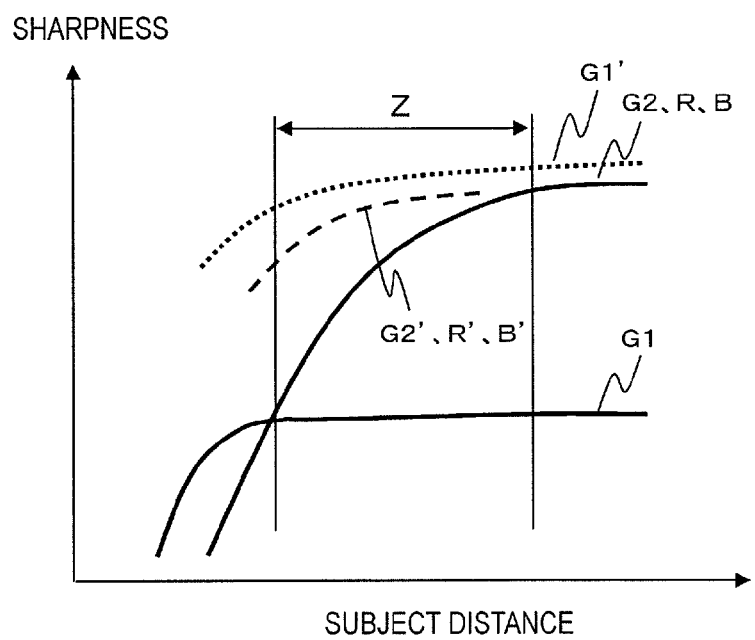
FIG. 47 is a graph showing a relationship between subject distance and sharpness (how sharp an image is) according to Embodiment 7 of the present invention.

With the restoration filter described in Embodiment 6, the sharpness of G1 which is indicated by a solid line in FIG. 47 can be sharpened as in G1' which is indicated by a dotted line. Furthermore, in a manner similar to the method shown in FIG. 26, the G1' luminance cross section may be subjected to second-order differentiation; and this may be subtracted from G2, R, and B, whereby the sharpnesses of G2, R, and B are enhanced to result in the sharpened G2', R', and B' which are indicated by a broken line in FIG. 47.

Although the optical element L1 and the lens L2 are separate in the present embodiment, another possible construction is where the lens L2 has the optical regions D1 and D2, with the optical element L1 being eliminated. In this case, the stop S may be disposed near the optical regions D1 and D2 of the lens L2.

Although the present embodiment has illustrated the lens L2 to be an ideal lens for simplicity of description as mentioned above, it is not necessary to employ an ideal lens. For example, although a non-ideal lens would have axial chromatic aberration, the axial chromatic aberration may be corrected for by the optical element L1. In the present embodiment, FIG. 42 illustrates that the optical regions d2A, d2B, and d2C of the optical element L1 all have planar surfaces; however, they may respectively have different optical surfaces to correct for axial chromatic aberration. As described earlier, rays having passed through the optical subregions d2A, d2B, and d2C reach the pixel P2, the pixel P3, and the pixel P4 respectively. Since the pixel P2, the pixel P3, and the pixel P4 have filters that mainly allow wavelength components of green, red, and blue to pass through, in the case where a lens having axial chromatic aberration is adopted for the lens L2, the optical subregions d2A, d2B, and d2C may be allowed to have different optical powers on the respective region surfaces so that the focusing position in the wavelength band of the filter provided in each pixel is identical. With such a construction, as compared to the case where the optical subregions d2A, d2B, and d2C have an equal optical power, the focusing positions of light transmitted through the optical subregions d2A, d2B, and d2C can be brought close to one another, whereby the axial chromatic aberration occurring in the lens L2 can be corrected for by the optical element L1. By correcting for the axial chromatic aberration with the optical element L1, the number of lenses composing the lens L2 can be reduced, thus downsizing the optical system.

Through the above image processing, the sharpness of G1 the sharpnesses of G2, R, and B which are indicated by solid lines in FIG. 47 can be sharpened as in G1' which is indicated by a dotted line and as in G2', R', and B' which are indicated by a broken line, thus sharpening the resultant color image. Through such a sharpening process, the depth of field can be expanded from the sharpening process described in FIG. 45.

The present embodiment compares to Embodiment 6, with the relationship between sharpness G1 and sharpness G2 being merely reversed, and a method of measuring the distance from a subject can be similarly implemented. Moreover, the method of acquiring a refocused image can also be similarly implemented to Embodiment 6.

Thus, according to the present embodiment, through (e.g. a single instance of) imaging using a single imaging system similar to Embodiment 6, both a color image and the subject distance can be obtained, and a refocused image can be generated.

Embodiment 8

This Embodiment 8 differs from Embodiment 7 in that color filters are provided near the stop and no color filters are provided on the imaging plane. In the present embodiment, any detailed description directed to similar subject matter to Embodiments 4 to 7 will be omitted.

Figure 48:
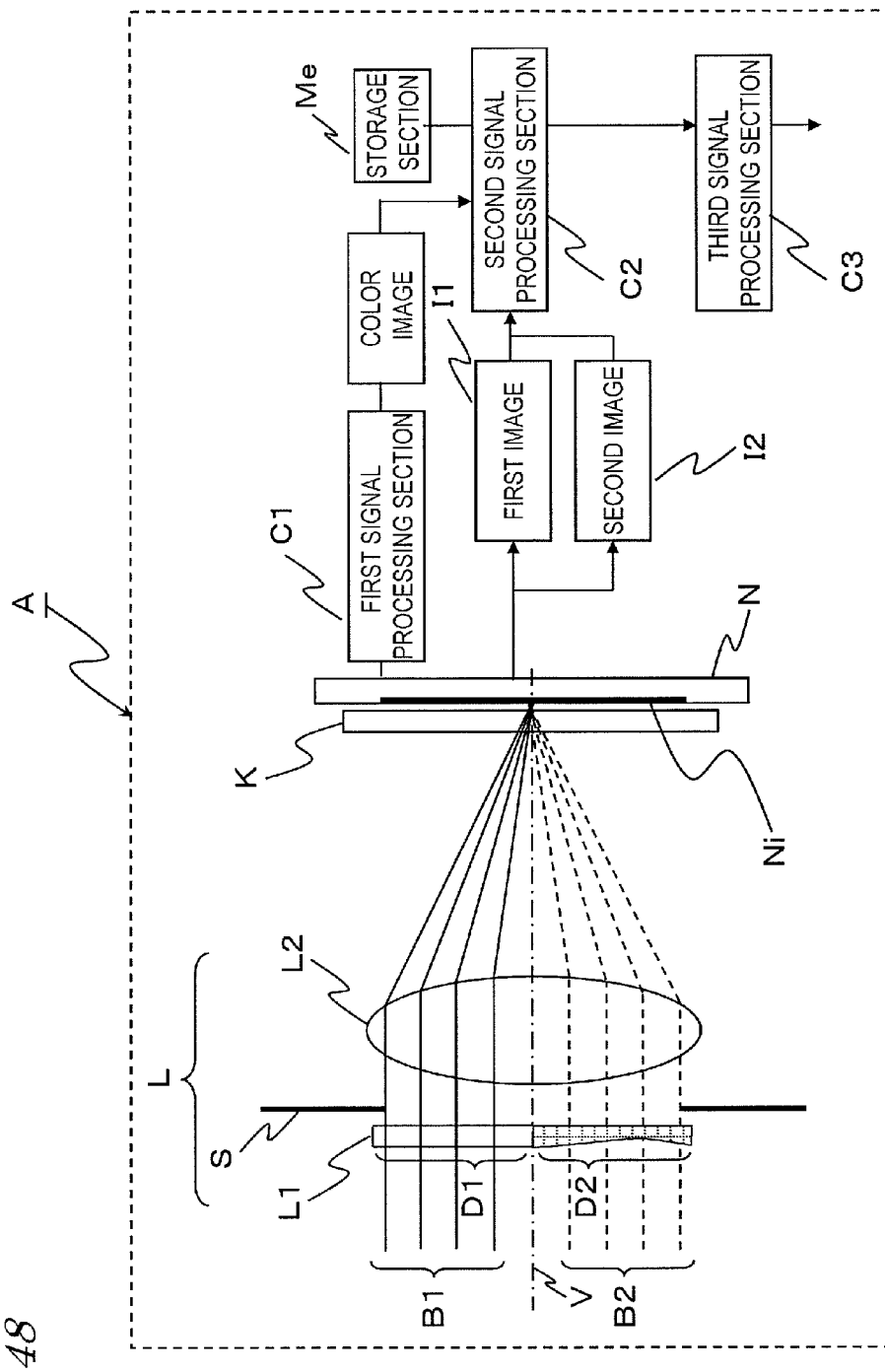
FIG. 48 is a schematic diagram showing Embodiment 8 of an imaging apparatus A according to the present invention.

FIG. 48 is a schematic diagram showing an imaging apparatus A according to Embodiment 8. The imaging apparatus A of the present embodiment includes: a lens optical system L having an optical axis V; an array optical device K disposed near the focal point of the lens optical system L; an imaging device N; a second signal processing section C2; a third signal processing section C3; a first signal processing section C1; and a storage section Me.

In Embodiment 8, similarly to FIG. 42, the optical region D1 of the optical element L1 has a non-spherical surface, whereas the optical subregions d2A, d2B, and d2C all have planar surfaces. Each region of the optical element L1 has its own spectral transmittance characteristics, such that the optical region D1 and the optical subregions d2A, d2B, and d2C have characteristics for transmitting light of G, G, B, and R, respectively, which are converged respectively onto the pixels P1, P2, P4, and P3. In the present embodiment, sharpened images are generated by using images which are obtained from the pixels P1 (green component), P2 (green component), P3 (red component), and P4 (blue component), and subject distance is measured by using images which are obtained from P1 (green component) and P2 (green component) to create a depth map. Generation of PSF data and the refocus method can be implemented similarly to Embodiments 4 to 7.

Moreover, filters which transmit light of mutually different wavelength bands and the optical element L1 for providing different focusing characteristic may be disposed separately. In this case, the filters and the optical element L1 may both be provided near the stop S. The order in which the filters and the optical element L1 are arranged is not limited. In this case, the optical region D1 and the optical subregions d2A, d2B, and d2C are regions including both the optical element L1 and the filters. In this case, each filter may better be set near each optical region, and near the stop. One of the filter and the optical element L1 may be formed on the optical surface of the lens L2, which is disposed near the stop S.

Thus, according to the present embodiment, through (e.g. a single instance of) imaging using a single imaging system similar to Embodiment 7, both a color image and the subject distance can be obtained, and a refocused image can be generated.

Other Embodiments

Although Embodiments 1 to 8 are implementations in which the optical surface of any, optical region is disposed on the subject-side face of the optical element L1, each optical surface may be disposed on the image-side face of the optical element L1.

Although the lens L2 is illustrated as being a single lens, the lens L2 may be composed of a plurality of groups or a plurality of lenses.

Moreover, the plurality of optical regions may be created on the lens L2 being disposed near the stop.

Moreover, filters which transmit light of mutually different wavelength bands and the optical element L1 for providing different focusing characteristic may be disposed separately. In this case, the filters and the optical element L1 may both be provided near the stop S. The order in which the filters and the optical element L1 are arranged is not limited. In this case, the optical region D1 and the optical subregions d2A, d2B, and d2C are regions including both the optical element L1 and the filters. One of the filter and the optical element L1 may be formed on the optical surface of the lens L2, which is disposed near the stop S.

Although the optical element L1 is disposed on the subject side of the stop position, it may be disposed on the image side of the stop position.

Figure 49A:
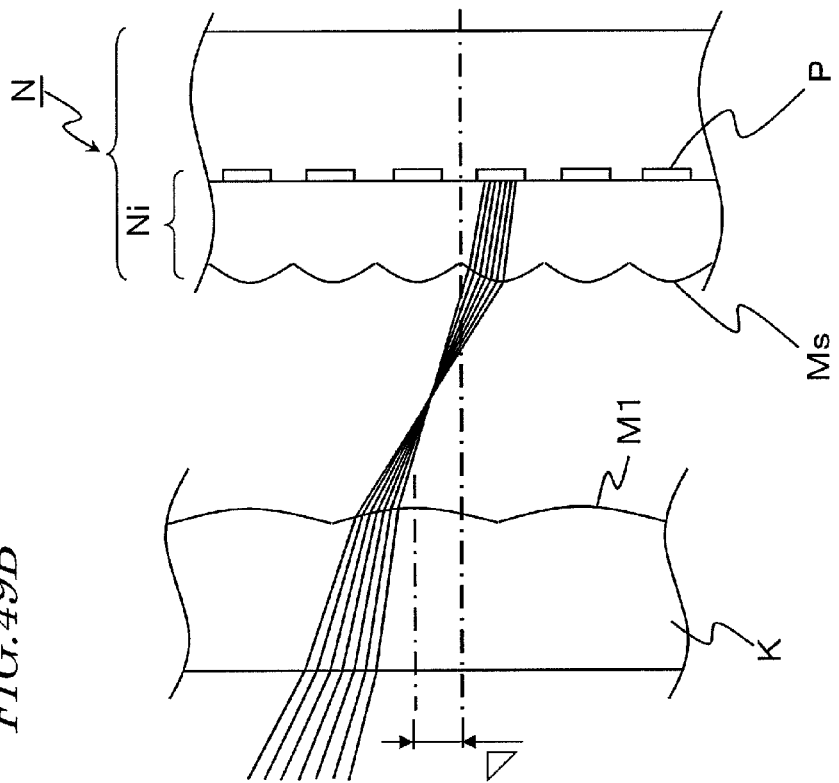
FIG. 49A is an enlarged diagram showing the neighborhood of an imaging plane when crosstalk occurs in an embodiment of the present invention.
Figure 49B:
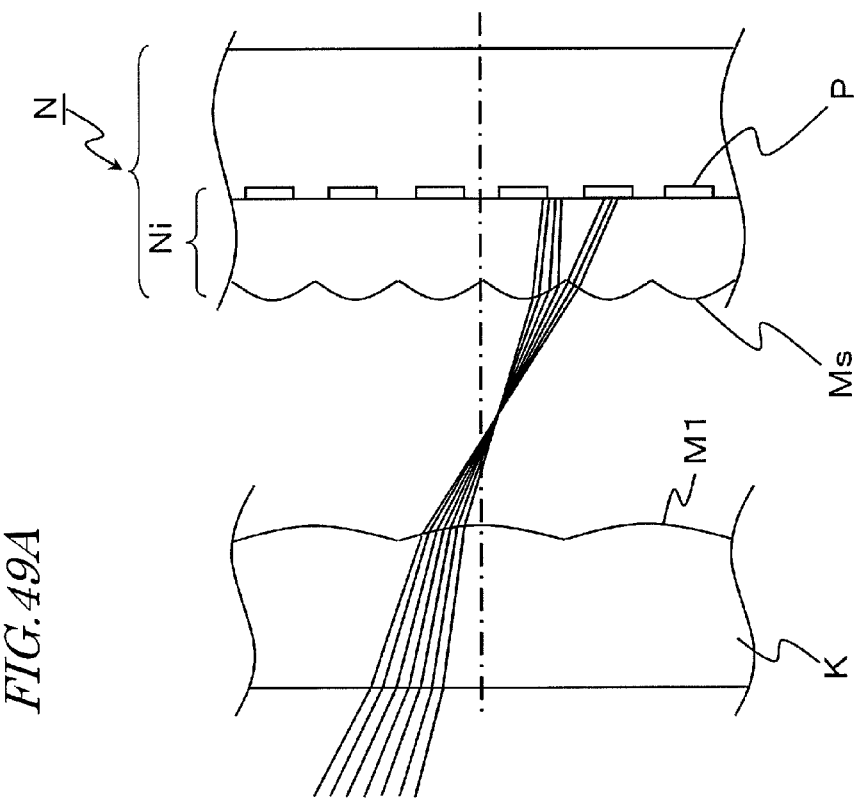
FIG. 49B is an enlarged diagram showing the neighborhood of the imaging plane when crosstalk is reduced.

Although Embodiments 1 to 8 above illustrate the lens optical system L to be an image-side telecentric optical system, it may be an image-side nontelecentric optical system. FIG. 49A is an enlarged diagram showing the neighborhood of an imaging section. FIG. 49A shows, within the light passing through the array optical device K, only a light beam which passes through one optical region. As shown in FIG. 49A, when the lens optical system L is a nontelecentric optical system, light leaking to adjacent pixels is likely to cause crosstalk. However, by allowing the array optical device to be offset by A from the pixel array as shown in FIG. 49B, crosstalk can be reduced. Since the incident angle will vary depending on the image height, the offset amount A may be set in accordance with the incident angle of the light beam onto the imaging plane.

In the case where the lens optical system L is an image-side telecentric optical system, the optical regions D1 and D2 of the optical element L1 have two different radii of curvature, thus resulting in different magnifications of the images (the first image I1 and the second image I2) obtained in the respective regions. When the above-discussed sharpness ratio is calculated for each region of the image, there will be a discrepancy, off the optical axis, in the predetermined regions that are relied on; this makes it impossible to correctly determine a sharpness ratio. In this case, a correction may be made so that the first image I1 and the second image I2 are substantially equal in magnification, and then a sharpness ratio between predetermined regions may be determined. This makes it possible to correctly determine a sharpness ratio between predetermined regions.

Embodiments 1 to 8 are directed to imaging apparatuses having the first signal processing section C1, the second signal processing section C2, the third signal processing section C3, and the storage section Me (shown in FIG. 18 and so on). However, the imaging apparatus may lack these signal processing sections and storage section. In that case, a PC or the like which is external to the imaging apparatus may be used to perform the processes that are performed by the first signal processing section C1, the second signal processing section C2, and the third signal processing section C3. In other words, a system that includes an imaging apparatus having the lens optical system L, the array optical device K, and the imaging device N and includes an external signal processing apparatus may also be possible. With the imaging apparatus under this implementation, luminance information for a color image output and subject distance measurement can be obtained through a single instance of imaging using a single imaging optical system. Moreover, through processes performed by the external signal processing section by using that luminance information, both the multicolor image and the subject distance can be obtained.

According to the distance measurement method of the present invention, it is not always necessary to utilize a correlation between sharpness and subject distance. For example, a subject distance may be obtained by substituting an ascertained sharpness, contrast, or point image diameter into an equation expressing the relationship between sharpness, contrast, or point image diameter and subject distance.

Moreover, each optical element (microlens) in the microlens array of this Embodiment 3 may have a rotation symmetric shape with respect to the optical axis of each optical element (microlens). This will be discussed below in comparison with microlenses of a shape which is rotation-asymmetric with respect to the optical axis.

FIG. 50($a1$) is a perspective view showing a microlens array having a shape which is rotation-asymmetric with respect to the optical axis. Such a microlens array is formed by forming quadrangular prisms of resist on the array and rounding the corner portions of the resist through a heat treatment, and performing patterning by using this resist. The contours of a microlens shown in FIG. 50($a1$) are shown in FIG. 50($a2$). In a microlens having a rotation-asymmetric shape, there is a difference in radius of curvature between the vertical and lateral directions (directions parallel to the four sides of the bottom face of each microlens) and oblique directions (diagonal direction of the bottom face of the microlens).

FIG. 50($a3$) is a diagram showing ray tracing simulation results in the case where the microlenses shown in FIGS. 50($a1$) and ($a2$) are applied to the array optical device according to the present invention. Although FIG. 50($a3$) only shows a light beam which passes through only one optical region within the light passing through the array optical device K, a microlens of a rotation-asymmetric shape will allow light to leak to adjacent pixels, thus causing crosstalk.

FIG. 50($b1$) is a perspective view showing a microlens array having a shape which is rotation symmetric with respect to the optical axis. Microlenses of such a rotation symmetric shape can be formed on a glass plate or the like by a thermal imprinting or UV imprinting manufacturing method.

FIG. 50(b2) shows contours of a microlens having a rotation symmetric shape. In a microlens having a rotation symmetric shape, the radius of curvature is identical between the vertical and lateral directions and oblique directions.

FIG. 50(b3) is a diagram showing ray tracing simulation results in the case where the microlenses shown in FIGS. 50(b1) and (b2) are applied to the array optical device according to the present invention. Although FIG. 50(b3) only shows a light beam which passes through only one optical region within the light passing through the array optical device K, it can be seen that no crosstalk such as that in FIG. 50(a3) is occurring. Thus, crosstalk can be reduced by adopting a rotation symmetric shape for the microlenses, whereby deterioration in the precision of distance measurement calculation can be suppressed.

Figure 51:
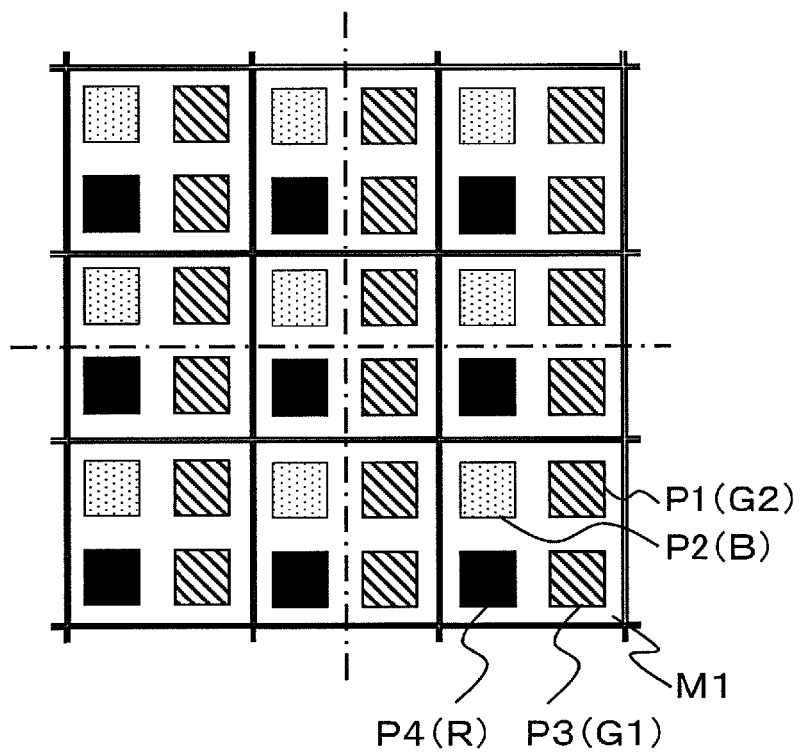
FIG. 51 is a diagram showing another embodiment of a filter array on the imaging device according to an embodiment of the present invention.

In Embodiments 1 to 8, the pixel P1 and the pixel P3 are adjacent to each other along an oblique direction; however, as in FIG. 51, the pixel P1 and the pixel P3 may be adjacent along the up-down direction.

Regardless of which of the arrangements of FIGS. 4, 21, and so on the pixels P may have, and regardless of which of the constructions of FIG. 2, FIG. 14, FIG. 15, and so on the optical element L1 may have, it is always the same that light having passed through either one of the optical regions D1 and D2 is incident on the pixel P2 and that light having passed through the remaining one of the optical regions D1 and D2 is incident on the pixel P4.

More preferably, only the light having passed through either one of the optical regions D1 and D2 is incident on the pixel P2 and only the light having passed through the remaining one of the optical regions D1 and D2 is incident on the pixel P4. However, it may be possible for a portion of a light beam having passed through the optical region D1 and the optical subregions d2A, d2B, and d2C to be incident on regions of the imaging plane Ni other than the pixels, an adjacent pixel, or the like. Therefore, in the present specification and the claims, for example, "allowing only the light having passed through the optical region D1 to be incident on the pixel P2" means that a large part of the light entering the pixel P2 (e.g., 80% or more) is light from the optical region D1, rather than that no light from the optical region D2 is incident on the pixel P2.

The imaging apparatus disclosed herein is useful for imaging apparatuses such as digital still cameras or digital camcorders. It is also applicable to distance measuring apparatuses for monitoring the surroundings or monitoring people riding in an automobile, and distance measuring apparatuses for inputting three-dimensional information in games, PCs, mobile terminals, endoscopes, and so on.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An imaging apparatus comprising:
   a lens optical system having a first region, a second region, and a third region, the first region transmitting light of a first wavelength band, the second region transmitting light of the first wavelength band and having optical characteristics for providing a different focusing characteristic from a focusing characteristic associated with rays transmitted through the first region, and the third region transmitting light of a second wavelength band different from the first wavelength band;
   an imaging device on which light having passed through the lens optical system is incident, the imaging device having a plurality of first, second, and third pixels; and
   a microlens array disposed between the lens optical system and the imaging device, the microlens array causing light having passed through the first region to enter the plurality of first pixels, light having passed through the second region to enter the plurality of second pixels, and light having passed through the third region to enter the plurality of third pixels.

2. The imaging apparatus of claim 1, wherein,
   the lens optical system further has a fourth region transmitting light of a third wavelength band different from the first and second wavelength bands;
   the imaging device further includes a plurality of fourth pixels; and
   the microlens array causes light having passed through the fourth region to enter the plurality of fourth pixels.

3. The imaging apparatus of claim 1, wherein the first, second, and third regions are regions divided around an optical axis of the lens optical system.

4. The imaging apparatus of claim 2, wherein, in the lens optical system, a focusing characteristic associated with rays transmitted through the third region and the fourth region is identical to either a focusing characteristic associated with rays transmitted through the first region or a focusing characteristic associated with rays transmitted through a second region.

5. The imaging apparatus of claim 1, wherein rays are incident on the first, second, and third regions through a single instance of imaging.

6. The imaging apparatus of claim 2, wherein the first and second regions allow rays of the green band to pass through, the third region allows rays of the blue band to pass through, and the fourth region allows rays of the red band to pass through.

7. The imaging apparatus of claim 1, wherein, when a subject distance is within a predetermined range, a point spread distribution created by light entering the first region is substantially constant, and a point spread distribution created by light entering the second region varies in accordance with distance from a subject.

8. The imaging apparatus of claim 1, wherein a surface of the first region and a surface of the second region have mutually different radii of curvature.

9. The imaging apparatus of claim 1, wherein,
   the plurality of first and second pixels respectively generate first and second luminance information through a single instance of imaging; and
   the imaging apparatus further comprises a first signal processing section for generating a first image and a second image by using the first and second luminance information.

10. The imaging apparatus of claim 2, further comprising a first signal processing section including a sharpness detection section for detecting a sharpness of at least one pixel component, within luminance information of the plurality of first to fourth pixels, for each predetermined region in an image;
    wherein based on a component of a highest sharpness among the respective sharpnesses, a luminance information component of another pixel is sharpened.

11. The imaging apparatus of claim 10, wherein, by using a previously stored point spread function, the first signal processing section performs a restoration process for an image which is formed based on luminance information of a pixel reached by light entering the first region, and generates a restored sharpened image.

12. The imaging apparatus of claim 11, wherein, the first signal processing section uses a single said point spread function to perform a restoration process for all regions of an image which is formed based on luminance information of a pixel reached by light entering the first region, and generate a restored sharpened image.

13. The imaging apparatus of claim 12, wherein,
the first signal processing section includes a sharpness detection section for detecting a sharpness for each predetermined region in the restored sharpened image, and, based on a sharpness of each predetermined region in the restored sharpened image, sharpens a luminance information component of another pixel.

14. The imaging apparatus of claim 9,
further comprising a second signal processing section for calculating a distance from a subject,
wherein the second signal processing section calculates a distance from the subject by using the first image and the second image.

15. The imaging apparatus of claim 14, wherein,
when the subject distance is within a certain range, a value of a ratio between a sharpness of the first image and a sharpness of the second image has a correlation with the distance from the subject; and
the second signal processing section calculates the distance from the subject based on the correlation and the ratio between the sharpness of the first image and the sharpness of the second image.

16. The imaging apparatus of claim 14, wherein,
the first signal processing section includes a contrast detection section for detecting a contrast of the first image obtained from the plurality of first pixels and a contrast of the second image obtained from the plurality of second pixels and;
when the subject distance is within a certain range, a ratio between the contrast of the first image and the contrast of the second image has a correlation with the subject distance; and
the second signal processing section calculates the distance from the subject based on the correlation, the contrast of the first image and the contrast of the second image.

17. The imaging apparatus of claim 14, wherein the second signal processing section calculates the distance from the subject by using luminance information of an image obtained through addition of the first image and the second image and luminance information of the first image or the second image.

18. The imaging apparatus of claim 13, wherein,
when the subject distance is within a certain range, a point spread function derived from an image which is formed from the restored sharpened image and light entering the second region has a correlation with the subject distance; and
the imaging apparatus further comprising a second signal processing section for calculating the distance from the subject based on the correlation and the point spread function.

19. The imaging apparatus of claim 2, wherein,
the second region, the third region, and the fourth region have mutually different optical powers; and
focusing positions of light transmitted through the second region, the third region, and the fourth region are closer to one another than when the second region, the third region, and the fourth region have an equal optical power to one another.

20. The imaging apparatus of claim 1, further comprising a light-shielding member provided at a boundary between the first region and the second region.

21. The imaging apparatus of claim 1, wherein,
the lens optical system further includes a stop; and
the first region and the second region are disposed near the stop.

22. The imaging apparatus of claim 14, wherein,
the second signal processing section calculates a subject distance for each predetermined region in an image; and
the imaging apparatus further comprises a third signal processing section for generating a refocused image by using the subject distance for each predetermined region calculated by the second signal processing section.

23. The imaging apparatus of claim 22, wherein the second signal processing section generates a point spread function for each subject distance by using a subject distance for each predetermined region.

24. The imaging apparatus of claim 23, wherein, along the subject distance direction, an intensity change in the point spread function decreases away from at least one best focus position, the at least one best focus position defining a subject distance at which an intensity change in the point spread function takes a local maximum.

25. The imaging apparatus of claim 24, wherein the at least one best focus position is an externally input position or a position determined by the second signal processing section.

26. The imaging apparatus of claim 23, wherein the third signal processing section generates the refocused image by using the subject distance for each predetermined region and the point spread function.

27. The imaging apparatus of claim 23, wherein the point spread function is a Gaussian function.

28. The imaging apparatus of claim 26, wherein the third signal processing section generates the refocused image by performing a convolution calculation for the point spread function using a Fourier transform for each predetermined region.

29. The imaging apparatus of claim 22, wherein the third signal processing section generates the refocused image by performing a spatial filter process based on the subject distance for each predetermined region.

30. The imaging apparatus of claim 24, wherein the at least one best focus position exists in plurality and discretely.

31. The imaging apparatus of claim 2, further comprising first to fourth filters near the lens optical system, the first to fourth filters being provided respectively in the first region, the second region, the third region, and the fourth region, wherein,
the first filter transmits light of the first wavelength band;
the second filter transmits light of the first wavelength band;
the third filter transmits light of the second wavelength band; and
the fourth filter transmits light of the third wavelength band.

32. The imaging apparatus of claim 31, wherein,
the lens optical system further comprises a stop; and
the first to fourth filters are disposed near the stop.

33. An imaging system comprising:
the imaging apparatus of claim 2; and
a first signal processing apparatus for generating a color image, wherein
the first signal processing apparatus generates the color image by using luminance information of the plurality of first pixels, the plurality of second pixels, the plurality of third pixels, and the plurality of fourth pixels obtained through a single instance of imaging.

34. The imaging system of claim 33, further comprising a second signal processing apparatus for calculating a distance from a subject, wherein
the second signal processing apparatus calculates a distance from the subject by using the luminance information of the plurality of first pixels and the plurality of second pixels obtained through the single instance of imaging.

35. An imaging system comprising an imaging apparatus and a signal processing apparatus, wherein
the imaging apparatus includes:
a lens optical system having a first region and a second region, the second region having optical characteristics for providing a different focusing characteristic from a focusing characteristic associated with rays having passed through the first region;
an imaging device on which light having passed through the lens optical system is incident, the imaging device at least having a plurality of first pixels and a plurality of second pixels; and
an array optical device disposed between the lens optical system and the imaging device, the array optical device causing light having passed through the first region to enter the plurality of first pixels and light having passed through the second region to enter the plurality of second pixels, and
the signal processing apparatus includes:
a first signal processing section for calculating a subject distance for each predetermined region in a captured image, by using luminance information of a first image obtained from the plurality of first pixels and a second image obtained from the plurality of second pixels; and
a second signal processing section for generating a refocused image by using the subject distance for each predetermined region calculated by the first signal processing section.

* * * * *